(12) United States Patent
Luo et al.

(10) Patent No.: US 10,825,516 B2
(45) Date of Patent: Nov. 3, 2020

(54) RESISTIVE CHANGE ELEMENT CELLS SHARING SELECTION DEVICES

(71) Applicant: Nantero, Inc., Woburn, MA (US)

(72) Inventors: Jia Luo, Fremont, CA (US); Sheyang Ning, Milpitas, CA (US); Shiang-Meei Heh

(73) Assignee: Nantero, Inc., Woburn, MA (US)

( * ) Notice: Subject to any disclaimer, the term of this patent is extended or adjusted under 35 U.S.C. 154(b) by 0 days.

(21) Appl. No.: 15/906,661

(22) Filed: Feb. 27, 2018

(65) Prior Publication Data

US 2019/0267081 A1    Aug. 29, 2019

(51) Int. Cl.
| | | |
|---|---|---|
| *G11C 11/00* | (2006.01) | |
| *G11C 13/00* | (2006.01) | |
| *H01L 27/24* | (2006.01) | |
| *G11C 13/02* | (2006.01) | |
| *H01L 45/00* | (2006.01) | |

(52) U.S. Cl.
CPC ........ *G11C 13/0007* (2013.01); *G11C 13/004* (2013.01); *G11C 13/025* (2013.01); *H01L 27/2436* (2013.01); *H01L 45/1683* (2013.01)

(58) Field of Classification Search
CPC . G11C 13/004; G11C 13/025; H01L 27/2436; H01L 45/1683
See application file for complete search history.

(56) References Cited

U.S. PATENT DOCUMENTS

| | | |
|---|---|---|
| 6,473,336 B1 | 10/2002 | Nakajima et al. |
| 6,724,653 B1 | 4/2004 | Iwata et al. |
| 6,879,505 B2 | 4/2005 | Scheuerlein |
| 6,888,773 B2 | 5/2005 | Morimoto |
| 6,937,505 B2 | 8/2005 | Morikawa |
| 7,001,846 B2 | 2/2006 | Hsu |
| 7,733,685 B2 | 6/2010 | Scheuerlein et al. |
| 7,910,407 B2 | 3/2011 | Scheuerlein |
| 7,923,812 B2 | 4/2011 | Scheuerlein |
| 8,649,206 B2 | 2/2014 | Scheuerlein |
| 8,817,514 B2 | 8/2014 | Samachisa et al. |
| 8,854,873 B1 | 10/2014 | Hollmer et al. |

(Continued)

FOREIGN PATENT DOCUMENTS

| | | |
|---|---|---|
| JP | 2008065953 A | 3/2008 |
| WO | 03/085675 A2 | 10/2003 |
| WO | WO 2009/085078 A1 | 7/2009 |

OTHER PUBLICATIONS

International Search Report for PCT/US2019/019548, dated Jun. 10, 2019, 2 pages.

(Continued)

*Primary Examiner* — Toan K Le
(74) *Attorney, Agent, or Firm* — Nantero, Inc.

(57) ABSTRACT

Resistive change element cells sharing a selection device and resistive change element arrays including a plurality of resistive change element cells and a plurality of selection devices arranged in a group of at least two resistive change element cells sharing one selection device configuration are disclosed. According to some aspects of the present disclosure a group of resistive change element cells can be arranged on one level above a selection device. According to some aspects of the present disclosure a group of resistive change element cells can be arranged on multiple levels above a selection device.

28 Claims, 26 Drawing Sheets

(56) References Cited

U.S. PATENT DOCUMENTS

| | | | |
|---|---|---|---|
| 8,885,387 B2 | 11/2014 | Azuma et al. | |
| 8,982,647 B2 | 3/2015 | Nazarian et al. | |
| 9,000,409 B2 | 4/2015 | Huo et al. | |
| 9,576,616 B2 | 2/2017 | Nazarian et al. | |
| 9,620,206 B2 | 4/2017 | Nazarian et al. | |
| 2008/0002455 A1 | 1/2008 | Toda et al. | |
| 2008/0002457 A1 | 1/2008 | Toda et al. | |
| 2010/0046273 A1 | 2/2010 | Azuma et al. | |
| 2013/0043455 A1* | 2/2013 | Bateman | H01L 27/2454 257/5 |
| 2013/0051114 A1 | 2/2013 | Kim et al. | |
| 2013/0170283 A1 | 7/2013 | Lan et al. | |
| 2013/0210211 A1* | 8/2013 | Vereen | H01L 45/08 438/382 |
| 2014/0254242 A1 | 9/2014 | Siau | |
| 2016/0065218 A1 | 3/2016 | Oda | |
| 2016/0233270 A1 | 8/2016 | Takaki et al. | |
| 2017/0352415 A1* | 12/2017 | Harvard | G11C 13/0023 |
| 2018/0004599 A1 | 1/2018 | Ning | |
| 2018/0033483 A1* | 2/2018 | Bertin | B82Y 10/00 |
| 2019/0051651 A1 | 2/2019 | Bertin et al. | |

OTHER PUBLICATIONS

Written Opinion for PCT/US2019/019548, dated Jun. 10, 2019, 6 pages.

\* cited by examiner

RESISTIVE CHANGE ELEMENT CELLS SHARING SELECTION DEVICES

CROSS-REFERENCE OF RELATED CASES

This application is related to the following U.S. Patents, which are assigned to the assignee of the present application, and are hereby incorporated by reference in their entirety:

U.S. Pat. No. 7,781,862, filed on Nov. 15, 2005, entitled Two-Terminal Nanotube Devices and Systems and Methods of Making Same;

U.S. Pat. No. 7,835,170, filed on Aug. 8, 2007, entitled Memory Elements and Cross Point Switches and Arrays of Same Using Nonvolatile Nanotube Blocks;

U.S. Pat. No. 9,666,272, filed on Jan. 12, 2016, entitled Resistive Change Element Arrays Using Resistive Reference Elements; and U.S. Pat. No. 9,715,927, filed on Mar. 24, 2016, entitled 1-R Resistive Change Element Arrays Using Resistive Reference Elements.

This application is related to the following U.S. Patent Applications, which are assigned to the assignee of the present application, and are hereby incorporated by reference in their entirety:

U.S. patent application Ser. No. 15/136,414, filed on Apr. 22, 2016, entitled Methods for Enhanced State Retention Within a Resistive Change Cell;

U.S. patent application Ser. No. 15/486,032, filed on Apr. 12, 2017, entitled Sealed Resistive Change Elements; and U.S. patent application Ser. No. 15/853,772, filed on Dec. 23, 2017, entitled Devices and Methods for Programming Resistive Change Elements.

BACKGROUND

Technical Field

The present disclosure generally relates to resistive change element cells sharing selection devices and generally relates to resistive change element arrays including a plurality of resistive change element cells and a plurality of selection devices arranged in a group of at least two resistive change element cells sharing one selection device configuration.

Discussion of Related Art

Any discussion of the related art throughout this specification should in no way be considered as an admission that such art is widely known or forms part of the common general knowledge in the field.

Resistive change devices and arrays, often referred to as resistance RAMS by those skilled in the art, are well known in the semiconductor industry. Such devices and arrays, for example, include, but are not limited to, phase change memory, solid electrolyte memory, metal oxide resistance memory, and carbon nanotube memory such as NRAM®.

Resistive change devices and arrays store information by adjusting a resistive change element, typically comprising some material that can be adjusted between a number of non-volatile resistive states in response to some applied stimuli, within each individual array cell between two or more resistive states. For example, each resistive state within a resistive change element cell can correspond to a data value which can be programmed and read back by supporting circuitry within the device or array.

For example, a resistive change element might be arranged to switch between two resistive states: a low resistive state (which might correspond to a logic 1) and a high resistive state (which might correspond to a logic 0). In this way, a resistive change element can be used to store one binary digit (bit) of data.

Or, as another example, a resistive change element might be arranged to switch between four resistive states, so as to store two bits of data. Or a resistive change element might be arranged to switch between eight resistive states, so as to store three bits of data. Or a resistive change element might be arranged to switch between $2^n$ resistive states, so as to store n bits of data.

Within the current state of the art, there is an increasing need to scale resistive change element cells and to increase resistive change element cell density of resistive change element arrays. However, as technology is developed within the state of the art to provide increasingly smaller resistive change elements, the physical dimensions of individual resistive change element cells within a resistive change element array becomes, in certain applications, limited by the physical dimensions of in situ selection devices used within resistive change element cells.

SUMMARY

The present disclosure provides a resistive change element array comprising a plurality of groups of at least two resistive change element cells, where each group of at least two resistive change element cells is electrically connected to a selection device for that group of at least two resistive change element cells.

According to another aspect of the present disclosure, each group of at least two resistive change element cells is arranged in a one level layout.

According to another aspect of the present disclosure, each group of at least two resistive change element cells is arranged in a multiple level layout.

According to another aspect of the present disclosure, each group of at least two resistive change element cells has at least four resistive change element cells, the at least four resistive change element cells are arranged such that three neighboring resistive change element cells form a substantially equilateral triangle, and the plurality of groups of at least two resistive change element cells are arranged such that three neighboring resistive change element cells from at least two groups form a substantially equilateral triangle.

According to another aspect of the present disclosure, the plurality of groups of at least two resistive change element cells comprises a plurality of groups of eight resistive change element cells and a plurality of groups of sixteen resistive change element cells.

According to another aspect of the present disclosure, each group of at least two resistive change element cells is positioned above a selection device for that group of at least two resistive change element cells such that an area covered by a shape required for a group of at least two resistive change element cells to be adjacently located to other groups of at least two resistive change element cells encompasses a shape required for a selection device to be adjacently located to other selection devices.

According to another aspect of the present disclosure, each group of at least two resistive change element cells is positioned above a selection device for that group of at least two resistive change element cells such that an area covered by a shape required for a group of at least two resistive change element cells to be adjacently located to other groups of at least two resistive change element cells is encompassed by a shape required for a selection device to be adjacently located to other selection devices.

According to another aspect of the present disclosure, each group of at least two resistive change element cells is positioned above a selection device for that group of at least two resistive change element cells such that an area covered by a shape required for a group of at least two resistive change element cells to be adjacently located to other groups of at least two resistive change element cells covers at least part of a shape required for a selection device to be adjacently located to other selection devices.

The present disclosure provides a resistive change element array comprising a plurality of groups of at least two resistive change element cells, where every two groups of at least two resistive change element cells are electrically connected to two selection devices for those two groups of at least two resistive change element cells, and where the two selection devices have two drain terminals, a common source terminal, and two gate terminals.

According to another aspect of the present disclosure, each group of at least two resistive change element cells is arranged in a one level layout.

According to another aspect of the present disclosure, each group of at least two resistive change element cells is arranged in a multiple level layout.

According to another aspect of the present disclosure, each group of at least two resistive change element cells has at least four resistive change element cells, the at least four resistive change element cells are arranged such that three neighboring resistive change element cells form a substantially equilateral triangle, and the plurality of groups of at least two resistive change element cells are arranged such that three neighboring resistive change element cells from at least two groups form a substantially equilateral triangle.

According to another aspect of the present disclosure, every two groups of at least two resistive change element cells has a group of eight resistive change element cells and a group of sixteen resistive change element cells.

According to another aspect of the present disclosure, every two groups of at least two resistive change element cells are positioned above two selection devices for those two groups of at least two resistive change element cells such that an area covered by a shape required for two groups of at least two resistive change element cells to be adjacently located to other two groups of at least two resistive change element cells encompasses a shape required for two selection devices to be adjacently located to other two selection devices.

According to another aspect of the present disclosure, every two groups of at least two resistive change element cells are positioned above two selection devices for those two groups of at least two resistive change element cells such that an area covered by a shape required for two groups of at least two resistive change element cells to be adjacently located to other two groups of at least two resistive change element cells is encompassed by a shape required for two selection devices to be adjacently located to other two selection devices.

According to another aspect of the present disclosure, every two groups of at least two resistive change element cells are positioned above two selection devices for those two groups of at least two resistive change element cells such that an area covered by a shape required for two groups of at least two resistive change element cells to be adjacently located to other two groups of at least two resistive change element cells covers at least part of a shape required for two selection devices to be adjacently located to other two selection devices.

The present disclosure provides a resistive change element array comprising a plurality of bit lines, a plurality of source lines, a plurality of word lines, a plurality of resistive change element cells, where each resistive change element cell has a first electrode and a second electrode, and where the first electrode of each resistive change element cell is electrically connected to a source line of the plurality of source lines, a plurality of selection devices, where each selection device has a drain terminal, a gate terminal, and a source terminal, where the source terminal of each selection device is electrically connected to a bit line of the plurality of bit lines, and where the gate terminal of each selection device is electrically connected to a word line of the plurality of word lines, and where the plurality of resistive change element cells and the plurality of selection devices are arranged in a 1TNR configuration with N being a number greater than one.

The present disclosure provides a resistive change element array comprising a plurality of bit lines, a plurality of source lines, a plurality of word lines, a plurality of resistive change element cells, where each resistive change element cell has a first electrode and a second electrode, and where the first electrode of each resistive change element cell is electrically connected to a source line of the plurality of source lines, a plurality of selection devices, where every two selection devices have two drain terminals, two gate terminals, and a common source terminal, where the common source terminal of every two selection devices is electrically connected to a bit line of the plurality of bit lines, and where the two gate terminals of every two selection devices are electrically connected to word lines of the plurality of word lines, and where the plurality of resistive change element cells and the plurality of selection devices are arranged in a 1TNR configuration with N being a number greater than one.

Other features and advantages of the present disclosure will become apparent from the following description, which is provided below in relation to the accompanying drawings.

DETAILED DESCRIPTION

Figure 1A:
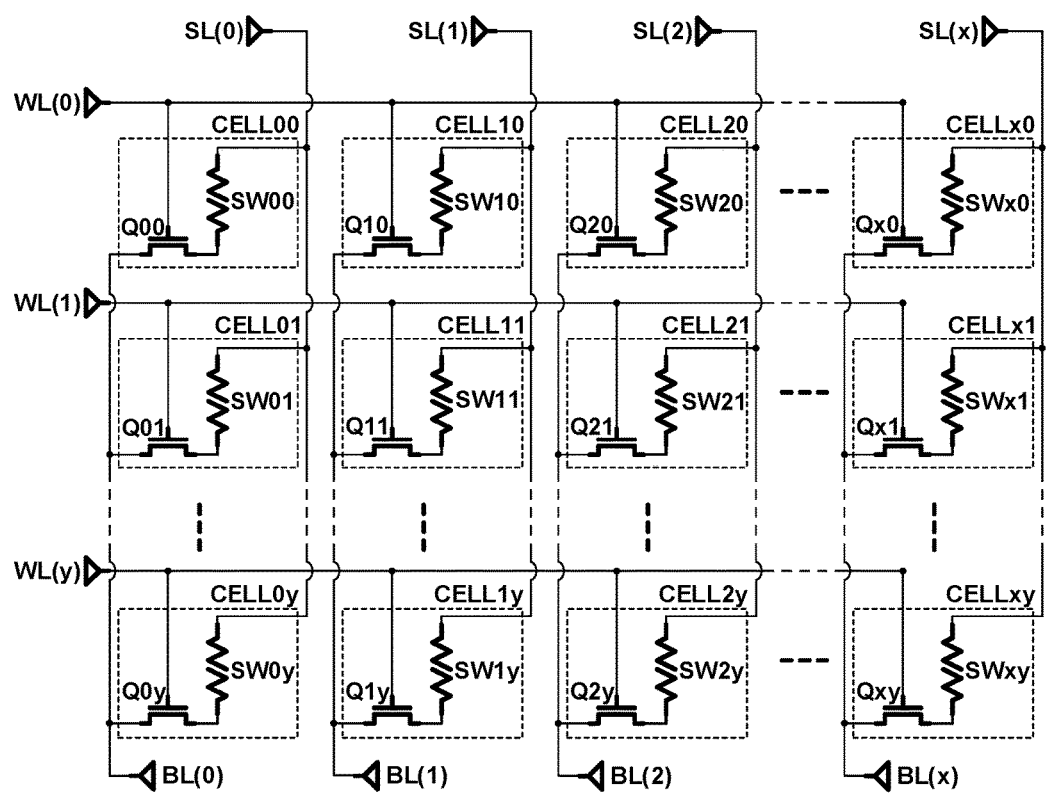
FIG. 1A illustrates a simplified schematic diagram of an exemplary architecture for a resistive change element array of resistive change element cells, where each resistive change element cell includes a resistive change element and an in situ selection device.

The present disclosure relates to resistive change element cells sharing selection devices and resistive change element arrays including a plurality of resistive change element cells and a plurality of selection devices arranged in a group of at least two resistive change element cells sharing one selection device configuration. Resistive change element cells sharing a selection device are electrically connected to the selection device, however, the resistive change element cells do not include the selection device. Resistive change element cells sharing a selection device can be located above the selection device because the resistive change element cells do not include the selection device. Resistive change element cells sharing a selection device can be scaled to smaller dimensions than resistive change element cells including in situ selection devices because dimensions of resistive change element cells sharing a selection device are generally independent of dimensions of a selection device. Additionally, resistive change element arrays including a plurality of resistive change element cells and a plurality of selection devices arranged in a group of at least two resistive change element cells sharing one selection device configuration can have resistive change element cell densities greater than resistive change element cell densities of resistive change element arrays including a plurality of resistive change element cells with each resistive change element cell including an in situ selection device because each group of at least two resistive change element cells can be positioned above a selection device for that group and because the resistive change element cells can be scaled to smaller dimensions.

Resistive change element cells store information through the use of a resistive change element within the cell. Responsive to electrical stimulus, this resistive change element can be adjusted between at least two non-volatile resistive states. Typically, two resistive states are used: a low resistive state (corresponding, typically, to a logic 1, a SET state) and a high resistive state (corresponding, typically, to a logic 0, a RESET state). In this way, the resistance value of the resistive change element within the resistive change element cell can be used to store a bit of information (functioning, for example, as a 1-bit memory element). According to other aspects of the present disclosure, more than two resistive states are used, allowing a single cell to store more than one bit of information. For example, a resistive change element cell might adjust its resistive change element between four non-volatile resistive states, allowing for the storage of two bits of information in a single cell.

A PROGRAMMING operation of a resistive change element is an operation to adjust a resistive state of the resistive change element from an initial resistive state to a new desired resistive state. Programming operations can include a SET operation, where a resistive change element is adjusted from a relatively high resistive state (e.g., on the order of 1 MΩ) to a relatively low resistive state (e.g., on the order of 20 kΩ), and a RESET operation, where a resistive change element is adjusted from a relatively low resistive state (e.g., on the order of 20 kΩ) to a relatively high resistive state (e.g., on the order of 1 MΩ). Typically, a resistive change element is adjusted (programmed) between different resistive states by applying an electrical stimulus across the element. For example, one or more programming pulses of specific voltages, currents, and pulse widths (as required by the needs of a specific application) can be applied across a resistive change element to adjust a resistance of the resistive change element from an initial resistance to a new desired resistance. In the above example, another one or more programming pulses of specific voltages, currents, and pulse widths (as required by the needs of a specific application) can be applied across the resistive change element to adjust the resistive change element back to the initial resistance or, depending on the specific application, a third resistance. Further, as described in U.S. patent application Ser. No. 15/136,414, pulse trains can be applied across a resistive change element to adjust a resistance of the resistive change element.

A READ operation of a resistive change element that is programmable into two non-volatile resistive states is an operation to determine whether the resistive change element has a low resistive state (corresponding, typically, to a logic 1, a SET state) or a high resistive state (corresponding, typically, to a logic 0, a RESET state). Additionally, a READ operation is used to describe an operation where a resistive state of at least one resistive change element is determined without significantly altering the resistive state. A READ operation can include applying an electrical stimulus across a resistive change element and measuring an electrical characteristic. For example, when a DC voltage is applied across a resistive change element the current flowing through the resistive change element can be measured. In the above example, the current can be measured using a power supply with a current feedback output, such as a programmable power supply, or a sense amplifier or the current can be measured by inserting a current measuring device in series with the resistive change element. For example, when a fixed DC current is applied across a resistive change element, the resulting voltage across the resistive change element can be measured.

A SET VERIFY operation of a resistive change element that is programmable into two non-volatile resistive states is an operation to determine whether the resistive change element has a low resistive state (corresponding, typically, to a logic 1, a SET state) or a resistive state other than a low resistive state. A SET VERIFY operation requires a correspondence between a resistance of a resistive change element and a model resistance for a low resistive state to determine the resistive change element has a low resistive state closer than a correspondence between a resistance of a resistive change element and a model resistance for a low resistive state to determine the resistive change element has a low resistive state for a READ operation. Additionally, a SET VERFIY operation is used to describe an operation where it is determined whether a resistive state of at least one resistive change element is a low resistive state without significantly altering the resistive state. A SET VERIFY operation can include applying an electrical stimulus across a resistive change element and measuring an electrical characteristic. For example, when a DC voltage is applied across a resistive change element the current flowing through the resistive change element can be measured. In the above example, the current can be measured using a power supply with a current feedback output, such as a programmable power supply, or a sense amplifier or the current can be measured by inserting a current measuring device in series with the resistive change element. For example, when a fixed DC current is applied across a resistive change element, the resulting voltage across a resistive change element can be measured.

A RESET VERIFY operation of a resistive change element that is programmable into two non-volatile resistive states is an operation to determine whether the resistive change element has a high resistive state (corresponding, typically, to a logic 0, a RESET state) or a resistive state other than a high resistive state. A RESET VERIFY operation requires a correspondence between a resistance of a resistive change element and a model resistance for a high resistive state to determine the resistive change element has a high resistive state closer than a correspondence between a resistance of a resistive change element and a model resistance for a high resistive state to determine the resistive change element has a high resistive state for a READ operation. Additionally, a RESET VERFIY operation is used to describe an operation where it is determined whether a resistive state of at least one resistive change element is a high resistive state without significantly altering the resistive state. A RESET VERIFY operation can include applying an electrical stimulus across a resistive change element and measuring an electrical characteristic. For example, when a DC voltage is applied across a resistive change element the current flowing through the resistive change element can be measured. In the above example, the current can be measured using a power supply with a current feedback output, such as a programmable power supply, or a sense amplifier or the current can be measured by inserting a current measuring device in series with the resistive change element. For example, when a fixed DC current is applied across a resistive change element, the resulting voltage across a resistive change element can be measured.

The terms connected, coupled, electrically connected, electrically coupled, and in electrical communication are used interchangeably in this disclosure and the terms refer to a connection that allows electrical signals to flow either directly or indirectly from one component to another. The direct flow of electrical signals from one component to another does not preclude intervening passive devices that do not generate electric energy such as resistors, capacitors, and inductors. The indirect flow of electrical signals from one component to another does not preclude intervening active devices such as transistors. Further, the terms bit line, source line, and word line are not limited to referring to the array lines designated below, but rather, the terms bit line, source line, and word line can be used to refer to array lines that differ from the designations below.

Resistive change elements (and arrays thereof) are well suited for use as non-volatile memory devices for storing digital data (storing logic values as resistive states) within electronic devices (such as, but not limited to, cell phones, digital cameras, solid state hard drives, and computers). However, the use of resistive change elements is not limited to memory applications. For example, resistive change elements (and arrays thereof) are also well suited for use as switches, reprogrammable fuses, and antifuses. Indeed, arrays of resistive change elements as well as the advanced architectures taught by the present disclosure could also be used within logic devices or within analog circuitry.

Referring now to FIG. 1A, an exemplary architecture for a resistive change element array 100 is illustrated in a simplified schematic diagram. The resistive change element array 100 includes a plurality of resistive change element cells CELL00-CELLxy, each resistive change element cell including a resistive change element SW00-SWxy and an in situ selection device Q00-Qxy. The resistive change element array 100 also includes a plurality of bit lines BL(0)-BL(x), a plurality of source lines SL(0)-SL(x), and a plurality of word lines WL(0)-WL(x) and each resistive change element cell CELL00-CELLxy is accessed via a bit line of the plurality of bit lines BL(0)-BL(x), a source line of the plurality of source lines SL(0)-SL(x), and a word line of the plurality of word lines WL(0)-WL(x), as discussed below. It is noted that the numbering convention for the plurality of resistive change element cells CELL00-CELLxy, the numbering convention for the plurality of resistive change elements SW00-SWxy, and the numbering convention for the plurality of in situ selection devices Q00-Qxy reference the column number followed by the row number. It is also noted that the numbering convention for the plurality of bit lines BL(0)-BL(x) and the numbering convention for the plurality of source lines SL(0)-SL(x) reference the column number. It is further noted that the numbering convention for the plurality of word lines WL(0)-WL(y) references the row number.

The resistive change elements SW00-SWxy can be two-terminal nanotube switching elements, phase change memory elements, metal oxide memory elements, or conductive bridge memory elements as well as other materials and designs. The resistive change elements SW00-SWxy can be formed from a plurality of materials, such as, but not limited to, metal oxide, solid electrolyte, phase change material such as a chalcogenide glass, graphene fabrics, and carbon nanotube fabrics. For example, U.S. Pat. No. 7,781,862 to Bertin et al., discloses a two-terminal nanotube switching device comprising first and second conductive terminals and a nanotube fabric article. Bertin teaches methods for adjusting the resistivity of the nanotube fabric article between a plurality of nonvolatile resistive states. In at least one embodiment, electrical stimulus is applied to at least one of the first and second conductive elements such as to pass an electric current through the nanotube fabric layer. By carefully controlling this electrical stimulus within a certain set of predetermined parameters (as described by Bertin in U.S. Pat. No. 7,781,862) the resistivity of the nanotube article can be repeatedly switched between a relatively high resistive state and a relatively low resistive state. In certain embodiments, these high and low resistive states can be used to store a bit of information.

Each resistive change element SW00-SWxy is programmable into a low resistive state, for example a resistance on the order of 20 k$\Omega$ (corresponding, typically, to a logic '1,' a SET state), and a high resistive state, for example a resistance on the order of 1 M$\Omega$ (corresponding, typically, to a logic '0,' a RESET state). While some examples of resistive change element cells and resistive change elements within the present disclosure specifically reference carbon nanotube based resistive change element cells and resistive change elements, the devices and methods of the present disclosure are not limited in this regard. Indeed, it will be clear to those skilled in the art that the devices and methods of the present disclosure are applicable to any type of resistive change element cell or resistive change element (such as, but not limited to, phase change and metal oxide).

The in situ selection devices Q00-Qxy are n-channel metal oxide semiconductor field effect transistors (MOSFETs), also referred to as NMOS transistors. Alternatively, the in situ selection devices Q00-Qxy can be p-channel metal oxide semiconductor field effect transistors (MOSFETs), also referred to as PMOS transistors. Alternatively, the in situ selection devices Q00-Qxy can be other types of field effect transistors, such as carbon nanotube field effect transistors (CNTFETs), SiGE FETs, fully-depleted silicon-on-insulator FETs, or multiple gate field effect transistors such as FinFETs. When field effect transistors that do not require a semiconductor substrate are used with nanotube based resistive change elements, this enables chips fabricated entirely on insulator material, and additionally, enables the resistive change element array to be stacked to reduce the amount of chip area consumed by the resistive change element array.

Each resistive change element SW00-SWxy has a first terminal and a second terminal. Each in situ selection device Q00-Qxy has a drain terminal, a source terminal, and a gate terminal. The first terminals of the resistive change elements SW00-SWxy are electrically connected to source lines SL(0)-SL(x) and the second terminals of the resistive change elements SW00-SWxy are electrically connected to drain terminals of the in situ selection devices Q00-Qxy. The drain terminals of the in situ selection devices Q00-Qxy are electrically connected to second terminals of the resistive change elements SW00-SWxy, the source terminals of the in situ selection devices Q00-Qxy are electrically connected to the bit lines BL(0)-BL(x), and the gate terminals of the in situ selection devices Q00-Qxy are electrically connected to the word lines WL(0)-WL(y).

Figure 1B:
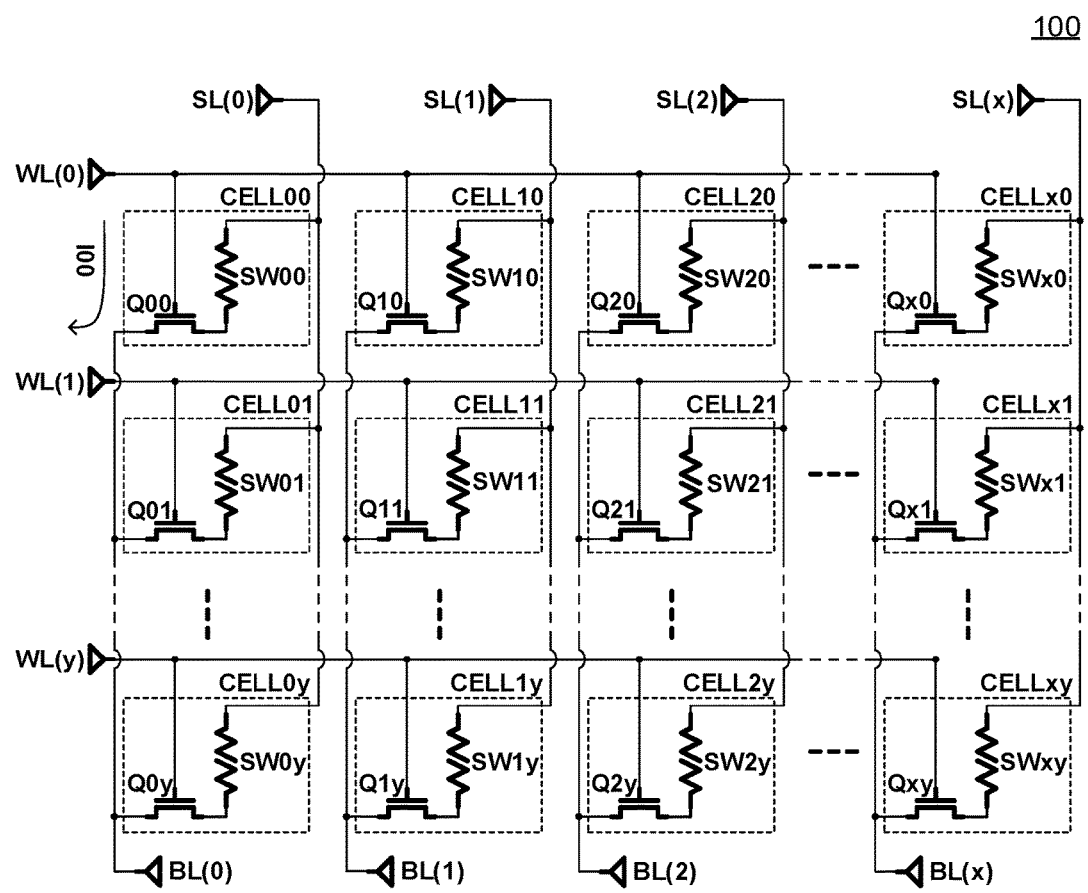
FIG. 1B illustrates a simplified schematic diagram showing current flow in the exemplary architecture of FIG. 1A during an operation of CELL00.

An exemplary operation of resistive change element cell CELL00 in the resistive change element array 100 of FIG. 1A will be explained in detail below, and operations of each cell in the resistive change element array 100 of FIG. 1A can be performed in a similar manner to the exemplary operation of CELL00. FIG. 1B illustrates a simplified schematic diagram showing current flow in the resistive change element array 100 during an exemplary operation of CELL00. The exemplary operation can be a programming operation, a read operation, a set verify operation, a reset verify operation, a test operation, or other type of operation, for example.

An exemplary operation of resistive change element cell CELL00 begins by selecting CELL00 from the plurality of resistive change element cells CELL00-CELLxy in the resistive change element array 100. CELL00 is selected from the plurality of resistive change element cells CELL00-CELLxy by driving the word line WL(0) to a voltage level to turn on the in situ selection device Q00 in CELL00, driving the word lines WL(1)-WL(y) to a voltage level to turn off the in situ selection devices Q01-Qxy in the resistive change element cells CELL01-CELLxy on other rows in the resistive change element array 100, driving the source lines SL(1)-SL(x) to 0 volts or ground or a high impedance state, and driving the bit lines BL(1)-BL(x) to 0 volts or ground or a high impedance state. The exemplary operation of CELL00 proceeds by applying an electrical stimulus for the exemplary operation to CELL00. The electrical stimulus for the exemplary operation is applied to CELL00 by providing the electrical stimulus for the exemplary operation to the source line SL(0) and driving the bit line BL(0) to a voltage level for the exemplary operation. The electrical stimulus for the exemplary operation is tailored for the exemplary operation by adjusting the electrical characteristics of the electrical stimulus for the exemplary operation. For example, the electrical characteristics of the electrical stimulus can be adjusted for programming operations, read operations, set verify operations, reset verify operations, test operations, and other types of operations. Also, the voltage level on the bit line BL(0) can be tailored for the exemplary operation. For example, the voltage level on the bit line BL(0) can be adjusted for programming operations, read operations, set verify operations, reset verify operations, test operations, and other types of operations. The exemplary operation of CELL00 can continue by determining a resistive state of the resistive change element SW00. For example, the resistive state of the resistive change element SW00 can be determined by measuring a voltage indicative of the resistive state of the resistive change element SW00, comparing a voltage indicative of the resistive state of the resistive change element SW00 with a selected voltage, measuring a current indicative of the resistive state of the resistive change element SW00, or comparing a current indicative of the resistive state of the resistive change element SW00 with a selected current. Additionally, the exemplary operation of CELL00 can include additional steps, such as initializing to 0 volts or ground the array lines of the resistive change element array 100 before selecting a resistive change element cell from the plurality of resistive change element cell CELL00-CELLxy in the resistive change element array 100.

FIG. 1B shows a current I00 flowing through the resistive change element cell CELL00 during the exemplary operation of CELL00 discussed above. The voltage on the word line WL(0) is approximately equal to the gate voltages of the in situ selection devices Q00-Qx0 and the voltages on the bit lines BL(0)-BL(x) are approximately equal to the source voltages of the in situ selection devices Q00-Qx0. The voltage on the word line WL(0) and the voltage on the bit line BL(0) are selected such that a gate to source voltage of the in situ selection device Q00 is greater than a threshold voltage of the in situ selection device Q00 to turn on the in situ selection device Q00. The voltage on the word line WL(0) and the voltages on the bit lines BL(1)-BL(x) can also turn on the in situ selection devices Q10-Qx0, however, current generally does not flow through CELL10-CELLx0 because the source lines SL(1)-SL(x) are driven to 0 volts or ground or a high impedance state to prevent current flow and the bit lines BL(1)-BL(x) are driven to 0 volts or ground or a high impedance state to prevent current flow. Further, current generally does not flow through CELL01-CELLxy because the word lines WL(1)-WL(y) are driven to a voltage level to turn off the in situ selection devices Q01-Qxy in the resistive change element cells CELL01-CELL0y. It is noted that the voltage on the word line WL(0) and the voltage on the bit line BL(0) can be selected to regulate current flow through the in situ selection device Q00.

Figure 1C:
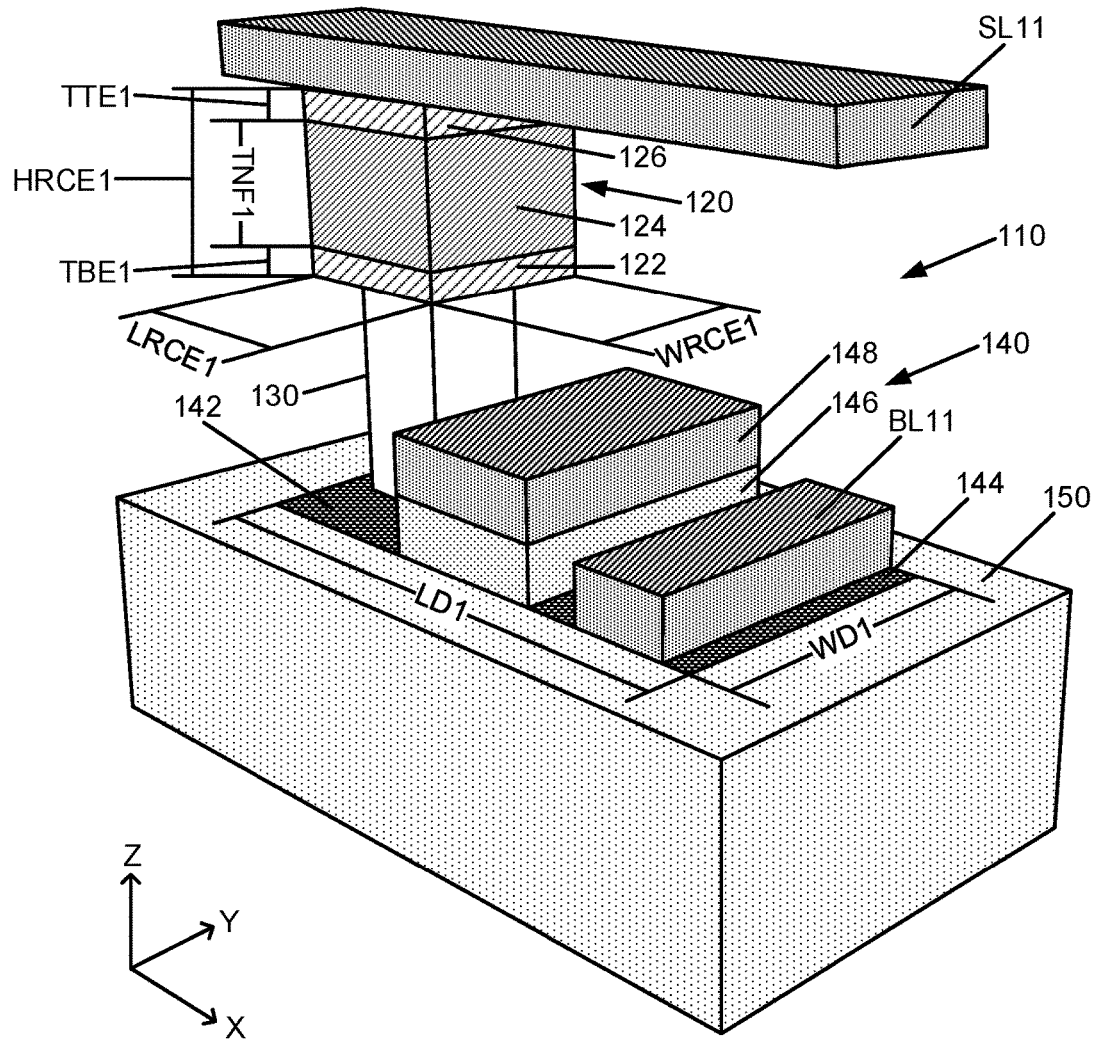
FIG. 1C illustrates a three-dimensional view of a resistive change element cell having a resistive change element and an in situ selection device, where the resistive change element has a square horizontal cross-sectional shape with a width dimension greater than a minimum feature size and a length dimension greater than a minimum feature size.

Referring now to FIG. 1C, a three-dimensional view of a resistive change element cell 110 including a resistive change element 120, a conductive structure 130, and an in situ selection device 140 is illustrated. The resistive change element 120 is positioned above the in situ selection device 140. The resistive change element 120 can be a two-terminal nanotube switching element, a phase change memory element, a metal oxide memory element, or a conductive bridge memory element as well as other materials and designs, as discussed above with respect to the resistive change elements SW00-SWxy. The in situ selection device 140 is an NMOS transistor, as discussed above with respect to the in situ selection devices Q00-Qxy. Alternatively, the in situ selection device 140 can be a PMOS transistor, as discussed above with respect to the in situ selection devices Q00-Qxy. Alternatively, the in situ selection device 140 can be other types of field effect transistors, a such as carbon nanotube field effect transistor (CNTFET), a SiGE FET, a fully-depleted silicon-on-insulator FET, or a multiple gate field effect transistor such as a FinFET, as discussed above with respect to the in situ selection devices Q00-Qxy.

The resistive change element 120 includes a bottom electrode 122, a nanotube fabric layer 124, and a top electrode 126. The bottom electrode 122 is in contact with the nanotube fabric layer 124 and the top electrode 126 is in contact with the nanotube fabric layer 124. Alternatively, the resistive change element 120 can include at least one intervening layer located between the bottom electrode 122 and the nanotube fabric layer 124, at least one intervening layer located between the nanotube fabric layer 124 and the top electrode 126, or at least one intervening layer located between the bottom electrode 122 and the nanotube fabric layer 124 and at least one intervening layer located between the nanotube fabric layer 124 and the top electrode 126. Alternatively, the bottom electrode 122 can be omitted from the resistive change element 120, the top electrode 126 can be omitted from the resistive change element 120, or the bottom electrode 122 and the top electrode 126 can be omitted from the resistive change element 120.

The resistive change element 120 has a substantially square horizontal cross-sectional shape. The resistive change element 120 has a width $W_{RCE1}$, a length $L_{RCE1}$, and a height $H_{RCE1}$. The width $W_{RCE1}$ is greater than 1F, the length $L_{RCE1}$ is greater than 1F, and the height $H_{RCE1}$ is approximately equal to the sum of the thicknesses of the bottom electrode 122, the nanotube fabric layer 124, and the top electrode 126. F represents a minimum feature size. The height $H_{RCE1}$ of the resistive change element 120 is typically greater than 1F, however, the height $H_{RCE1}$ of the resistive change element 120 can be scaled, such that the height $H_{RCE}$ approaches 1F. Alternatively, the resistive change element 120 can have a non-square horizontal cross-sectional shape with at least one dimension greater than the minimum feature size F, such as a substantially rectangular horizontal cross-sectional shape other than a substantially square horizontal cross-sectional shape, a substantially circular horizontal cross-sectional shape, a substantially oval horizontal cross-sectional shape, a substantially triangular horizontal cross-sectional shape, a substantially trapezoidal horizontal cross-sectional shape, an irregular horizontal cross-sectional shape, and a non-uniform horizontal cross-sectional shape where different sections of the resistive change element 120 can have different dimensions. The bottom electrode 122, the nanotube fabric layer 124, and the top electrode 126 have substantially square horizontal cross-sectional shapes because the resistive change element 120 has a substantially square horizontal cross-sectional shape. The bottom electrode 122 has a length dimension greater than 1F, a width dimension greater than 1F, and a thickness TBE1. The nanotube fabric layer 124 has a length dimension greater than 1F, a width dimension greater than 1F, and a thickness TNF1. The top electrode 126 has a length dimension greater than 1F, a width dimension greater than 1F, and a thickness TTE1. It is noted that the resistive change element 120 can be considered to have a substantially square horizontal cross-sectional shape when the resistive change element 120 has a horizontal cross-sectional shape that is exactly a square and when the resistive change element 120 has a horizontal cross-sectional shape that is not exactly a square due to variations caused by the fabrication process.

The in situ selection device 140 includes a drain terminal 142, a source terminal 144, a gate dielectric 146, and a gate terminal 148. The gate dielectric 146 is formed on the substrate 150 and the gate terminal 148 is formed on the gate dielectric 146. Alternately, the gate terminal 148 can be part of an array line, such as a word line. Alternatively, the drain terminal 142, the source terminal 144, and the gate dielectric 146 can be formed on a layer of material, such as a nanotube fabric layer, deposited on the substrate 150 and the gate terminal 148 can be formed on the gate dielectric 146. The substrate 150 can be formed from a conductive material, a semiconductor material, or an insulating material as required by the needs of a specific application.

The resistive change element 120 is electrically connected to the drain terminal 142 of the in situ selection device 140 through the conductive structure 130. The conductive structure 130 has a substantially square horizontal cross-sectional shape. The conductive structure 130 has a length dimension approximately equal to F, a width dimension approximately equal to than F, and a height greater than the sum of the thicknesses of the gate dielectric 146 and the gate terminal 148. Alternatively, the conductive structure 130 can have a length dimension greater than F and/or a width dimension greater than F. Alternatively, the conductive structure 130 can have a non-square horizontal cross-sectional shape, such as a substantially rectangular horizontal cross-sectional shape other than a substantially square horizontal cross-sectional shape, a substantially circular horizontal cross-sectional shape, a substantially oval horizontal cross-sectional shape, a substantially triangular horizontal cross-sectional shape, a substantially trapezoidal horizontal cross-sectional shape, an irregular horizontal cross-sectional shape, and a non-uniform horizontal cross-sectional shape where different sections of the conductive structure 130 can have different dimensions. It is noted that the conductive structure 130 can be considered to have a substantially square horizontal cross-sectional shape when the conductive structure 130 has a horizontal cross-sectional shape that is exactly a square and when the conductive structure 130 has a horizontal cross-sectional shape that is not exactly a square due to variations caused by the fabrication process.

The in situ selection device 140 occupies a substantially rectangular surface area shape of the substrate 150. The in situ selection device 140 has a width WD1 greater than the width $W_{RCE1}$ of the resistive change element 120 and a length LD1 greater than the length $L_{RCE1}$ of the resistive change element 120. Thus, the rectangular surface area shape occupied by the in situ selection device 140 has an area greater than an area of the square horizontal cross-sectional shape of the resistive change element 120. For example, when the rectangular surface area shape occupied by the in situ selection device 140 has a width WD1 of 3F and a length LD1 of 4.5F, the resistive change element 120 has a width $W_{RCE1}$ of 2F and a length $L_{RCE1}$ of 2F, and F is 10 nm, the in situ selection device 140 occupies an area of 1350 nm$^2$ of the substrate 150 and the square horizontal cross-sectional shape of the resistive change element 120 has an area of 400 nm$^2$. Alternatively, the in situ selection device 140 can occupy a substantially square surface area shape, or a non-rectangular surface area shape, such as a substantially trapezoidal surface area shape, and an irregular surface area shape. It is noted that the in situ selection device 140 can be considered to occupy a substantially rectangular surface area shape of a substrate when the in situ selection device 140 occupies a surface area shape of a substrate that is exactly a rectangle and when the in situ selection device 140 occupies a surface area shape of a substrate that is not exactly a rectangle due to variations caused by the fabrication process.

When the resistive change element cell 110 is part of a resistive change element array including a plurality of resistive change element cells with the same structure as the resistive change element cell 110, a surface area shape of a substrate required for an in situ selection device to be adjacently located to other in situ selection devices in the resistive change element array is greater than a rectangular surface area shape occupied by an in situ selection device and a shape required for a resistive change element to be adjacently located to other resistive change elements in the resistive change element array is greater than a square horizontal cross-sectional shape of a resistive change element. The surface area shape of a substrate required for an in situ selection device to be adjacently located is greater than the rectangular surface area shape occupied by an in situ selection device because the in situ selection devices are required to be separated by at least 1F. For example, when the in situ selection device 140 occupies a rectangular surface area shape with a width WD1 of 3F and a length LD1 of 4.5F and adjacent in situ selection devices are separated by 1F, the surface area shape of a substrate required for an in situ selection device to be adjacently located to other in situ selection devices in the resistive change element array can be approximated by a rectangle having a width of 4F and a length of 5.5F. The shape required for a resistive change element to be adjacently located is greater than the square horizontal cross-sectional shape of a resistive change element because the resistive change elements are required to be separated by at least 1F. For example, when the resistive change element 120 has a square horizontal cross-sectional shape with a width $W_{RCE1}$ of 2F and a length $L_{RCE1}$ of 2F and adjacent resistive change elements are separated by 1F, the shape required for a resistive change element to be adjacently located to other resistive change elements in the resistive change element array can be approximated by a square having a width of 3F and a length of 3F.

When the resistive change element cell 110 is part of a resistive change element array including a plurality of resistive change element cells with the same structure as the resistive change element cell 110, a surface area of a substrate required for a resistive change element cell is based on the surface area shape of a substrate required for an in situ selection device to be adjacently located to other in situ selection devices in the resistive change element array. The surface area of a substrate required for a resistive change element cell is based on the surface area shape of a substrate required for an in situ selection device to be adjacently located because the surface area shape of a substrate required for an in situ selection device to be adjacently located is greater than the shape required for a resistive change element to be adjacently located and because the resistive change element 120 is position above the in situ selection device 140 such that an area of the substrate covered by the shape required for a resistive change element to be adjacently located is encompassed by the surface area of a substrate required for an in situ selection device to be adjacently located.

Alternatively, when a shape required for a resistive change element to be adjacently located encompasses a surface area shape of a substrate required for an in situ selection device to be adjacently located and the resistive change element 120 is positioned above the in situ selection device 140 such that an area of the substrate covered by the shape required for a resistive change element to be adjacently located encompasses the surface area shape of a substrate required for an in situ selection device to be adjacently located, a surface area of the substrate required for a resistive change element cell is based on the shape required for a resistive change element to be adjacently located to other resistive change elements in the resistive change element array. Alternatively, when the resistive change element 120 is located above the in situ selection device 140 such that an area of a substrate covered by the shape required for a resistive change element to be adjacently located covers at least part of the surface area shape of a substrate required for an in situ selection device to be adjacently located, a surface area of the substrate required for a resistive change element cell is based on a combined shape formed by the shape required for a resistive change element to be adjacently located and the surface area shape of a substrate required for an in situ selection device to be adjacently located. The combined shape has an outline defined by the part of the shape required for a resistive change element to be adjacently located that covers part of the surface area shape of a substrate required for an in situ selection device to be adjacently located, the part of the shape required for a resistive change element to be adjacently located that does not cover the surface area shape of a substrate required for an in situ selection device to be adjacently located, and the part of the surface area shape of a substrate required for an in situ selection device to be adjacently located that is not covered by the shape required for a resistive change element to be adjacently located.

Resistive change element cell density of a resistive change element array is based on a surface area of a substrate required for a resistive change element cell, and thus, resistive change element cell density in a resistive change element array including a plurality of resistive change element cells with the same structure as the resistive change element cell 110 is based on the surface area shape of a substrate required for an in situ selection device to be adjacently located to other in situ selection devices in the resistive change element array. For example, when a shape required for a resistive change element to be adjacently located can be approximated by a square having a width 3F and a length 3F, a surface area shape of a substrate required for an in situ selection device to be adjacently located can be approximated by a rectangle having a width dimension of 4F and a length dimension of 5.5F, an area of the substrate covered by the shape required for a resistive change element to be adjacently located is encompassed by the surface area shape of a substrate required for an in situ selection device to be adjacently located, and F is 10 nm, the resistive change element cell density is one resistive change element cell per an area of 2,200 nm$^2$ of the substrate.

When the resistive change element cell 110 is part of a resistive change element array including a plurality of resistive change element cells with the same structure as the resistive change element cell 110, source lines are in electrical communication with top electrodes of resistive change elements, word lines are in electrical communication with gate terminals of in situ selection devices, and bit lines are in electrical communication with source terminals of in situ selection devices. FIG. 1C shows a source line SL11 in electrical communication the top electrode 126 of the resistive change element 120 and a bit line BL11 in electrically communication with the source terminal 144 of the in situ selection device 140. Alternatively, the top electrode 126 of the resistive change element 120 is in electrical communication with the source line SL11 through a conductive structure. The gate terminal 148 of the in situ selection device 140 can be part of a word line WL11, alternatively, the gate terminal 148 can be in electrical communication with a word line WL11. Further, intervening layers, such as barrier metal layers to provide a barrier to metal migration, can be included to provide a barrier to metal migration from the bit line BL11, the source line SL11, and/or the word line WL11. It is noted that when the resistive change element cell 110 is part of a resistive change element array including a plurality of resistive change element cells, as discussed above, the regions around the resistive change element 120, the conductive structure 130, the gate dielectric 146, the gate terminal 148, the bit line BL11, the source line SL11, and the word line WL11 can be filled with a dielectric. It is further noted that the resistive change element 120 can be sealed by a thin dielectric sidewall film, as described in U.S. patent application Ser. No. 15/486,032, prior to filling the regions around the resistive change element 120 with the dielectric.

Figure 1D:
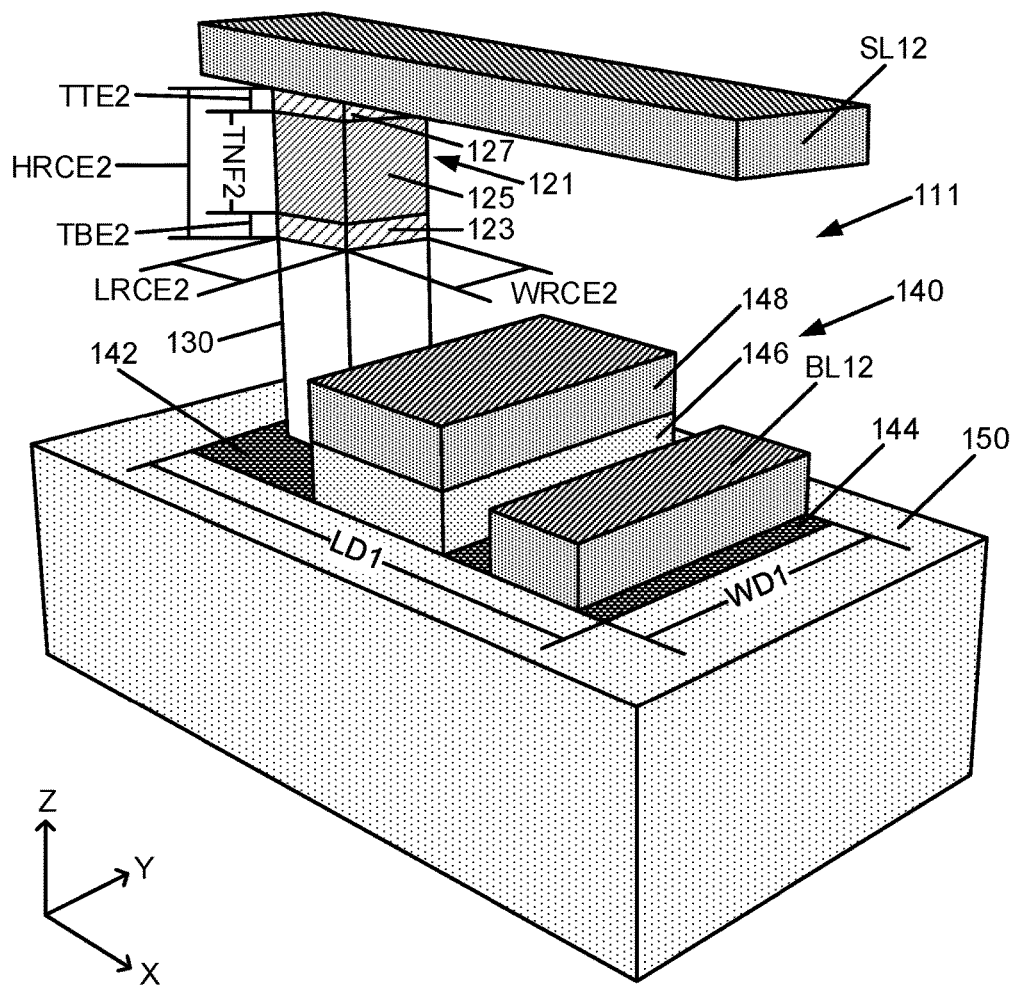
FIG. 1D illustrates a three-dimensional view of a resistive change element cell having a resistive change element and an in situ selection device, where the resistive change element has a square horizontal cross-sectional shape with a width dimension approximately equal to a minimum feature size and a length dimension approximately equal to a minimum feature size.

Referring now to FIG. 1D, a three-dimensional view of a resistive change element cell 111 including a resistive change element 121, a conductive structure 130, and an in situ selection device 140 is illustrated. The resistive change element 121 is positioned above the in situ selection device 140. The resistive change element 121 has a similar structure to the resistive change element 120 discussed above with respect to FIG. 1C. However, the resistive change element 121 has a substantially square horizontal cross-sectional shape with a width $W_{RCE2}$ approximately equal to 1F, a length $L_{RCE2}$ approximately equal to 1F, and a height $H_{RCE2}$ approximately equal to the sum of the thicknesses of a bottom electrode 123, a nanotube fabric layer 125, and a top electrode 127. F represents a minimum feature size. The height $H_{RCE2}$ of the resistive change element 121 is typically greater than 1F, however, the height $H_{RCE2}$ of the resistive change element 121 can be scaled, such that the height $H_{RCE2}$ approaches 1F. Alternatively, the resistive change element 121 can have a non-square horizontal cross-sectional shape smaller than a non-square horizontal cross-sectional shape of the resistive change element 120. The bottom electrode 123, the nanotube fabric layer 125, and the top electrode 127 have substantially square horizontal cross-sectional shapes because the resistive change element 121 has a substantially square horizontal cross-sectional shape. The bottom electrode 123 has a length dimension approximately equal to 1F, a width dimension approximately equal to 1F, and a thickness TBE2. The nanotube fabric layer 125 has a length dimension approximately equal to 1F, a width dimension approximately equal to 1F, and a thickness TNF2. The top electrode 127 has a length dimension approximately equal to 1F, a width dimension approximately equal to 1F, and a thickness TTE2. It is noted that the resistive change element 121 can be considered to have a substantially square horizontal cross-sectional shape when the resistive change element 121 has a horizontal cross-sectional shape that is exactly a square and when the resistive change element 121 has a horizontal cross-sectional shape that is not exactly a square due to variations caused by the fabrication process. The conductive structure 130, the in situ selection device

140, and the substrate 150 have the same structures as discussed above with respect to FIG. 1C.

When the resistive change element cell 111 is part of a resistive change element array including a plurality of resistive change element cells with the same structure as the resistive change element cell 111, a surface area shape of a substrate required for an in situ selection device to be adjacently located to other in situ selection devices in the resistive change element array is greater than a rectangular surface area shape occupied by an in situ selection device and a shape required for a resistive change element to be adjacently located to other resistive change elements in the resistive change element array is greater than a square horizontal cross-sectional shapes of a resistive change element. The surface area shape of a substrate required for an in situ selection device to be adjacently located is greater than the rectangular surface area shape occupied by an in situ selection device because the in situ selection devices are required to be separated by at least 1F. For example, when the in situ selection device 140 occupies a rectangular surface area shape with a width WD1 of 3F and a length LD1 of 4.5F and adjacent in situ selection devices are separated by 1F, the surface area shape of a substrate required for an in situ selection device to be adjacently located to other in situ selection devices in the resistive change element array can be approximated by a rectangle with a width of 4F and a length of 5.5F. The shape required for a resistive change element to be adjacently located is greater than the square horizontal cross-sectional shape of a resistive change element because the resistive change elements are required to be separated by at least 1F. For example, when the resistive change element 121 has a square horizontal cross-sectional shape with a width $W_{RCE2}$ of 1F and a length $L_{RCE2}$ of 1F and adjacent resistive change elements are separated by 1F, the shape required for a resistive change element to be adjacently located to other resistive change elements in the resistive change element array can be approximated by a square with a width of 2F and a length of 2F.

When the resistive change element cell 111 is part of a resistive change element array including a plurality of resistive change element cells with the same structure as the resistive change element cell 111, a surface area of a substrate required for a resistive change element cell is based on the surface area shape of a substrate required for an in situ selection device to be adjacently located to other in situ selection devices in the resistive change element array. The surface area of a substrate required for a resistive change element cell is based on the surface area shape of a substrate required for an in situ selection device to be adjacently located because the surface area shape of a substrate required for an in situ selection device to be adjacently located is greater than the shape required for a resistive change element to be adjacently located and because the resistive change element 121 is positioned above the in situ selection device 140 such that an area of the substrate covered by the shape required for a resistive change element to be adjacently located is encompassed by the surface area shape of a substrate required for an in situ selection device to be adjacently located.

Resistive change element cell density of a resistive change element array is based on a surface area of a substrate required for a resistive change element cell, and thus, resistive change element cell density in a resistive change element array including a plurality of resistive change element cells with the same structure as the resistive change element cell 111 is based on the surface area shape of a substrate required for an in situ selection device to be adjacently located to other in situ devices in the resistive change element array. For example, when a shape required for a resistive change element to be adjacently located can be approximated by a square having a width 2F and a length 2F, a surface area shape of a substrate required for an in situ selection device to be adjacently located can be approximated by a rectangle having a width dimension of 4F and a length dimension of 5.5F, an area of the substrate covered by the shape required for a resistive change element to be adjacently located is encompassed by the surface area shape of a substrate required for an in situ selection device to be adjacently located, and F is 10 nm, the resistive change element cell density is one resistive change element cell per an area of 2,200 nm$^2$ of the substrate.

When the resistive change element cell 111 is part of a resistive change element array including a plurality of resistive change element cells with the same structure as the resistive change element cell 111, source lines are in electrical communication with top electrodes of resistive change elements, word lines are in electrical communication with gate terminals of in situ selection devices, and bit lines are in electrical communication with source terminals of in situ selection devices. FIG. 1D shows a source line SL12 in electrical communication the top electrode 127 of the resistive change element 121 and a bit line BL12 in electrically communication with the source terminal 144 of the in situ selection device 140. Alternatively, the top electrode 127 of the resistive change element 121 is in electrical communication with the source line SL12 through a conductive structure. The gate terminal 148 of the in situ selection device 140 can be part of a word line WL12, alternatively, the gate terminal 148 can be in electrical communication with a word line WL12. Further, intervening layers, such as barrier metal layers to provide a barrier to metal migration, can be included to provide a barrier to metal migration from the bit line BL12, the source line SL12, and/or the word line WL12. It is noted that when the resistive change element cell 111 is part of a resistive change element array including a plurality of resistive change element cells, as discussed above, the regions around the resistive change element 121, the conductive structure 130, the gate dielectric 146, the gate terminal 148, the bit line BL12, the source line SL12, and the word line WL12 can be filled with a dielectric. It is further noted that the resistive change element 121 can be sealed by a thin dielectric sidewall film, as described in U.S. patent application Ser. No. 15/486,032, prior to filling the regions around the resistive change element 121 with the dielectric.

Resistive change element cell density of a resistive change element array including a plurality of resistive change element cells with each resistive change element cell including a resistive change element and an in situ selection device can be constrained by a surface area shape of a substrate required for an in situ selection device to be adjacently located to other in situ selection devices in a resistive change element array. When a surface area shape of a substrate required for an in situ selection device to be adjacently located to other in situ selection devices in the resistive change element array encompasses an area of a substrate covered by a shape required for a resistive change element to be adjacently located to other resistive change elements in the resistive change element array, resistive change element cell density is constrained by the surface area shape of a substrate required for an in situ selection device to be adjacently located because the least amount of area of a substrate required for one resistive change element cell is the surface area shape of a substrate required for an in situ selection device to be adjacently located. Additionally, when the surface area shape of a substrate required for an in situ selection device to be adjacently located encompasses an area of a substrate covered by the shape required for a resistive change element to be adjacently located, scaling the resistive change element cells can be constrained by the surface area shape of a substrate required for an in situ selection device to be adjacently located because the minimum dimensions for the resistive change element cells are the dimensions of the surface area shape of a substrate required for an in situ selection device to be adjacently located. For example, when the surface area shape of a substrate required for an in situ selection device to be adjacently located encompasses an area of a substrate covered by the shape required for a resistive change element to be adjacently located, further scaling the size of the resistive change elements to further reduce the size of the shape required for a resistive change element to be adjacently located does not reduce the minimum dimensions for the resistive change element cells. Further, the constraints on density and scaling imposed by the surface area shape of a substrate required for an in situ selection device to be adjacently located become more significant as resistive change elements are scaled down more rapidly than in situ selection devices because the size difference between the surface area shape of a substrate required for an in situ selection device to be adjacently located and the shape required for a resistive change element to be adjacently located increases.

Resistive change element cells sharing a selection device are electrically connected to the selection device, however, the resistive change element cells do not include the selection device. Resistive change element cells sharing a selection device can be positioned above the selection device such that an area of a substrate covered by a layout of the resistive change element cells is encompassed by a surface area shape of a substrate occupied by the selection device. Resistive change element cells sharing a selection device can be scaled to smaller dimensions than resistive change element cells including a resistive change element and an in situ selection device because dimensions of resistive change element cells sharing a selection device are generally independent of dimensions of a selection device. Thus, a surface area shape of a substrate required for a selection device to be adjacently located to other selection devices in a resistive change element array imposes less of a constraint on density and scaling of resistive change element cells sharing a selection device. Therefore, resistive change element arrays including a plurality of resistive change element cells and a plurality of selection devices arranged in a group of at least two resistive change element cells sharing a selection device configuration can have resistive change element cell densities greater than resistive change element cell densities of resistive change element arrays including resistive change element cells with each resistive change element cell including a resistive change element and an in situ selection device.

A group of resistive change element cells sharing a selection device is referred to as a 1TNR configuration where 1T refers to the one selection device and NR refers to the number of resistive change element cells in the group of resistive change element cells. A resistive change element array can include a plurality of resistive change element cells and a plurality of selection devices arranged in a group of resistive change element cells sharing a selection device configuration where each group includes the same number of resistive change element cells. For example, a resistive change element array can include a plurality of resistive change element cells and a plurality of selection devices arranged in a group of resistive change element cells sharing a selection device configuration, where each group includes two resistive change element cells, also referred to as a 1T2R configuration. Alternatively, a resistive change element array can include a plurality of resistive change element cells and a plurality of selection devices arranged in a group of resistive change element cells sharing a selection device configuration, where groups of resistive change element cells include different numbers of resistive change element cells. For example, a resistive change element array can include a plurality of resistive change element cells and a plurality of selection devices arranged in a group of resistive change element cells sharing a selection device configuration, where groups of resistive change element cells include eight resistive change element cells, also referred to as a 1T8R configuration, and groups of resistive change element cells include sixteen resistive change element cells, also referred to as a 1T16R configuration. It is noted that the number of resistive change element cells in a group of resistive change element cells is not limited to being a power of two but rather the number of resistive change element cells in a group of resistive change element cells can be a positive integer, for example in a 1T3R configuration three resistive change element cells are in a group of resistive change element cells and in 1T6R configuration six resistive change element cells are in a group of resistive change element cells.

Figure 2A:
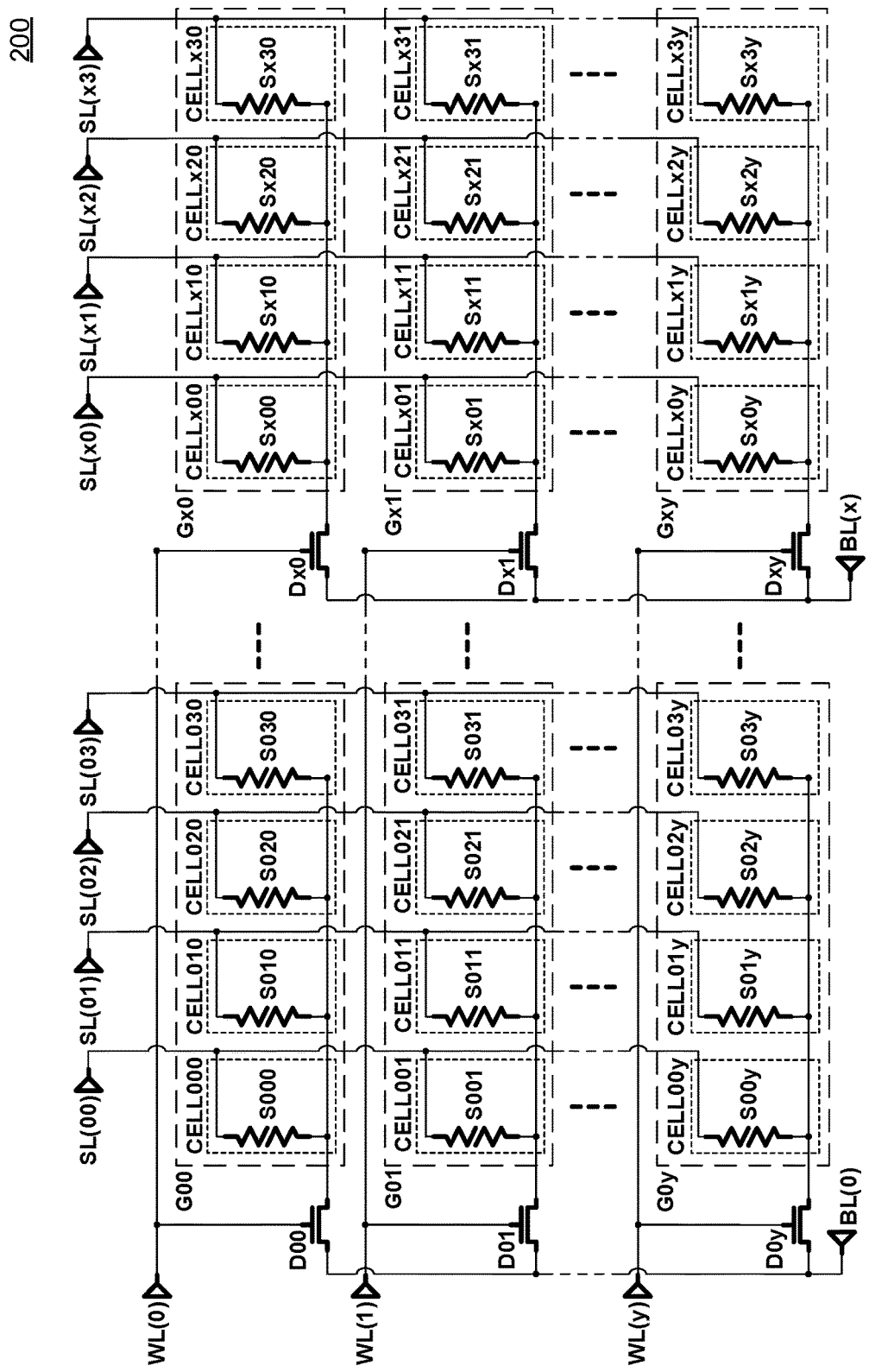
FIG. 2A illustrates a simplified schematic diagram of an exemplary architecture for a resistive change element array including a plurality of resistive change element cells and a plurality of selection devices arranged in a group of four resistive change element cells sharing one selection device configuration.

Referring now to FIG. 2A, an exemplary architecture for a resistive change element array 200 is illustrated in a simplified schematic diagram. The resistive change element array 200 includes a plurality of resistive change element cells CELL000-CELLx3y and a plurality of selection devices D00-Dxy arranged in a group of four resistive change element cells sharing a selection device configuration, also referred to as a 1T4R configuration. The resistive change element cells CELL000-CELLx3y are in a plurality of groups G00-Gxy of four resistive change element cells and the four resistive change element cells in each group G00-Gxy are electrically connected to a selection device D00-Dxy for that group. Each resistive change element cell CELL000-CELLx3y includes a resistive change element S000-Sx3y and does not include a selection device. The resistive change element array 200 also includes a plurality of bit lines BL(0)-BL(x), a plurality of source lines SL(00)-SL(x3), and a plurality of word lines WL(0)-WL(y) and each resistive change element cell CELL000-CELLx3y is accessed via a bit line of the plurality of bit lines BL(0)-BL(x), a source line of the plurality of source lines SL(00)-SL(x3), and a word line of the plurality of word lines WL(0)-WL(y), as discussed below. It is noted that the numbering convention for the plurality of resistive change element cells CELL000-CELLx3y and the numbering convention for the plurality of resistive change elements S000-Sx3y both reference a group number on the row followed by the column number in the group followed by the row number. It is noted that the numbering convention for the plurality of groups G00-Gxy and the numbering convention for the plurality of selection devices D00-Dxy both reference the group number on the row followed by the row number. It is noted that the numbering convention for the plurality of source lines SL(00)-SL(x3) references the group number on the row followed by the column number in the group, the numbering convention for the plurality of bit lines BL(0)-BL(x) references the group number on the row, and the numbering convention for the plurality of word lines WL(0)-WL(y) references the row number.

The resistive change elements S000-Sx3y can be two-terminal nanotube switching elements, phase change memory elements, metal oxide memory elements, or conductive bridge memory elements as well as other materials and designs. The resistive change elements S000-SWx3y can be formed from a plurality of materials, such as, but not limited to, metal oxide, solid electrolyte, phase change material such as a chalcogenide glass, graphene fabrics, and carbon nanotube fabrics. For example, U.S. Pat. No. 7,781,862 to Bertin et al., discloses a two-terminal nanotube switching device comprising first and second conductive terminals and a nanotube fabric article. Bertin teaches methods for adjusting the resistivity of the nanotube fabric article between a plurality of nonvolatile resistive states. In at least one embodiment, electrical stimulus is applied to at least one of the first and second conductive elements such as to pass an electric current through the nanotube fabric layer. By carefully controlling this electrical stimulus within a certain set of predetermined parameters (as described by Bertin in U.S. Pat. No. 7,781,862) the resistivity of the nanotube article can be repeatedly switched between a relatively high resistive state and relatively low resistive state.

Each resistive change element S000-Sx3y is programmable into a low resistive state, for example a resistance on the order of 20 kSΩ (corresponding, typically, to a logic '1,' a SET state), and a high resistive state, for example a resistance on the order of 1 MΩ (corresponding, typically, to a logic '0,' a RESET state). While some examples of resistive change element cells and resistive change elements within the present disclosure specifically reference carbon nanotube based resistive change element cells and resistive change elements, the devices and methods of the present disclosure are not limited in this regard. Indeed, it will be clear to those skilled in the art that the devices and methods of the present disclosure are applicable to any type of resistive change element cell or resistive change element (such as, but not limited to, phase change and metal oxide).

The selection devices D00-Dxy are n-channel metal oxide semiconductor field effect transistors (MOSFETs), also referred to as NMOS transistors. Alternatively, the selection devices D00-Dxy can be p-channel metal oxide semiconductor field effect transistors (MOSFETs), also referred to as PMOS transistors. Alternatively, the selection devices D00-Dxy can be other types of field effect transistors, such as carbon nanotube field effect transistors (CNTFETs), SiGE FETs, fully-depleted silicon-on-insulator FETs, or multiple gate field effect transistors such as FinFETs. When field effect transistors that do not require a semiconductor substrate are used with nanotube based resistive change elements, this enables chips fabricated entirely on insulator material, and additionally, enables the resistive change element array to be stacked to reduce the amount of chip area consumed by the resistive change element array.

Each resistive change element S000-Sx3y has a first terminal and a second terminal. Each selection device D00-Dxy has a drain terminal, a source terminal, and a gate terminal. The first terminals of the resistive change elements S000-Sx3y are electrically connected to the source lines SL(00)-SL(x3) and the second terminals of the resistive change elements S000-Sx3y are electrically connected to the drain terminals of the selection devices D00-Dxy. The drain terminals of the selection devices D00-Dxy are electrically connected to second terminals of the resistive change elements S000-Sx3y, the source terminals of the selection devices D00-Dxy are electrically connected to the bit lines BL(0)-BL(x), and the gate terminals of the selection devices D00-Dxy are electrically connected to the word lines WL(0)-WL(y).

Figure 2B:
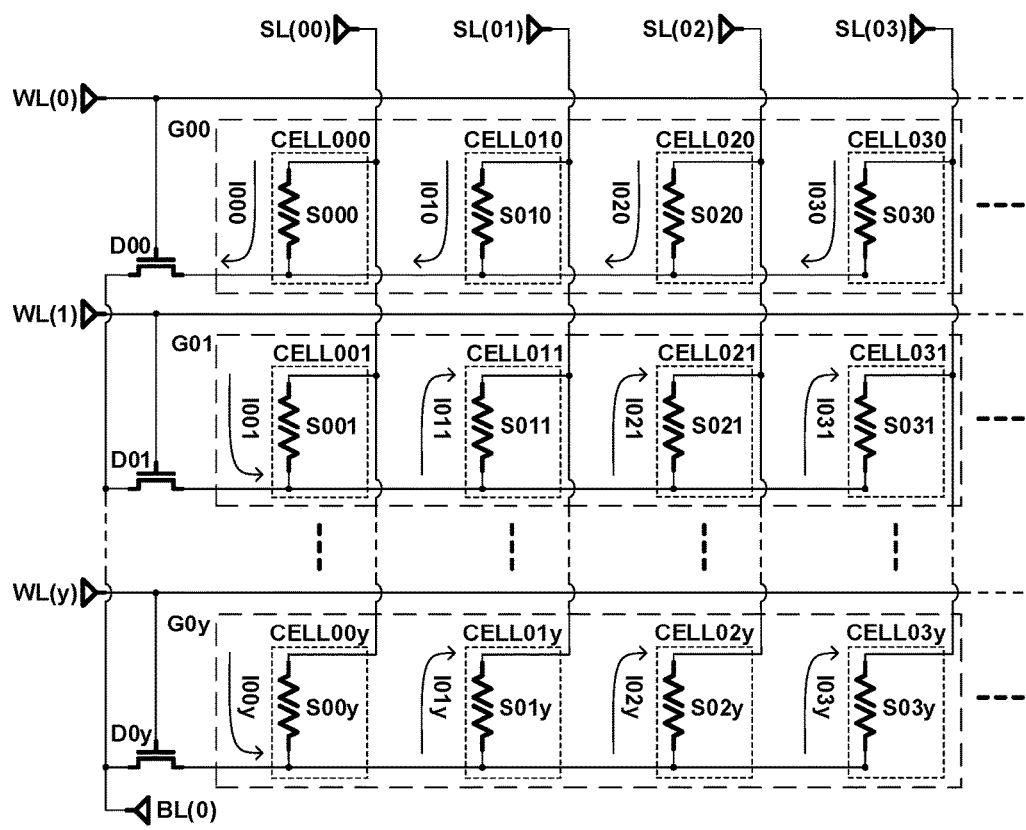
FIG. 2B illustrates a simplified schematic diagram showing current flow in the exemplary architecture of FIG. 2A during an operation of CELL000, where a reduced version of the resistive change element array is shown so that current flow can be shown in greater detail.

An exemplary operation of resistive change element cell CELL000 in the resistive change element array 200 of FIG. 2A will be explained in detail below, and operations of each cell in the resistive change element array 200 of FIG. 2A can be performed in a similar manner to the exemplary operation of CELL000. FIG. 2B shows a reduced version of the resistive change element array 200, so that current flow can be shown in greater detail. FIG. 2B shows current flow in the resistive change element array 200 during an exemplary operation of CELL000, where a voltage Vstimulus of an electrical stimulus for the exemplary operation is greater than an inhibit voltage Vinhibit for the exemplary operation and where the voltage Vstimulus of the electrical stimulus for the exemplary operation and the inhibit voltage Vinhibit for the exemplary operation are greater than a voltage on the bit line BL(0) for the exemplary operation. The exemplary operation can be a programming operation, a read operation, a set verify operation, a reset verify operation, a test operation, or other type of operation, for example.

An exemplary operation of CELL000 begins by selecting group G00 of resistive change element cells from the plurality of groups G00-Gxy of resistive change element cells in the resistive change element array 200. The group G00 is selected by driving the word line WL(0) to a voltage level to turn on the selection device D00, driving the word lines WL(1)-WL(y) to a voltage level to turn off the selection devices D01-Dxy, driving the source lines SL(x0)-SL(x3) to 0 volts or ground or a high impedance state, and driving bit lines BL(x) to 0 volts or ground or a high impedance state. The exemplary operation of CELL000 proceeds by applying an electrical stimulus for the exemplary operation to CELL000 and an inhibit voltage for the exemplary operation to CELL010-CELL030. The electrical stimulus for the exemplary operation is applied to CELL000 by providing the electrical stimulus for the exemplary operation to the source line SL(00), the inhibit voltage for the exemplary operation is applied to CELL010-CELL030 by applying the inhibit voltage for the exemplary operation to the source lines SL(01)-SL(03), and driving the bit line BL(0) to a voltage level for the exemplary operation. The electrical stimulus for the exemplary operation is tailored for the exemplary operation by adjusting the electrical characteristics of the electrical stimulus for the exemplary operation. For example, the electrical characteristics of the electrical stimulus can be adjusted for programming operations, read operations, set verify operations, reset verify operations, test operations, and other types of operations. Also, the inhibit voltage for the exemplary operation can be tailored for the exemplary operation. For example, the voltage level of the inhibit voltage can be adjusted for programming operations, read operations, set verify operations, reset verify operations, test operations, and other types of operations. Further, the voltage level on the bit line BL(0) can be tailored for the exemplary operation. For example, the voltage level on the bit line BL(0) can be adjusted for programming operations, read operations, set verify operations, reset verify operations, test operations, and other types of operations. The exemplary operation of CELL000 can continue by determining a resistive state of the resistive change element S000. For example, the resistive state of the resistive change element S000 can be determined by measuring a voltage indicative of the resistive state of the resistive change element S000, comparing a voltage indicative of the resistive state of the resistive change element S000 with a selected voltage, measuring a current indicative of the resistive state of the resistive change element S000, and comparing a current indicative of the resistive state of the resistive change element S000 with a selected current. Additionally, the exemplary operation can include additional steps, such as initializing to 0 volts or ground the array lines of the resistive change element array 200 before selecting a group of resistive change element cells from the plurality of groups G00-Gxy of resistive change element cells in the resistive change element array 200.

The voltage on the word line WL(0) is approximately equal to the gate voltages of the selection devices D00-Dx0, the voltages on the bit lines BL(0)-BL(x) are approximately equal to the source voltages of the selection devices D00-Dx0. The voltage on the word line WL(0) and the voltage on the bit line BL(0) are selected such that a gate to source voltage of the selection device D00 is greater than a threshold of the selection device D00 to turn on the selection device D00. The voltage on the word line WL(0) and the voltages on the bit lines BL(x) can also turn on the selection devices Dx0. It is noted that the voltage on the word line WL(0) and the voltage on the bit line BL(0) can be selected to regulate current flow through the selection device D00.

FIG. 2B shows currents I000-I03y flowing through resistive change element cells CELL000-CELL03y in groups G00-G0y during the exemplary operation of CELL000 discussed above. Resistive change element cells CELLx00-CELLx3y in groups Gx0-Gxy shown in FIG. 2A are not shown in FIG. 2B so that current flow through CELL000-CELL03y in groups G00-G0y can be shown in greater detail. Current generally does not flow through resistive change element cells CELLx00-CELLx3y in groups Gx0-Gxy because the source lines SL(x0)-SL(x3) are driven to 0 volts or ground or a high impedance state to prevent current flow and the bit lines BL(x) are driven to 0 volts or ground or a high impedance state to prevent current flow. For the exemplary operation of CELL000 discussed above, current generally does not flow through groups of resistive change element cells having groups numbers on the row other than 0 because the source lines electrically connected to the resistive change element cells in groups having group numbers on the row other than 0 are at 0 volts or ground or a high impedance state to prevent current flow and the bit lines electrically connected to the selection devices for the groups having group numbers on the row other than 0 are at 0 volts or ground or a high impedance state to prevent current flow. It is noted that the resistive change element array 200 can have leakage current less than leakage current in a resistive change element array where current flows through all resistive change element cells in the array during an operation of a resistive change element cell. It is also noted that current will flow in the direction shown in FIG. 2B for operations of CELL000, where a voltage Vstimulus of an electrical stimulus for an operation is greater than an inhibit voltage Vinhibit for the operation and the inhibit voltage Vinhibit for the operation is greater than a voltage level on the bit line BL(0). It is further noted that when a voltage Vstimulus of an electrical stimulus for an operation is less than the inhibit voltage Vinhibit for the operation, currents flowing through the resistive change element cells in the groups G01-G0y will flow in the reverse of the directions shown in FIG. 2B.

The current I000 flows through the resistive change element cell CELL000 because the source line SL(00) is driven to the voltage Vstimulus of the electrical stimulus and the bit line BL(0) is driven to a voltage level less than the inhibit voltage Vinhibit. The currents I010-I030 flow through resistive change element cells CELL010-CELL030 because the source lines SL(01)-SL(03) are driven to the inhibit voltage Vinhibit and the bit line BL(0) is driven to the voltage level less than the inhibit voltage Vinhibit. The current I000 flowing through the resistive change element S000 can be approximated using Ohm's law as $I000 = (Vstimulus - VBL(0))/R000$, where Vstimulus is the voltage of the electrical stimulus for the operation, VBL(0) is the voltage on the bit line BL(0), and R000 is the resistance of the resistive change element S000. The current I010 flowing through the resistive change element S010 can be approximated using Ohm's law as $I010 = (Vinhibit - VBL(0))/R010$, where Vinhibit is the inhibit voltage, VBL(0) is the voltage on the bit line BL(0), and R010 is the resistance of the resistive change element S010. The current I020 flowing through the resistive change element S020 can be approximated using Ohm's law as $I020 = (Vinhibit - VBL(0))/R020$, where Vinhibit is the inhibit voltage, VBL(0) is the voltage on the bit line BL(0), and R020 is the resistance of the resistive change element S020. The current 1030 flowing through the resistive change element S030 can be approximated using Ohm's law as $I030 = (Vinhibit - VBL(0))/R030$, where Vinhibit is the inhibit voltage, VBL(0) is the voltage on the bit line BL(0), and R030 is the resistance of the resistive change element S030.

The currents I001-I03y flow through the resistive change element cells CELL001-CELL03y because the first terminals of the resistive change elements S001, S00y are at the voltage Vstimulus of the electrical stimulus and the first terminals of the resistive change elements S011, S021, S031, S01y, S02y, S3y are at the inhibit voltage Vinhibit. The current I001 flowing through the resistive change element S001 can be approximated using Ohm's law as $I001 = (Vstimulus - Vinhibit)/(R001 + (R011 \times R021 \times R031)/((R021 \times R031) + (R011 \times R031) + (R011 \times R021)))$, where Vstimulus is the voltage of the electrical stimulus for the operation, Vinhibit is the inhibit voltage, R001 is the resistance of the resistive change element S001, R011 is the resistance of the resistive change element S011, R021 is the resistance of the resistive change element S021, and R031 is the resistance of the resistive change element S031. The current I00y flowing through the resistive change element S00y can be approximated using Ohm's law as $I00y = (Vstimulus - Vinhibit)/(R00y + (R01y \times R02y \times R03y)/((R02y \times R03y) + (R01y \times R03y) + (R01y \times R02y)))$, where Vstimulus is the voltage of the electrical stimulus for the operation, Vinhibit is the inhibit voltage, R00y is the resistance of the resistive change element S00y, R01y is the resistance of the resistive change element S01y, R02y is the resistance of the resistive change element S02y, and R03y is the resistance of the resistive change element S03y. It is noted that a current flows from the source line SL(00) for each group of resistive change element cells having the same group number on the row as the selected group of resistive change element cells. For example, group 00 has a group number on the row of 0, group 01 has a group number on the row of 0, and group 0y has a group number on the row of 0, thus groups 00-0y have the same group number on the row. It is further noted that the number of the word lines WL(0)-WL(y) should be small enough so that leakage currents through groups of resistive change element cells having the same group number on the row as the selected group of resistive change element cells allow a margin for operations of the resistive change element cell.

Figure 3A:
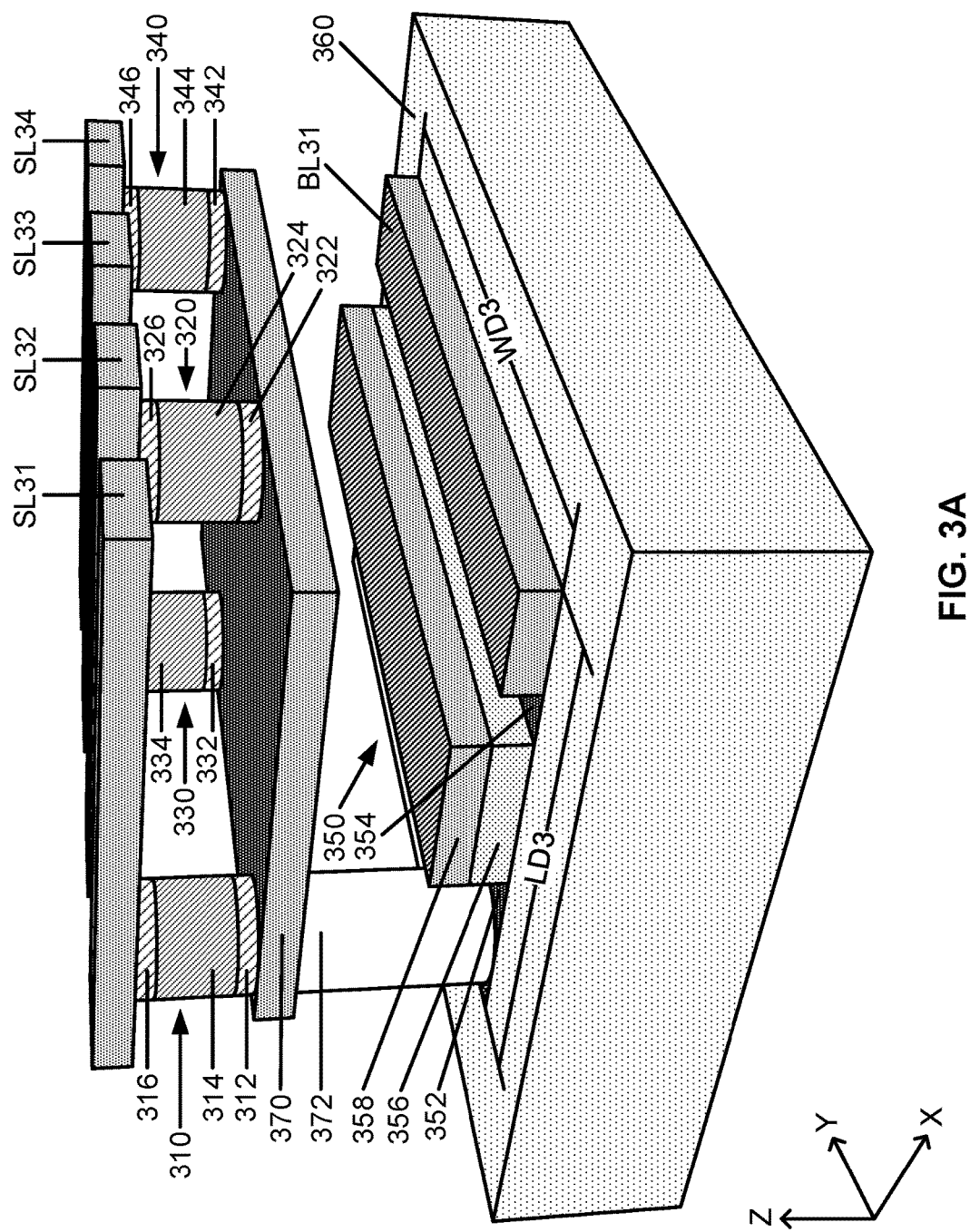
FIG. 3A illustrates a three-dimensional view of four resistive change element cells sharing a selection device, where the four resistive change element cells are arranged in a one level layout above the selection device.
Figure 3B:
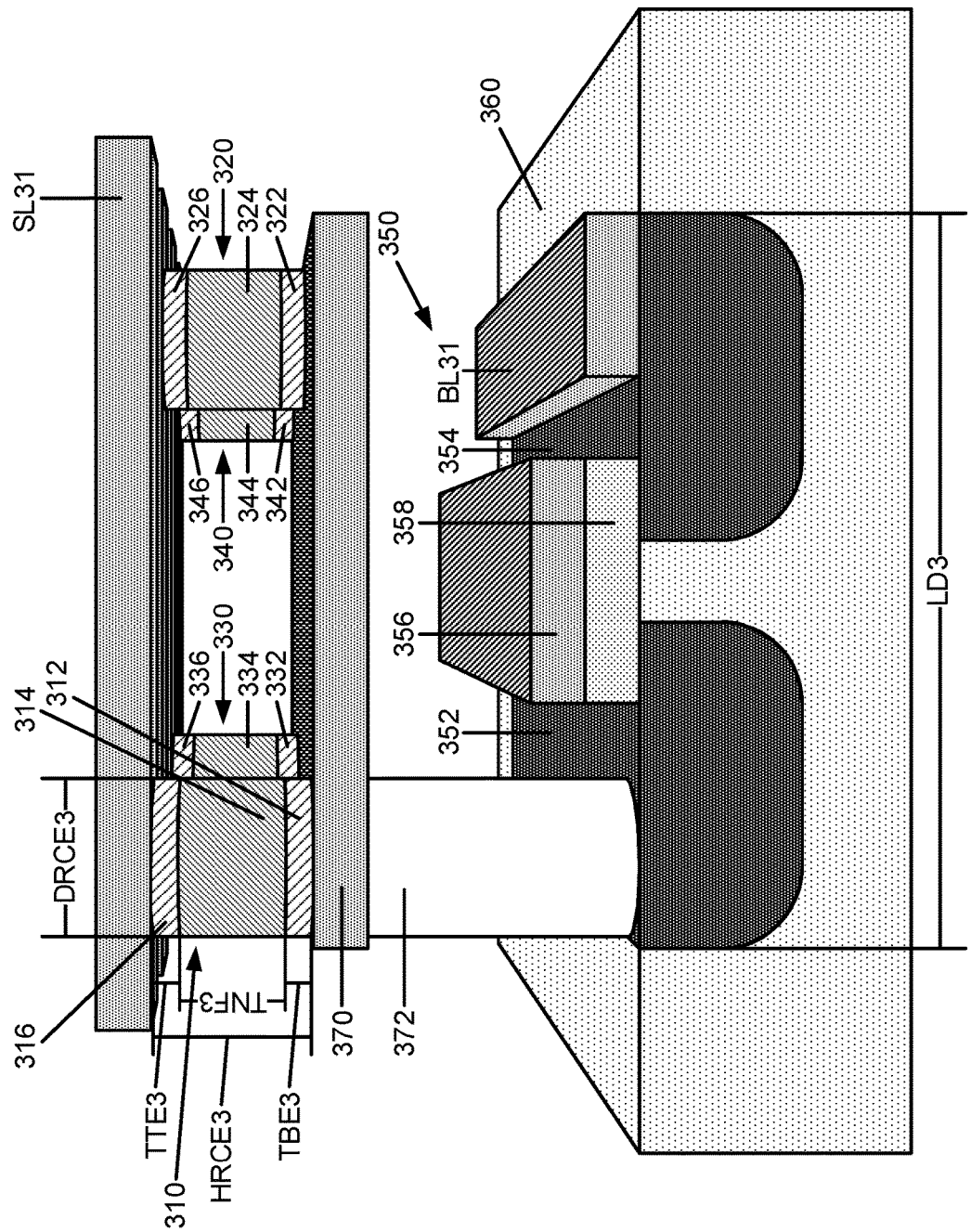
FIG. 3B illustrates a vertical cross-sectional view of the four resistive change element cells sharing a selection device of FIG. 3A.
Figure 3C:
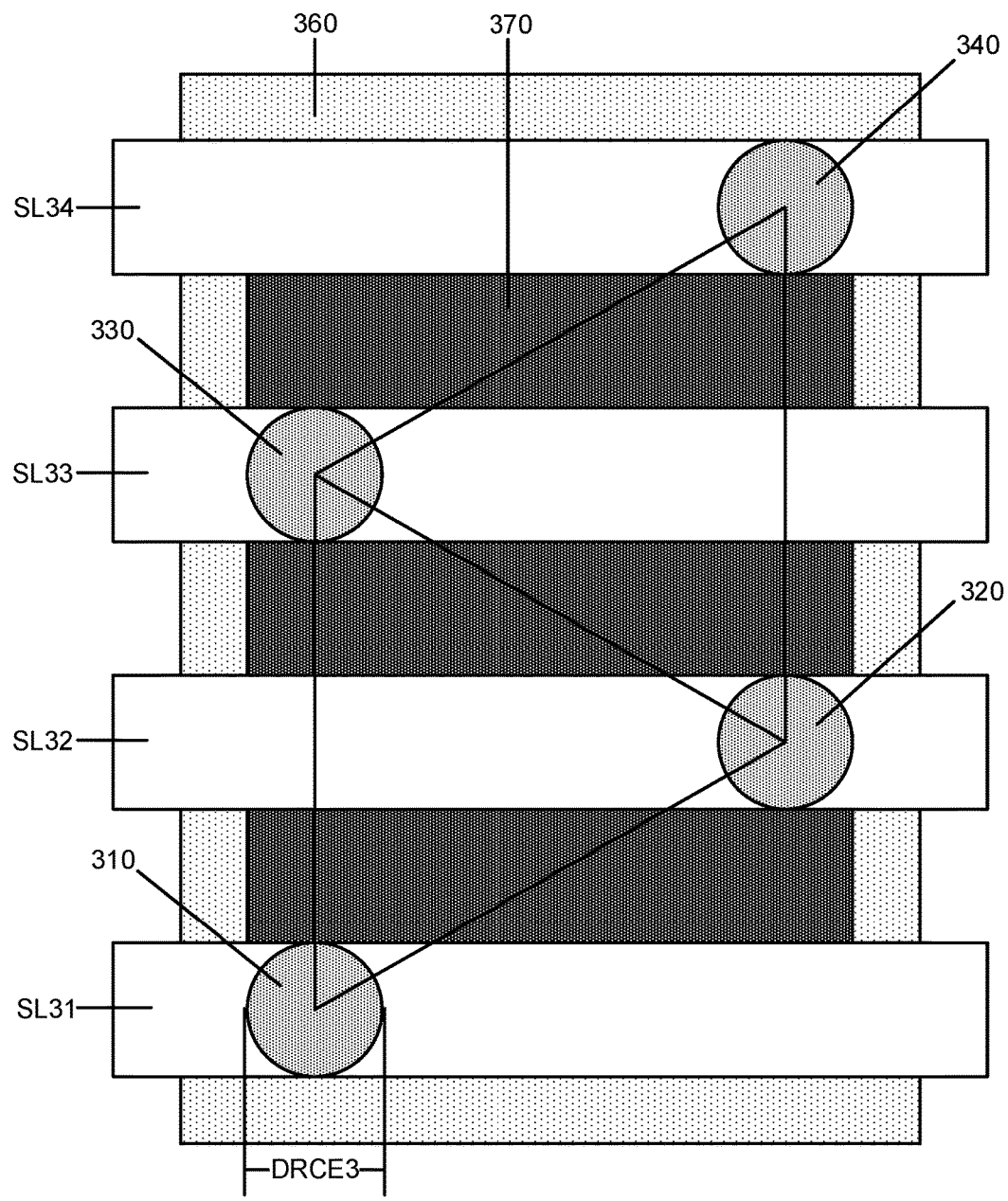
FIG. 3C illustrates a top view of the four resistive change element cells sharing a selection device of FIG. 3A.

FIG. 3A illustrates a three-dimensional view of four resistive change element cells 310, 320, 330, 340 sharing a selection device 350, where the four resistive change element cells 310, 320, 330, 340 are arranged in a one level layout above the selection device 350. FIG. 3B illustrates a vertical cross-sectional view of the four resistive change element cells 310, 320, 330, 340 sharing the selection device 350. FIG. 3C illustrates a top view of the one level layout of the resistive change element cells 310, 320, 330, 340 sharing the selection device 350.

Each resistive change element cell 310, 320, 330, 340 can be a two-terminal nanotube switching element, a phase change memory element, a metal oxide memory element, or a conductive bridge memory element as well as other materials and designs, as discussed above with respect to the resistive change elements S000-Sx3y. The selection device 350 is an NMOS transistor, as discussed above with respect to the selection devices D00-Dxy. Alternatively, the selection device 350 can be a PMOS transistor, as discussed above with respect to the selection devices D00-Dxy. Alternatively, the selection device 350 can be other types of field effect transistors, such as a carbon nanotube field effect transistor (CNTFET), a SiGE FE, a fully-depleted silicon-on-insulator FET, or a multiple gate field effect transistor such as a FinFET, as discussed above with respect to the selection devices D00-Dxy.

Each resistive change element cell 310, 320, 330, 340 includes a bottom electrode 312, 322, 332, 342, a nanotube fabric layer 314, 324, 334, 344, and a top electrode 316, 326, 336, 346. The bottom electrodes 312, 322, 332, 342 are in contact with the nanotube fabric layers 314, 324, 334, 344 and the top electrodes 316, 326, 336, 346 are in contact with the nanotube fabric layers 314, 324, 334, 344. Alternatively, the resistive change element cells 310, 320, 330, 340 can include at least one intervening layer located between the bottom electrodes 312, 322, 332, 342 and the nanotube fabric layers 314, 324, 334, 344, at least one intervening layer located between the nanotube fabric layers 314, 324, 334, 344 and the top electrodes 316, 326, 336, 346, or at least one intervening layer located between the bottom electrodes 312, 322, 332, 342 and the nanotube fabric layers 314, 324, 334, 344 and at least one intervening layer located between the nanotube fabric layers 314, 324, 334, 344 and the top electrodes 316, 326, 336, 346. Alternatively, the bottom electrodes 312, 322, 332, 342 can be omitted from the resistive change element cells 310, 320, 330, 340, the top electrodes 316, 326, 336, 346 can be omitted from the resistive change element cells 310, 320, 330, 340, or the bottom electrodes 312, 322, 332, 342 and the top electrodes 316, 326, 336, 346 can be omitted from the resistive change element cells 310, 320, 330, 340.

Each resistive change element cell 310, 320, 330, 340 has a substantially circular horizontal cross-sectional shape with a diameter $D_{RCE3}$ and a height $H_{RCE3}$. The diameter $D_{RCE3}$ is approximately equal to 1F and the height $H_{RCE3}$ is approximately equal to the sum of the thicknesses of the bottom electrode, the nanotube fabric layer, and the top electrode of that resistive change element cell. F represents a minimum feature size. The height $H_{RCE3}$ of each resistive change element cell 310, 320, 330, 340 is typically greater than 1F, however, the height $H_{RCE3}$ of each resistive change element cell 310, 320, 330, 340 can be scaled, such that the height $H_{RCE3}$ approaches 1F. Alternatively, each resistive change element cell 310, 320, 330, 340 can have a diameter $D_{RCE3}$ greater than 1F. Alternatively, each resistive change element cell 310, 320, 330, 340 can have a non-circular horizontal cross-sectional shape, such as a substantially rectangular horizontal cross-sectional shape, a substantially oval horizontal cross-sectional shape, a substantially triangular horizontal cross-sectional shape, a substantially trapezoidal horizontal cross-sectional shape, an irregular horizontal cross-sectional shape, and a non-uniform horizontal cross-sectional shape where different sections of each resistive change element cell 310, 320, 330, 340 can have different dimensions. The bottom electrodes 312, 322, 332, 342, the nanotube fabric layers 314, 324, 334, 344, and the top electrodes 316, 326, 336, 346 have substantially circular horizontal cross-sectional shapes because the resistive change element cells 310, 320, 330, 340 have substantially circular horizontal cross-sectional shapes. The bottom electrodes 312, 322, 332, 342 have a diameter approximately equal to 1F and a thickness TBE3. The nanotube fabric layers 314, 324, 334, 344 have a diameter approximately equal to 1F and a thickness TNF3. The top electrodes 316, 326, 336, 346 have a diameter approximately equal to 1F and a thickness TTE3. It is noted that the resistive change element cells 310, 320, 330, 340 can be considered to have substantially circular horizontal cross-sectional shapes when the resistive change element cells 310, 320, 330, 340 have horizontal cross-sectional shapes that are exactly circles and when the resistive change element cells 310, 320, 330, 340 have horizontal cross-sectional shapes that are not exactly circles due to variations caused by the fabrication process.

The resistive change element cells 310, 320, 330, 340 are arranged in a one level layout where three neighboring resistive change element cells form a substantially equilateral triangle. FIG. 3C shows a top view of the one level layout of the resistive change element cells 310, 320, 330, 340 with the outlines of the resistive change element cells 310, 320, 330, 340 being shown through source lines SL31-SL34 located above the resistive change element cells 310, 320, 330, 340 so that the one level layout of the resistive change element cells 310, 320, 330, 340 can be shown more clearly. As shown in FIG. 3C, an equilateral triangle having sides 4F in length can be drawn by drawing lines from the center of the resistive change element cell 310 to the center of the resistive change element cell 320, from the center of the resistive change element cell 320 to the center of the resistive change element cell 330, and from the center of resistive change element cell 330 to the center of the resistive change element cell 310 and an equilateral triangle having sides 4F in length can be drawn by drawing lines from the center of the resistive change element cell 320 to the center of the resistive change element cell 340, from the center of the resistive change element cell 340 to the center of the resistive change element cell 330, and from the center of the resistive change element cell 330 to the center of the resistive change element cell 320. Alternatively, the resistive change element cells 310, 320, 330, 340 can be arranged to form other shapes, such as polygons other than equilateral triangles, circles, ovals, and irregular shapes. Alternatively, the resistive change element cells 310, 320, 330, 340 can be arranged in patterns. It is noted that the resistive change element cells 310, 320, 330, 340 can be considered to form substantially equilateral triangles, substantially other shapes, or substantially patterns when the resistive change element cells 310, 320, 330, 340 form exact equilateral triangles, exact other shapes, or exact patterns and when the resistive change element cells 310, 320, 330, 340 form equilateral triangles, other shapes, or patterns that are not exact equilateral triangles, exact other shapes, or exact patterns due to variations caused by the fabrication process. It is further noted that the resistive change element cells are required to be separated by a distance of at least 1F.

The selection device 350 includes a drain terminal 352, a source terminal 354, a gate dielectric 356, and a gate terminal 358. The gate dielectric 356 is formed on the substrate 360 and the gate terminal 358 is formed on the gate dielectric 356. Alternatively, the gate terminal 358 can be part of an array line, such as a word line. Alternatively, the drain terminal 352, the source terminal 354, and the gate dielectric 356 can be formed on a layer of material, such as a nanotube fabric layer, deposited on the substrate 360 and the gate terminal 358 can be formed on the gate dielectric 356. The substrate 360 can be formed from a conductive material, a semiconductor material, or an insulating material as required by the needs of a specific application.

The resistive change element cells 310, 320, 330, 340 are electrically connected to the drain terminal 352 of the selection device 350 through a plate conductive structure 370 and a column conductive structure 372. The plate conductive structure 370 has a substantially rectangular horizontal cross-sectional shape that encompasses the one level layout of the resistive change element cells 310, 320, 330, 340. The plate conductive structure 370 has a width dimension of 7F and a length dimension of approximately 4.5F, these dimensions are the dimensions for the smallest rectangle that encompasses the one level layout of resistive change element cells 310, 320, 330, 340. The width dimension of the plate conductive structure 370 can be calculated by width dimension=the diameter of a resistive change element cell+minimum feature size F+the diameter of a resistive change element cell+minimum feature size F+the diameter of a resistive change element cell+minimum feature size F+the diameter of a resistive change element cell, width dimension =1F+1F+1F+1F+1F+1F+1F. The length dimension of the plate conductive structure 370 can be calculated by length dimension=height of an equilateral triangle+the radius of a resistive change element cell+the radius of a resistive change element cell, length dimension =F$\sqrt{12}$+0.5F+0.5F. It is noted that the dimensions of the plate conductive structure 370 are not limited to the dimensions for the smallest rectangle that encompasses the one level layout of the resistive change element cells 310, 320, 330, 340. Alternatively, the plate conductive structure 370 can have a horizontal cross-sectional shape that extends beyond the edges of the resistive change element cells 310, 320, 330, 340. Alternatively, the plate conductive structure 370 can have a horizontal cross-sectional shape that does not encompass the one level layout of the resistive change element cells 310, 320, 330, 340. For example, when the plate conductive structure 370 has a horizontal cross-sectional shape that does not encompass the one level layout of the resistive change element cells 310, 320, 330, 340, at least one of the resistive change element cells 310, 320, 330, 340 can extend beyond the plate conductive structure 370. Alternatively, the plate conductive structure 370 can have a non-rectangular horizontal cross-sectional shape, such as a substantially circular horizontal cross-sectional shape, a substantially oval horizontal cross-sectional shape, a substantially triangular horizontal cross-sectional shape, a substantially trapezoidal horizontal cross-sectional shape, and an irregular horizontal cross-sectional shape. It is noted that the plate conductive structure 370 can be considered to have a substantially rectangular horizontal cross-sectional shape when the plate conductive structure 370 has a horizontal cross-sectional shape that is exactly a rectangle and when the plate conductive structure 370 has a horizontal cross-sectional shape that is not exactly a rectangle due to variations caused by the fabrication process.

The column conductive structure 372 has a substantially circular horizontal cross-sectional shape. The column conductive structure 372 has a diameter approximately equal to 1F and a height greater than the sum of the thicknesses of the gate dielectric 356 and the gate terminal 358. Alternatively, the column conductive structure 372 can have a diameter greater than 1F. Alternatively, the column conductive structure 372 can have a non-circular horizontal cross-sectional shape, such as a substantially rectangular horizontal cross-sectional shape, a substantially oval horizontal cross-sectional shape, a substantially triangular horizontal cross-sectional shape, a substantially trapezoidal horizontal cross-sectional shape, an irregular horizontal cross-sectional shape, and a non-uniform horizontal cross-sectional shape where different sections of the column conductive structure 372 can have different dimensions. Alternatively, the resistive change element cells 310, 320, 330, 340 can be electrically connected to the drain terminal 352 of the selection device 350 by other conductive structures, such as a plate conductive structure and at least two column conductive structures. It is noted that the column conductive structure 372 can be considered to have a substantially circular horizontal cross-sectional shape when the column conductive structure 372 has a horizontal cross-sectional shape that is exactly a circle and when the column conductive structure 372 has a horizontal cross-sectional shape that is not exactly a circle due to variations caused by the fabrication process.

The selection device 350 occupies a substantially rectangular surface area shape of the substrate 360. The selection device 350 has a width WD3 of 7F and a length LD3 of 4.5F. Thus, the substantially rectangular surface area shape occupied by the selection device 350 generally corresponds with the substantially rectangular horizontal cross-sectional shape of the plate conductive structure 370 located above the selection device 350. For example, when the selection device 350 occupies a rectangular surface area shape with a width of 7F and a length of 4.5F and the rectangular horizontal cross-sectional shape of the plate conductive structure 370 has a width of 7F and a length of 4.5F, and F is 10 nm, the selection device 350 occupies an area of 3,150 nm$^2$ of the substrate 360 and the rectangular horizontal cross-sectional shape of the plate conductive structure 370 has an area of 3,150 nm$^2$. Alternatively, the substantially rectangular surface area shape occupied by the selection device 350 can extend beyond the substantially rectangular horizontal cross-sectional shape of the plate conductive structure 370, the substantially rectangular horizontal cross-sectional shape of the plate conductive structure 370 can extend beyond the substantially rectangular surface area shape occupied by the selection device 350, and the substantially rectangular horizontal cross-sectional shape of the plate conductive structure 370 can cover at least part of the substantially rectangular surface area shape occupied by the selection device 350. Alternatively, the selection device 350 can occupy a substantially square surface area shape, or a non-rectangular surface area shape, such as a substantially trapezoidal surface area shape and an irregular surface area shape. It is noted that the selection device 350 can be considered to occupy a substantially rectangular surface area shape of a substrate when the selection device 350 occupies a surface area shape of a substrate that is exactly a rectangle and when the selection device 350 occupies a surface area shape of a substrate that is not exactly a rectangle due to variations caused by the fabrication process.

When the resistive change element cells 310, 320, 330, 340 sharing the selection device 350 as discussed above with respect to FIGS. 3A-3C, are part of a resistive change element array including a plurality of resistive change element cells and a plurality of selection devices arranged in a group of four resistive change element cells sharing one selection device configuration where each group of four resistive change element cells sharing one selection device has the same structure as the resistive change element cells 310, 320, 330, 340 sharing the selection device 350 as discussed above with respect to FIGS. 3A-3C, a surface area shape of a substrate required for a selection device to be adjacently located to other selection devices in the resistive change element array is greater than a rectangular surface area shape occupied by a selection device and a shape required for a group of resistive change element cells to be adjacently located to other groups of resistive change element cells in the resistive change element array is greater than a smallest rectangle that encompasses a one level layout of a group of resistive change element cells. The surface area shape of a substrate required for a selection device to be adjacently located is greater than a rectangular surface area shape occupied by a selection device because the selection devices are required to be separated by at least 1F. For example, when the selection device 350 occupies a rectangular surface area shape with a width of 7F and a length of 4.5F and adjacent selection devices are separated by 1F, the surface area shape of a substrate required for a selection device to be adjacently located can be approximated by a rectangle with a width of 8F and a length of 5.5F. The shape required for a group of resistive change element cells to be adjacently located is greater than the smallest rectangle that encompasses a one level layout of a group of resistive change element cells because the resistive change element cells are required to be separated by at least 1F. For example, when the smallest rectangle that encompasses the one level layout of resistive change element cells 310, 320, 330, 340 has a width of 7F and length of 4.5F and the resistive change element cells are separated by 1F, the shape required for a group of resistive change element cells to be adjacently located can be approximated by a rectangle with a width of 8F and length of 5.5F.

When the resistive change element cells 310, 320, 330, 340 sharing the selection device 350 as discussed above with respect to FIGS. 3A-3C, are part of a resistive change element array including a plurality of resistive change element cells and a plurality of selection devices arranged in a group of four resistive change element cells sharing one selection device configuration where each group of four resistive change element cells sharing one selection device has the same structure as the resistive change element cells 310, 320, 330, 340 sharing the selection device 350 as discussed above with respect to FIGS. 3A-3C, a surface area of a substrate required for a group of resistive change element cells sharing a selection device is based on a combined shape formed by the shape required for a group of resistive change element cells to be adjacently located and the surface area shape of a substrate required for a selection device to be adjacently located. The surface area of a substrate required for a group of resistive change element cells sharing a selection device is based on the combined shape because the resistive change element cells 310, 320, 330, 340 are positioned above the selection device 350 such that an area of the substrate covered by the shape required for a group of resistive change element cells to be adjacently located covers at least part of the surface area shape of a substrate required for a selection device to be adjacently located. The combined shape has an outline defined by the part of the shape required for a group of resistive change element cells to be adjacently located that covers part of the surface area shape of a substrate required for a selection device to be adjacently located, the part of the shape required for a group of resistive change element cells to be adjacently located that does not cover the surface area shape of a substrate required for a selection device to be adjacently located, and the part of the surface area shape of a substrate required for a selection device to be adjacently located that is not covered by the shape required for a group of resistive change element cells to be adjacently located.

Alternatively, when a shape required for a group of resistive change element cells to be adjacently located encompasses a surface area shape of a substrate required for a selection device to be adjacently located and the resistive change element cells 310, 320, 330, 340 are positioned above the selection device 350 such that an area of the substrate covered by the shape required for a group of resistive change element cells to be adjacently located encompasses the surface area shape of a substrate required for a selection device to be adjacently located, a surface area of a substrate required for a group of resistive change element cells sharing a selection device is based on the shape required for a group of resistive change element cells to be adjacently located. Alternatively, when a surface area shape of a substrate required for selection devices to be adjacently located encompasses a shape required for a group of resistive change element cells to be adjacently located and the resistive change element cells 310, 320, 330, 340 are positioned above the selection device 350 such that an area of a substrate covered by the shape required for a group of resistive change element cells to be adjacently located is encompassed by the surface area shape of a substrate required for a selection device to be adjacently located, a surface area shape of a substrate required for a group of resistive change element cells sharing a selection device is based on the surface area shape of a substrate required for a selection device to be adjacently located.

Resistive change element cell density of a resistive change element array is based on a surface area of a substrate required for a resistive change element cell, and thus, resistive change element cell density in the resistive change element array including a plurality of resistive change element cells and a plurality of selection devices arranged in a group of four resistive change element cells sharing one selection device configuration where each group of four resistive change element cells sharing one selection device has the same structure as the resistive change element cells 310, 320, 330, 340 sharing the selection device 350 as discussed above with respect to FIGS. 3A-3C is based on the combined shape formed by the shape required for a group of resistive change element cells to be adjacently located and the surface area shape of a substrate required for a selection device to be adjacently located. For example, when a shape required for a group of resistive change element cells to be adjacently located can be approximated by a rectangle with a width of 8F and a length of 5.5F, a surface area shape of a substrate required for a selection device to be adjacently located can be approximated by a rectangle with a width of 8F and a length of 5.5F, the resistive change element cells 310, 320, 330, 340 are positioned above the selection device 350 such that the combined shape is a rectangle with a width of 8F and a length of 5.5F, and F is 10 nm, the resistive change element cell density is one resistive change element cell per an area of 1,100 nm$^2$ of the substrate.

In the above example, the four resistive change element cells 310, 320, 330, 340 sharing the selection device 350 have a resistive change element cell density of one resistive change element cell per an area of 1,100 nm$^2$ of the substrate and in the examples further above the resistive change element cell 110 and the resistive change element cell 111 have a resistive change element cell density of one resistive change element cell per an area of 2,200 nm$^2$ of the substrate. Thus, in these examples the resistive change element cells 310, 320, 330, 340 sharing the selection device 350 have a resistive change element cell density two times greater than a resistive change element cell density of the resistive change element cell 110 and the resistive change element cell 111.

It is noted that when a shape required for a group of resistive change element cells to be adjacently located encompasses a surface area shape of a substrate required for a selection device to be adjacently located, a circuit designer can select features of the selection device that increase the size of the selection device until the surface area shape of a substrate required for a selection device to be adjacently located is approximately equal to the shape required for a group of resistive change element cells to be adjacently located without reducing resistive change element cell density. For example, the circuit designer can select dimensions of the selection device, layouts of the selection device, and materials for fabricating the selection device that increase the size of the selection device. For example, a circuit designer can increase the channel length of the selection device so that electrical stimuli with greater voltages can be used for operations, such as programming operations, read operations, set verify operations, reset verify operations, test operations, and other types of operations without causing leakage current to flow through a channel region.

When the resistive change element cells 310, 320, 330, 340 sharing the selection device 350 as discussed above with respect to FIGS. 3A-3C, are part of a resistive change element array including a plurality of resistive change element cells and a plurality of selection devices arranged in a group of four resistive change element cells sharing one selection device configuration where each group of four resistive change element cells sharing one selection device has the same structure as the resistive change element cells 310, 320, 330, 340 sharing the selection device 350 as discussed above with respect to FIGS. 3A-3C, source lines are in electrical communication with top electrodes of resistive change element cells, word lines are in electrical communication with gate terminals of selection devices, and bit lines are in electrical communication with source terminals of selection devices. FIGS. 3A-3B show source lines SL31, SL32, SL33, SL34 in electrical communication with the top electrodes 316, 326, 336, 346 of the resistive change element cells 310, 320, 330, 340 and a bit line BL31 in electrical communication with the source terminal 354 of the selection device 350. Alternatively, the top electrodes 316, 326, 336, 346 of the resistive change element cells 310, 320, 330, 340 are in electrical communication with the source lines SL31, SL32, SL33, SL34 through conductive structures. The gate terminal 358 of the selection device 350 can be part of a word line WL31, alternatively, the gate terminal 358 can be in electrical communication with a word line WL31. Further, intervening layers, such as barrier metal layers to provide a barrier to metal migration, can be included to provide a barrier to metal migration from the source lines SL31, SL32, SL33, SL34, the bit line BL31, and/or the word line WL31. It is noted that when the resistive change element cells 310, 320, 330, 340 and the selection device 350 are part of a resistive change element array including a plurality of resistive change element cells and a plurality of selection devices arranged in a group of four resistive change element cells sharing one selection device configuration, as discussed above, the regions around the resistive change element cells 310, 320, 330, 340, the gate dielectric 356, the gate terminal 358, the plate conductive structure 370, the column conductive structure 372, the source lines SL31, SL32, SL33, SL34, the bit line BL31, and the word line WL31 can be filled with a dielectric. It is further noted that the resistive change element cells 310, 320, 330, 340 can be sealed by thin dielectric sidewall films, as described in U.S. patent application Ser. No. 15/486,032, prior to filling the regions around the resistive change elements 310, 320, 330, 340 with the dielectric.

Figure 4A:
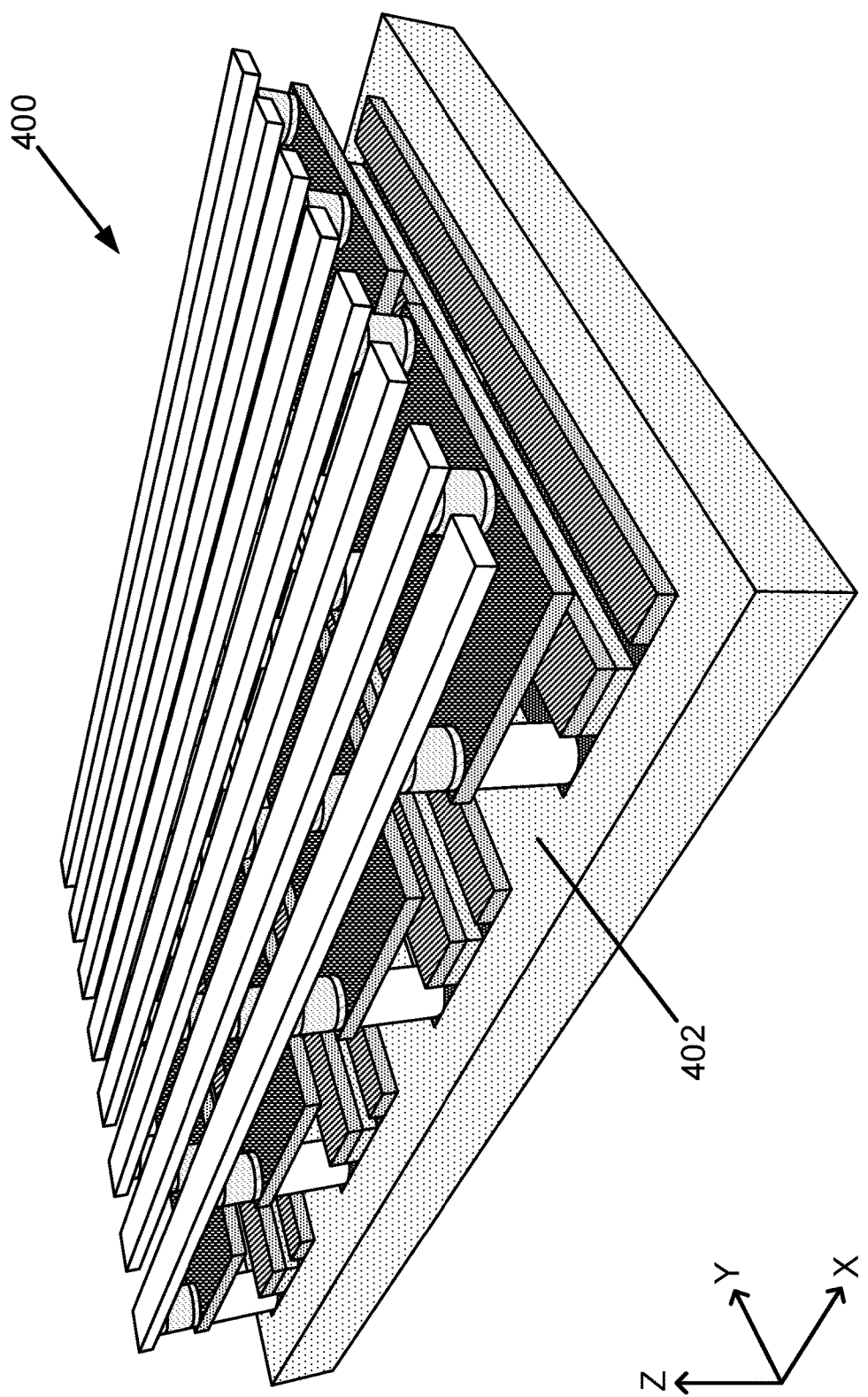
FIG. 4A illustrates a resistive change element array including a plurality of resistive change element cells and a plurality of selection devices arranged in a group of four resistive change element cells sharing one selection device configuration.

FIG. 4A illustrates a resistive change element array 400 having a plurality of resistive change element cells and a plurality of selection devices arranged in a group of four resistive change element cells sharing one selection device configuration, also referred to as a 1T4R configuration. Each group of four resistive change element cells sharing one selection device in the resistive change element array 400 has the same structure as the resistive change element cells 310, 320, 330, 340 sharing the selection device 350 as discussed above with respect to FIGS. 3A-3C. A substrate 402 can be formed from a conductive material, a semiconductor material, or an insulating material as required by the needs of a specific application. The resistive change element array 400 also includes a plurality of source lines electrically connected to top electrodes of resistive change element cells, a plurality of bit lines electrically connected to source terminals of selection devices, and a plurality of word lines with each word line including gate terminals of selection devices as part of the word line.

Figure 4B:
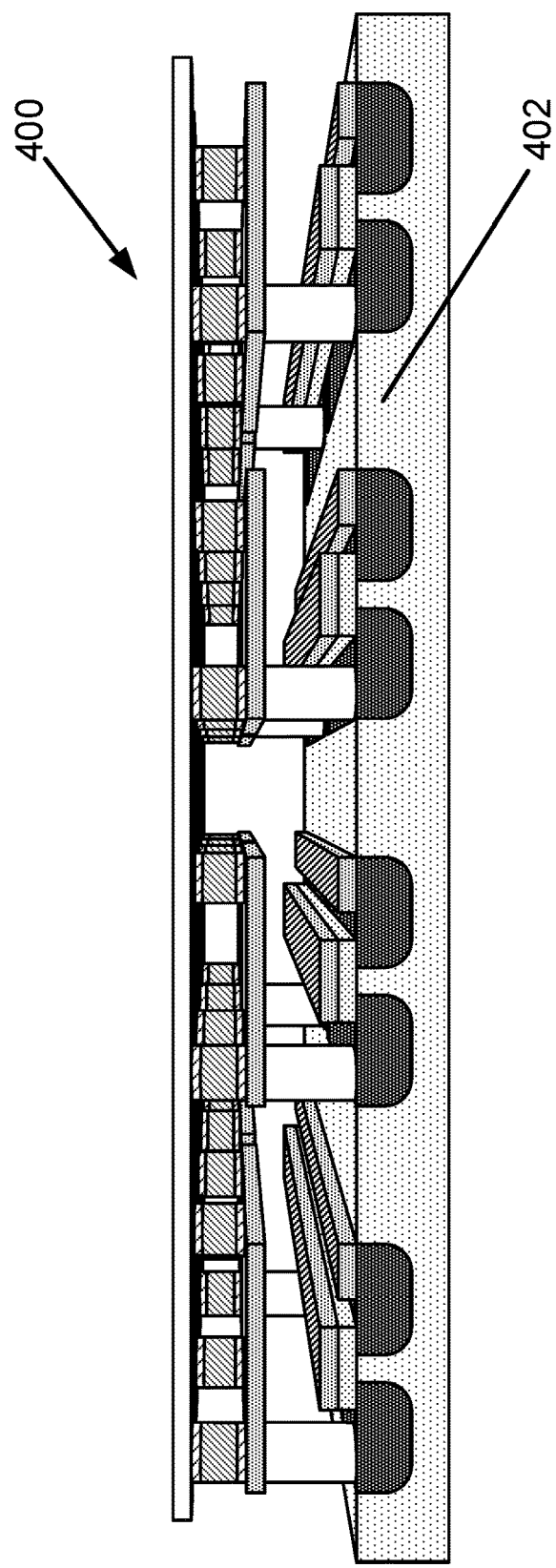
FIG. 4B illustrates a vertical cross-sectional view of the resistive change element array of FIG. 4A.
Figure 4C:
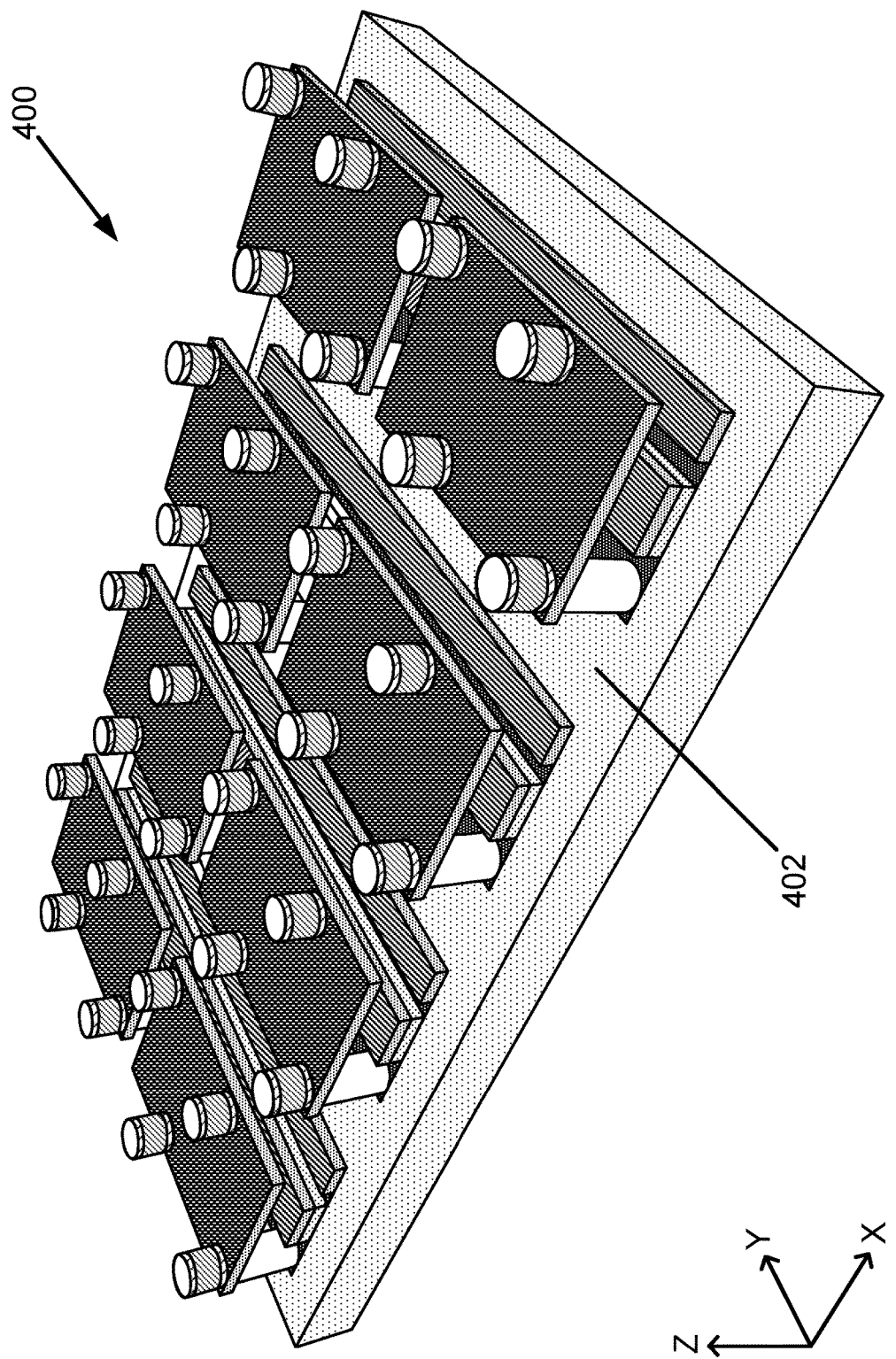
FIG. 4C illustrates a top view of the resistive change element array of FIG. 4A, where the source lines electrically connected to the top electrodes of the resistive change element cells are not shown so that the resistive change element cells can be shown in greater detail.

FIG. 4B illustrates a vertical cross-sectional view of the resistive change element array 400. FIG. 4C illustrates a top view of the resistive change element array 400 with the plurality of source lines in electrical communication with the top electrodes of the resistive change element cells not shown, so that the resistive change element cells can be shown in greater detail. It is noted that although the resistive change element array 400 is shown in FIGS. 4A-4C including thirty two resistive change element cells and eight selection devices arranged in a group of four resistive change element cells sharing one selection device configuration, the resistive change element array 400 is not limited to thirty two resistive change element cells and eight selection devices but rather the resistive change element array 400 can include a plurality of resistive change element cells and a plurality of selection devices arranged in a group of four resistive change element cells sharing one selection device configuration.

As shown in FIG. 4C, the plurality of resistive change elements cells is arranged in one level layouts where three neighboring resistive change element cells form a substantially equilateral triangle. Alternatively, the plurality of resistive change element cells can be arranged to form other shapes, such as polygons other than equilateral triangles, circles, ovals, and irregular shapes. Alternatively, the plurality of resistive change element cells can be arranged in patterns. It is noted that the plurality of resistive change element cells can be considered to form substantially equilateral triangles, substantially other shapes, or substantially patterns when the plurality of resistive change element cells form exact equilateral triangles, exact other shapes, or exact patterns and when the plurality of resistive change element cells form equilateral triangles, other shapes, or patterns that are not exact equilateral triangles, exact other shapes, or exact patterns due to variations caused by the fabrication process. It is further noted that the resistive change element cells are required to be separated by a distance of at least 1F.

Each group of four resistive change element cells is located on a plate conductive structure having a substantially rectangular horizontal cross-sectional shape that encompasses a one level layout of a group of four resistive change element cells. Each plate conductive structure has a width dimension of 7F and a length dimension of approximately 4.5F, these dimensions are the dimensions for the smallest rectangle that encompasses a one level layout of a group resistive change element cells, as discussed above with respect to resistive change element cells 310, 320, 330, 340 and the plate conductive structure 370. Each selection device occupies a substantially rectangular surface area shape of the substrate 402 with the substantially rectangular surface area shape having a width dimension of 7F and a length dimension of 4.5F, as discussed above with respect to selection device 350.

A shape required for a group of resistive change element cells to be adjacently located to other groups of resistive change element cells in the resistive change element array 400 is greater than the smallest rectangle that encompasses a one level layout of a group of resistive change element cells because groups of resistive change element cells are separated by 2.5F along the x-axis and 1F along the y-axis in order to arrange the plurality of resistive change element cells such that three neighboring resistive change element cells from at least two one level layouts form a substantially equilateral triangle having sides 4F in length. Thus, the shape required for a group of resistive change element cells to be adjacently located can be approximated by a rectangle having a width of 8F and a length of 7F. A surface area shape of a substrate required for a selection device to be adjacently located to other selection devices in the resistive change element array 400 is greater than the rectangular surface area shape occupied by a selection device because the selection devices are separated by at least 1F. Thus, the surface area shape of a substrate required for a selection device to be adjacently located can be approximated by a rectangle having a width of 8F and a length of 5.5F.

A surface area of the substrate 402 required for a group of four resistive change element cells sharing one selection device is based on the shape required for groups of resistive change element cells to be adjacently located to other groups of resistive change element cells in the resistive change element array 400. The surface area of the substrate 402 required for a group of resistive change element cells sharing one selection device is based on the shape required for a group of resistive change element cells to be adjacently located because the shape required for a group of resistive change element cells to be adjacently located is greater than the surface area shape of a substrate required for a selection device to be adjacently located and because each group of resistive change element cells is positioned above a selection device for that group such that an area of the substrate 402 covered by the shape required for a group of resistive change element cells to be adjacently located encompasses the surface area shape of a substrate required for a selected device to be adjacently located.

Resistive change element cell density of the resistive change element array 400 is based on a surface area shape of the substrate 402 required for a group of four resistive change element cells sharing a selection device. Thus, the resistive change element cell density of the resistive change element array 400 is based on the shape required for a group of resistive change element cells to be adjacently located to other groups of resistive change element cells in the resistive change element array 400. For example, when a shape required for a group of resistive change element cells to be adjacently located can be approximated by a rectangle having a width of 8F and a length of 7F and F is 10 nm, the resistive change element cell density is one resistive change element cell per an area of 1,400 nm$^2$ of the substrate.

In the above example, the resistive change element array 400 has a resistive change element cell density of one resistive change element cell per an area of 1,400 nm$^2$ of the substrate and in the examples further the resistive change element cell 110 and the resistive change element cell 111 have a resistive change element cell density of one resistive change element cell per an area of 2,200 nm$^2$ of the substrate. Thus, in these examples the resistive change element array 400 have a resistive change element cell density approximately 1.57 times greater than a resistive change element cell density of the resistive change element cell 110 and the resistive change element cell 111.

Resistive change element cell densities in resistive change element arrays having a plurality of resistive change element cells and a plurality of selection devices arranged in a group of at least two resistive change element cells sharing one selection device configuration can be increased by stacking resistive change element cells in multiple levels above a selection device, scaling the resistive change element cells so that a greater number of resistive change element cell can be located above a selection device, scaling selection devices to reduce a surface area shape required for a selection device to be adjacently located to other selection devices, and/or selecting a layout for resistive change element cells that is more dense. For example, a resistive change element array including a plurality of resistive change element cells and a plurality of selection devices arranged in a group of eight resistive change element cells sharing one selection device configuration, also referred to as a 1T8R configuration, can have a two level layout with four resistive change element cells on a first level above a selection device and four resistive change element cells on a second level above the first level in order to increase a resistive change element cell density.

Figure 5A:
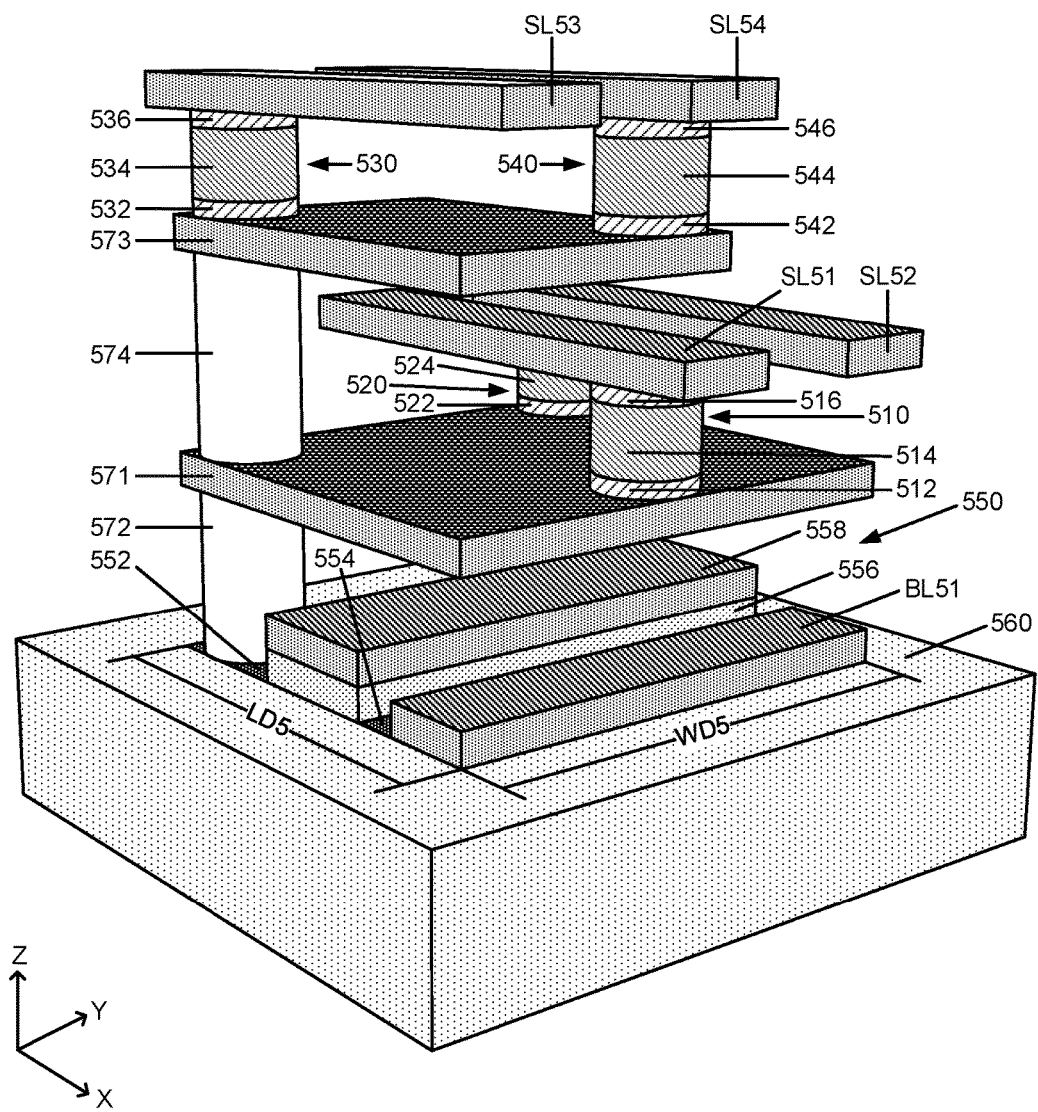
FIG. 5A illustrates a three-dimensional view of four resistive change element cells sharing a selection device, where the four resistive change element cells are arranged in a two level layout above the selection device.
Figure 5B:
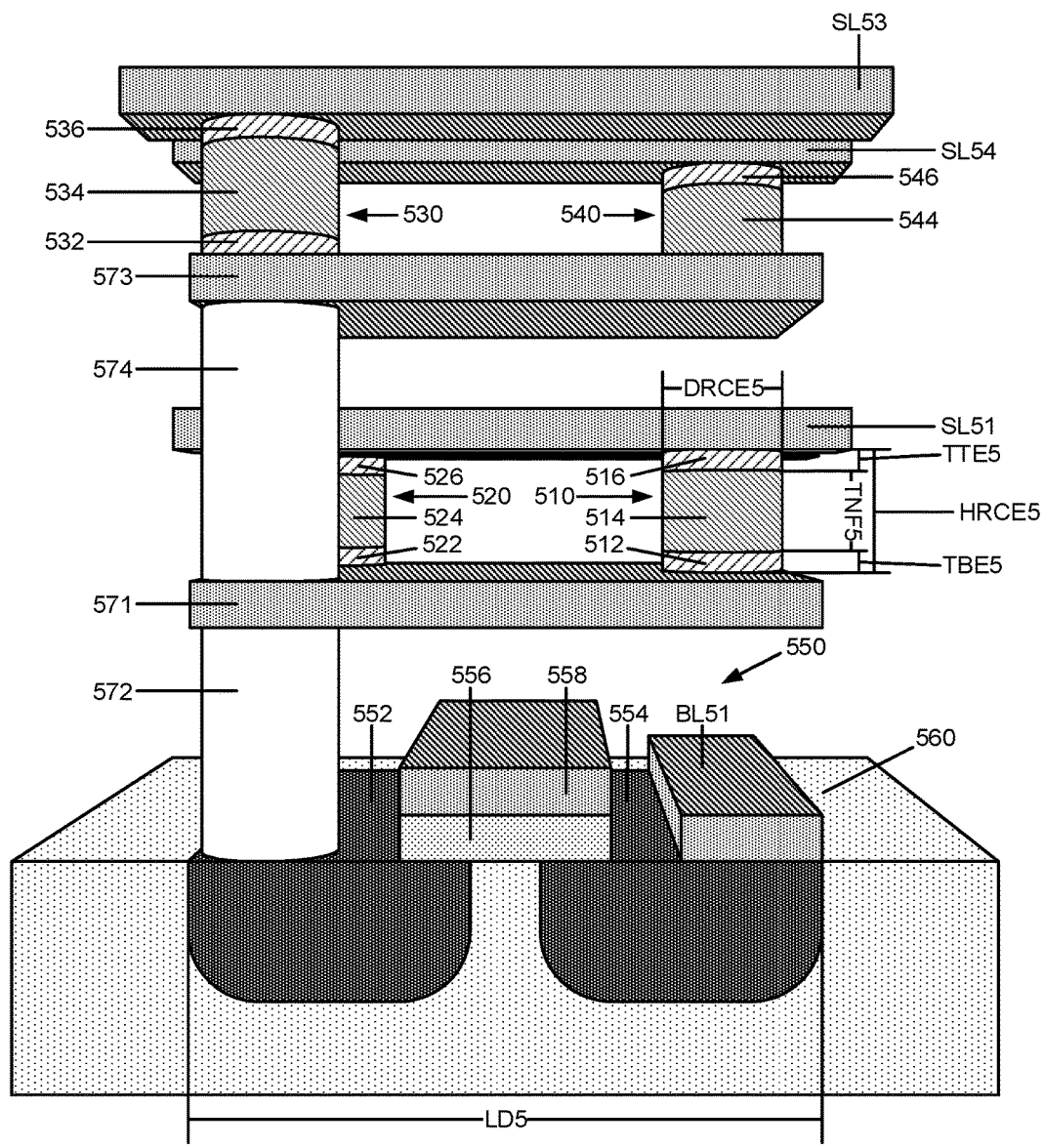
FIG. 5B illustrates a vertical cross-sectional view of the four resistive change element cells sharing a selection device of FIG. 5A.

FIG. 5A illustrates a three-dimensional view of four resistive change element cells 510, 520, 530, 540 sharing a selection device 550, where the four resistive change element cells 510, 520, 530, 540 are arranged in a two level layout above the selection device 550. FIG. 5B illustrates a vertical cross-sectional view of the four resistive change element cells 510, 520, 530, 540 sharing the selection device 550.

Each resistive change element cell 510, 520, 530, 540 can be a two-terminal nanotube switching element, a phase change memory element, a metal oxide memory element, or a conductive bridge memory element as well as other materials and designs, as discussed above with respect to the resistive change elements S000-Sx3y. The selection device 550 is an NMOS transistor, as discussed above with respect to the selection devices D00-Dxy. Alternatively, the selection device 550 can be a PMOS transistor, as discussed above with respect to the selection devices D00-Dxy. Alternatively, the selection device 550 can be other types of field effect transistors, such as a carbon nanotube field effect transistor (CNTFET), a SiGE FET, a fully-depleted silicon-on-insulator FET, or a multiple gate field effect transistor such as FinFET, as discussed above with respect to the selection devices D00-Dxy.

Each resistive change element cell 510, 520, 530, 540 includes a bottom electrode 512, 522, 532, 542, a nanotube fabric layer 514, 524, 534, 544, and a top electrode 516, 526, 536, 546. The bottom electrodes 512, 522, 532, 542 are in contact with the nanotube fabric layers 514, 524, 534, 544 and the top electrodes 516, 526, 536, 546 are in contact with the nanotube fabric layers 514, 524, 534, 544. Alternatively, the resistive change element cells 510, 520, 530, 540 can include at least one intervening layer located between the bottom electrodes 512, 522, 532, 542 and the nanotube fabric layers 514, 524, 534, 544, at least one intervening layer located between the nanotube fabric layers 514, 524, 534, 544 and the top electrodes 516, 526, 536, 546, or at least one intervening layer located between the bottom electrodes 512, 522, 532, 542 and the nanotube fabric layers 514, 524, 534, 544 and at least one intervening layer located between the nanotube fabric layers 514, 524, 534, 544 and the top electrodes 516, 526, 536, 546. Alternatively, the bottom electrodes 512, 522, 532, 542 can be omitted from the resistive change element cells 510, 520, 530, 540, the top electrodes 516, 526, 536, 546 can be omitted from the resistive change element cells 510, 520, 530, 540, or the bottom electrodes 512, 522, 532, 542 and the top electrodes 516, 526, 536, 546 can be omitted from the resistive change element cells 510, 520, 530, 540.

Each resistive change element cell 510, 520, 530, 540 has a substantially circular horizontal cross-sectional shape with a diameter $D_{RCE5}$ and a height $H_{RCE5}$. The diameter $D_{RCE5}$ is approximately equal to 1F and the height $H_{RCE5}$ is approximately equal to the sum of the thicknesses of the bottom electrode, the nanotube fabric layer, and the top electrode of that resistive change element cell. F represents a minimum feature size. The height $H_{RCE5}$ of each resistive change element cell 510, 520, 530, 540 is typically greater than 1F, however, the height $H_{RCE5}$ of each resistive change element cell 510, 520, 530, 540 can be scaled, such that the height $H_{RCE5}$ approaches 1F. Alternatively, each resistive change element cell 510, 520, 530, 540 can have a diameter $D_{RCE5}$ greater than 1F. Alternatively, each resistive change element cell 510, 520, 530, 540 can have a non-circular horizontal cross-sectional shape, such as a substantially rectangular horizontal cross-sectional shape, a substantially oval horizontal cross-sectional shape, a substantially triangular horizontal cross-sectional shape, a substantially trapezoidal horizontal cross-sectional shape, an irregular horizontal cross-sectional shape, and a non-uniform horizontal cross-sectional shape where different sections of each resistive change element cell 510, 520, 530, 540 can have different dimensions. The bottom electrodes 512, 522, 532, 542, the nanotube fabric layers 514, 524, 534, 544, and the top electrodes 516, 526, 536, 546 have substantially circular horizontal cross-sectional shapes because the resistive change element cells 510, 520, 530, 540 have substantially circular horizontal cross-sectional shapes. The bottom electrodes 512, 522, 532, 542 have a diameter approximately equal to 1F and a thickness TBE5. The nanotube fabric layers 514, 524, 534, 544 have a diameter approximately equal to 1F and a thickness TNF5. The top electrodes 516, 526, 536, 546 have a diameter approximately equal to 1F and a thickness TTE5. It is noted that the resistive change element cells 510, 520, 530, 540 can be considered to have substantially circular horizontal cross-sectional shapes when the resistive change element cells 510, 520, 530, 540 have horizontal cross-sectional shapes that are exactly circles and when the resistive change element cells 510, 520, 530, 540 have horizontal cross-sectional shapes that are not exactly circles due to variations caused by the fabrication process.

The resistive change element cells 510, 520, 530, 540 are arranged in a two level layout with the resistive change element cells 510, 520 and a second column conductive structure 574 on a first level and the resistive change element cells 530, 540 on a second level. The resistive change element cells 510, 520 and the second column conductive structure are arranged on the first level such that the resistive change element cells 510, 520 and the second column conductive structure 574 form a substantially equilateral triangle. The resistive change element cells 530, 540 are arranged on the second level such that the resistive change element cells 530, 540 would form a substantially equilateral triangle with a resistive change element cell placed on the second level above resistive change element cell 520. An equilateral triangle having sides 4F in length can be drawn by drawing lines from the center of the second column conductive structure 574 to the center of resistive change element cell 510, from the center of resistive change element cell 510 to the center of the resistive change element cell 520, and from the center of resistive change element cell 520 to the center of the second column conductive structure 574 and an equilateral triangle having sides 4F in length can be drawn by drawing lines from the center of the resistive change element cell 530 to the center of the resistive change element cell 540, from the center of the resistive change element cell 540 to the center of a resistive change element cell placed on the second level above the resistive change element cell 520, and from the center of a resistive change element cell placed on the second level above the resistive change element cell 520 to the center of the resistive change element cell 530. Alternatively, the resistive change element cells 510, 520, 530, 540 and the second column conductive structure 574 can be arranged to form other shapes, such as polygons other than equilateral triangles, circles, ovals, and irregular shapes. Alternatively, the resistive change element cells 510, 520, 530, 540 and the second column conductive structure 574 can be arranged in patterns. It is noted that the resistive change element cells 510, 520, 530, 540 and the second column conductive structure 574 can be considered to form substantially equilateral triangles, substantially other shapes, or substantially patterns when the resistive change element cells 510, 520, 530, 540 and the second column conductive structure 574 form exact equilateral triangles, exact other shapes, or exact patterns and when the resistive change element cells 510, 520, 530, 540 and the second column conductive structure 574 form equilateral triangle, other shapes, or patterns that are not exact equilateral triangles, exact other shapes, or exact patterns due to variations caused by the fabrication process. It is also noted that resistive change element cells and the column conductive structures on different level can be arranged in different shapes and/or patterns. It is further noted that the resistive change element cells and the column conductive structures are required to be separated by a distance of at least 1F.

The selection device 550 includes a drain terminal 552, a source terminal 554, a gate dielectric 556, and a gate terminal 558. The gate dielectric 556 is formed on the substrate 560 and the gate terminal 558 is formed on the gate dielectric 556. Alternatively, the gate terminal 558 can be part of an array line, such as a word line. Alternatively, the drain terminal 552, the source terminal 554, and the gate dielectric 556 can be formed on a layer of material, such as a nanotube fabric layer, deposited on the substrate 560 and the gate terminal 558 can be formed on the gate dielectric 556. The substrate 560 can be formed from a conductive material, a semiconductor material, or an insulating material as required by the needs of a specific application.

The resistive change element cells 510, 520 are electrically connected to the drain terminal 552 of the selection device 550 through a first plate conductive structure 571 and a first column conductive structure 572. The first plate conductive structure 571 has a substantially rectangular horizontal cross-sectional shape that encompasses the resistive change element cells 510, 520 and the second column conductive structure 574 on the first level. The first plate conductive structure 571 has a width dimension of 5F and a length dimension of approximately 4.5F, these dimensions are the dimensions for the smallest rectangle that encompasses the resistive change element cells 510, 520, and the second column conductive structure 574 on the first level. The width dimension of the first plate conductive structure 571 can be calculated by width dimension=the diameter of the column conductive structure 571+minimum feature size F+the diameter of a resistive change element cell+minimum feature size F+the diameter of a resistive change element cell, width dimension=1F+1F+1F+1F+1F. The length dimension of the first plate conductive structure 571 can be calculated by length dimension=height of the equilateral triangle+the radius of a resistive change element cell+the radius of a resistive change element cell, length dimension =F$\sqrt{12}$+0.5F+0.5F. It is noted that the dimensions of the first plate conductive structure 571 are not limited to the minimum dimensions for the smallest rectangle that encompasses the resistive change element cells 510, 520 and the second column conductive structure 574 on the first level. Alternatively, the first plate conductive structure 571 can have a horizontal cross-sectional shape that extends beyond the edges of the resistive change elements 510, 520 and the second column conductive structure 574 on the first level. Alternatively, the first plate conductive structure 571 can have a horizontal cross-sectional shape that does not encompass of the resistive change element cells 510, 520 and the second column conductive structure 574 on the first level. For example, when the first plate conductive structure 571 has a horizontal cross-sectional shape that does not encompass the resistive change element cells 510, 520 and the second column conductive structure 574 on the first level, at least one of the resistive change element cells 510, 520 and the second column conductive structure 574 can extend beyond the first plate conductive structure 571. Alternatively, the first plate conductive structure 571 can have a non-rectangular horizontal cross-sectional shape, such as a substantially circular horizontal cross-sectional shape, a substantially oval horizontal cross-sectional shape, a substantially triangular horizontal cross-sectional shape, a substantially trapezoidal horizontal cross-sectional shape, and an irregular horizontal cross-sectional shape. It is noted that the first plate conductive structure 571 can be considered to have a substantially rectangular horizontal cross-sectional shape when the first plate conductive structure 571 has a horizontal cross-sectional shape that is exactly a rectangle and when the first plate conductive structure 571 has a horizontal cross-sectional shape that is not exactly a rectangle due to variations caused by the fabrication process.

The resistive change element cells 530, 540 are electrically connected to the drain terminal 552 of the selection device 550 through a second plate conductive structure 573, the second column conductive structure 574, the first plate conductive structure 571, and the first column conductive structure 572. The second plate conductive structure 573 has a substantially rectangular horizontal cross-sectional shape that encompasses the resistive change element cells 530, 540 on the second level. The second plate conductive structure 573 has a width dimension of 3F and a length dimension of approximately 4.5F, these dimensions are the dimensions for the smallest rectangle that encompasses the resistive change element cells 530, 540 on the second level. The width dimension of the second plate conductive structure 573 can be calculated by width dimension=the diameter of a resistive change element cell+minimum feature size F+the diameter of a resistive change element cell=1F+1F+1F. The length dimension of the second plate conductive structure 573 can be calculated by length dimension=height of the equilateral triangle+the radius of a resistive change element cell+the radius of a resistive change element cell, length dimension =F$\sqrt{12}$+0.5F+0.5F. It is noted that the dimensions of the second plate conductive structure 573 are not limited to the dimensions for the smallest rectangle that encompasses the resistive change element cells 530, 540 on the second level. Alternatively, the second plate conductive structure 573 can have a horizontal cross-sectional shape that extends beyond the edges of the resistive change element cells 530, 540 on the second level. Alternatively, the second plate conductive structure 573 can have a horizontal cross-sectional shape that does not encompasses the resistive change element cell 530, 540 on the second level. For example, when the second plate conductive structure 573 has a horizontal cross-sectional shape that does not encompass the resistive change element cells 530, 540 on the second level, at least one of the resistive change element cells 530, 540 can extend beyond the second plate conductive structure 573. Alternatively, the second plate conductive structure 573 can have a non-rectangular horizontal cross-sectional shape, such as a substantially circular horizontal cross-sectional shape, a substantially oval horizontal cross-sectional shape, a substantially triangular horizontal cross-sectional shape, a substantially trapezoidal horizontal cross-sectional shape, and an irregular horizontal cross-sectional shape. It is noted that the second plate conductive structure 573 can be considered to have a substantially rectangular horizontal cross-sectional shape when the second plate conductive structure 573 has a horizontal cross-sectional shape that is exactly a rectangle and when the second plate conductive structure 573 has a horizontal cross-sectional shape that is not exactly a rectangle due to variations caused by the fabrication process.

Each of the first column conductive structure 572 and the second column conductive structure 574 has a substantially circular horizontal cross-sectional shape. The first column conductive structure 572 has a diameter approximately equal to 1F and a height greater than the sum of the thicknesses of the gate dielectric 556 and the gate terminal 558. Alternatively, the first column conductive structure 572 can have diameter greater than 1F. The second column conductive structure 574 has a diameter approximately equal to 1F and a height greater than the sum of the height of one of the resistive change element cells 510, 520 and an array line, such as a source line. Alternatively, the second column conductive structure 574 can have a diameter greater than 1F. Alternatively, each of the first column conductive structure 572 and the second column conductive structure 574 can have a non-circular horizontal cross-sectional shape, such as a substantially rectangular horizontal cross-sectional shape, a substantially oval horizontal cross-sectional shape, a substantially triangular horizontal cross-sectional shape, a substantially trapezoidal horizontal cross-sectional shape, an irregular horizontal cross-sectional shape, and a non-uniform horizontal cross-sectional shape where different sections of the column conductive structures 572, 574 can have different dimensions. Alternatively, the resistive change element cells 510, 520, can be electrically connected to the drain terminal 552 of the selection device 550 by other conductive structures, such as a plate conductive structure and at least two column conductive structures, and the resistive change element cells 530, 540, can be electrically connected to the drain terminal 552 of the selection device 550 by other conductive structures, such as at least two plate conductive structures and at least three column conductive structures. It is noted that the first column conductive structure 572 and the second column conductive structure 574 can have different horizontal cross-sectional shapes. It is also noted that the first column conductive structure 572 can be considered to have a substantially circular horizontal cross-sectional shape when the first column conductive structure 572 has a horizontal cross-sectional shape that is exactly a circle and when the first column conductive structure 572 has a horizontal cross-sectional shape that is not exactly a circle due to variations caused by the fabrication process. It is also noted that the second column conductive structure 574 can be considered to have a substantially circular horizontal cross-sectional shape when the second column conductive structure 574 has a horizontal cross-sectional shape that is exactly a circle and when the second column conductive structure 574 has a horizontal cross-sectional shape that is not exactly a circle due to variations caused by the fabrication process.

The selection device 550 occupies a substantially rectangular surface area shape of the substrate 560. The selection device 550 has a width WD5 of 5F and a length LDS of 4.5F. Thus, the substantially rectangular surface area shape occupied by the selection device 550 generally corresponds with the substantially rectangular horizontal cross-sectional shape of the first plate conductive structure 571 located above the selection device 550. For example, when the selection device 550 occupies a rectangular surface area shape with a width of 5F and a length of 4.5F, the rectangular horizontal cross-sectional shape of the first plate conductive structure 571 has a width dimension of 5F and a length dimension of 4.5F, and F is 10 nm, the selection device 550 occupies an area of 2,250 nm² of the substrate 560 and the rectangular horizontal cross-section shape of the first plate conductive structure 571 has an area of 2,250 nm². Alternatively, the substantially rectangular surface area shape occupied by the selection device 550 can extend beyond the substantially rectangular horizontal cross-sectional shape of the first plate conductive structure 571, the substantially rectangular horizontal cross-sectional shape of the first plate conductive structure 571 can extend beyond the substantially rectangular surface area shape occupied by the selection device 550, and the substantially rectangular horizontal cross-sectional shape of the first plate conductive structure 571 can cover at least part of the substantially rectangular surface area shape occupied by the selection device 550. Alternatively, the selection device 550 can occupy a substantially square surface area shape, or a non-rectangular surface area shape, such as a substantially trapezoidal surface area shape and an irregular surface area shape. It is noted that the selection device 550 can be considered to occupy a substantially rectangular surface area shape of a substrate when the selection device 550 occupies a surface area shape of a substrate that is exactly a rectangle and when the selection device 550 occupies a surface area shape of a substrate that is not exactly a rectangle due to variations caused by the fabrication process.

When the resistive change element cells 510, 520, 530, 540 sharing the selection device 550 as discussed above with respect to FIGS. 5A-5B, are part of a resistive change element array including a plurality of resistive change element cells and a plurality of selection devices arranged in a group of four resistive change element cells sharing one selection device configuration where each group of four resistive change element cells sharing one selection device has the same structure as the resistive change element cells 510, 520, 530, 540 sharing the selection device 550 as discussed above with respect to FIGS. 5A-5B, a surface area shape of a substrate required for a selection device to be adjacently located to other selection devices in the resistive change element array is greater than a rectangular surface area shape occupied by a selection device and a shape required for a group of resistive change element cells to be adjacently located to other groups of resistive change element cells in the resistive change element array is greater than a combined shape that encompasses a two level layout of a group of resistive change element cells. The surface area shape of a substrate required for a selection device to be adjacently located is greater than the rectangular surface area shape occupied by a selection device because the selection devices are required to be separated by at least 1F. For example, when the selection device 550 occupies a rectangular surface area shape with a width of 5F and a length of 4.5F and adjacent selection devices are separated by 1F, the surface area shape of a substrate required for a selection device to be adjacently located can be approximated by a rectangle with a width of 6F and a length of 5.5F.

The combined shape that encompasses a two level layout of a group of resistive change element cells is formed by the smallest rectangle that encompasses the first level and the smallest rectangle that encompasses the second level because the smallest rectangle that encompasses the second level covers at least part of the smallest rectangle that encompasses the first level. The combined shape that encompasses a two level layout of a group of resistive change element cells has an outline defined by the part of the smallest rectangle that encompasses the second level that covers part of the smallest rectangle that encompasses the first level, the part of the smallest rectangle the encompasses the second level that does not cover the smallest rectangle that encompasses the first level, and the part of the smallest rectangle that encompasses the first level that is not covered by the smallest rectangle that encompasses the second level. As discussed above, the first plate conductive structure 571 has a horizontal cross-sectional shape that corresponds with the smallest rectangle that encompasses the first level, the second plate conductive structure 573 has a horizontal cross-section shape that corresponds with the smallest rectangle that encompasses the second level. For example, when the first plate conductive structure 571 and the second plate conductive structure 573 are arranged so that a combined shape that encompasses a two level layout of a group of resistive change element cells corresponds with the horizontal cross-sectional shape of the first plate conductive structure 571, the combined shape that encompasses a two level layout of a group of resistive change element cells can be approximated by a rectangle having a width of 5F and a length of 4.5F.

The shape required for a group of resistive change element cells to be adjacently located is greater than the combined shape that encompasses a two level layout of a group of resistive change element cells because the resistive change element cells and the column conductive structures are required to be separated by at least 1F. For example, when the combined shape that encompasses a two level layout of a group of resistive change element cells has a width of 5F and length of 4.5F and the resistive change element cells and the column conductive structures separated by 1F, the shape required for a group of resistive change element cells to be adjacently located can be approximated by a rectangle with a width of 6F and a length of 5.5F.

When the resistive change element cells 510, 520, 530, 540 sharing the selection device 550 as discussed above with respect to FIGS. 5A-5B, are part of a resistive change element array including a plurality of resistive change element cells and a plurality of selection devices arranged in a group of four resistive change element cells sharing one selection device configuration where each group of four resistive change element cells sharing one selection device has the same structure as the resistive change element cells 510, 520, 530, 540 sharing the selection device 550 as discussed above with respect to FIGS. 5A-5B, a surface area of a substrate required for a group of resistive change element cells sharing a selection device is based on a combined shape formed by the shape required for a group of resistive change element cells to be adjacently located and the surface area shape of a substrate required for a selection device to be adjacently located. The surface area of a substrate required for a group of resistive change element cells sharing a selection device is based on the combined shape because the resistive change element cells 510, 520, 530, 540 are positioned above the selection device 550 such that an area of the substrate covered by the shape required for a group of resistive change element cells to be adjacently located covers at least part of the surface area shape of a substrate required for a selection device to be adjacently located. The combined shape has an outline defined by the part of the shape required for a group of resistive change element cells to be adjacently located that covers part of the surface area shape of a substrate required for a selection device to be adjacently located, the part of the shape required for a group of resistive change element cells to be adjacently located that does not cover the surface area shape of a substrate required for a selection device to be adjacently located, and the part of the surface area shape of a substrate required for a selection device to be adjacently located that is not covered by the shape required for a group of resistive change element cells to be adjacently located.

Alternatively, when a shape required for a group of resistive change element cells to be adjacently located encompasses a surface area shape of a substrate required for a selection device to be adjacently located and the resistive change element cells 510, 520, 530, 540 are positioned above the selection device 550 such that an area of the substrate covered by the shape required for a group of resistive change element cells to be adjacently located encompasses the surface area shape of a substrate required for a selection device to be adjacently located, a surface area of the substrate required for a group of resistive change element cells sharing a selection device is based on the shape required for a group of resistive change element cells to be adjacently located. Alternatively, when a surface area shape of a substrate required for a selection devices to be adjacently located encompasses a shape required for a group of resistive change element cells to be adjacently located and the resistive change element cells 510, 520, 530, 540 are positioned above the selection device 550 such that an area of the substrate covered by the shape required for a group of resistive change element cells to be adjacently located is encompassed by the surface area shape of a substrate required for a selection device to be adjacently located, a surface area shape of a substrate required for a group of resistive change element cells sharing a selection device is based on the surface area shape of a substrate required for a selection device to be adjacently located.

Resistive change element cell density of a resistive change element array is based on a surface area of a substrate required for a resistive change element cell, and thus, resistive change element cell density in the resistive change element array including a plurality of resistive change element cells and a plurality of selection devices arranged in a group of four resistive change element cells sharing one selection device configuration where each group of four resistive change element cells sharing one selection device in the resistive change element array has the same structure as the resistive change element cells 510, 520, 530, 540 sharing the selection device 550 as discussed above with respect to FIGS. 5A-5B is based on the combined shape formed by the shape required for a group of resistive change element cells to be adjacently located and the surface area shape of a substrate required for a selection device to be adjacently located. For example, when a shape required for a group of resistive change element cells to be adjacently located can be approximated by a rectangle with a width of 6F and a length of 5.5F, a surface area shape of a substrate required for a selection device to be adjacently located can be approximated by a rectangle with a width of 6F and a length of 5.5F, the resistive change element cells 510, 520, 530, 540 are positioned above the selection device 550 such that the combined shape is a rectangle with a width of 6F and a length of 5.5F, and F is 10 nm, the resistive change element cell density is one resistive change element cell per an area of 825 $nm^2$ of the substrate.

In the above example, the four resistive change element cells 510, 520, 530, 540 sharing the selection device 550 have a resistive change element cell density of one resistive change element cell per an area of 825 $nm^2$ of the substrate and in the examples further above the resistive change element cell 110 and the resistive change element cell 111 have a resistive change element cell density of one resistive change element cell per an area of 2,200 $nm^2$ of area of the substrate. Thus, in these examples the resistive change element cells 510, 520, 530, 540 sharing the selection device 550 have a resistive change element cell density approximately 2.67 times greater than a resistive change element cell density of the resistive change element cell 110 and the resistive change element cell 111.

When the resistive change element cells 510, 520, 530, 540 sharing the selection device 550 as discussed above with respect to FIGS. 5A-5B, are part of a resistive change element array including a plurality of resistive change element cells and a plurality of selection devices arranged in a group of four resistive change element cells sharing one selection device configuration where each group of four resistive change element cells sharing one selection device has the same structure as the resistive change element cells 510, 520, 530, 540 sharing the selection device 550 as discussed above with respect to FIGS. 5A-5B, source lines are in electrical communication with top electrodes of resistive change element cells, word lines are in electrical communication with gate terminals of selection devices, and bit lines are in electrical communication with source terminals of selection devices. FIGS. 5A-5B show source lines SL51, SL52, SL53, SL54 in electrical communication with the top electrodes 516, 526, 536, 546 of the resistive change element cells 510, 520, 530, 540, and a bit line BL51 in electrical communication with the source terminal 554 of the selection device 550. Alternatively, the top electrodes 516, 526, 536, 546 of the resistive change element cells 510, 520, 530, 540 are in electrical communication with source lines SL51, SL52, SL53, SL54 through conductive structures. The gate terminal 558 of the selection device 550 can be part of a word line WL51, alternatively, the gate terminal 558 can be in electrical communication with a word line WL51. Further, intervening layers, such as barrier metal layers to provide a barrier to metal migration, can be included to provide a barrier to metal migration from the source lines SL51, SL52, SL53, SL54, the bit line BL51, and/or the word line WL51. It is noted that when the resistive change element cells 510, 520, 530, 540 and the selection device 550 are part of a resistive change element array including a plurality of resistive change element cells and a plurality of selection devices arranged in a group of four resistive change element cells sharing one selection device configuration, as discussed above, the regions around the resistive change element cells 510, 520, 530, 540, the gate dielectric 556, the gate terminal 558, the first plate conductive structure 571, the first column conductive structure 572, the second plate conductive structure 573, the second column conductive structure 574, the source lines SL51, SL52, SL53, SL54, the bit line BL51, and the word line WL51 can be filled with a dielectric. It is further noted that the resistive change element cells 510, 520, 530, 540 can be sealed by thin dielectric sidewall films, as described in U.S. patent application Ser. No. 15/486,032, prior to filling the regions around the resistive change elements 510, 520, 530, 540 with the dielectric.

Figure 6A:
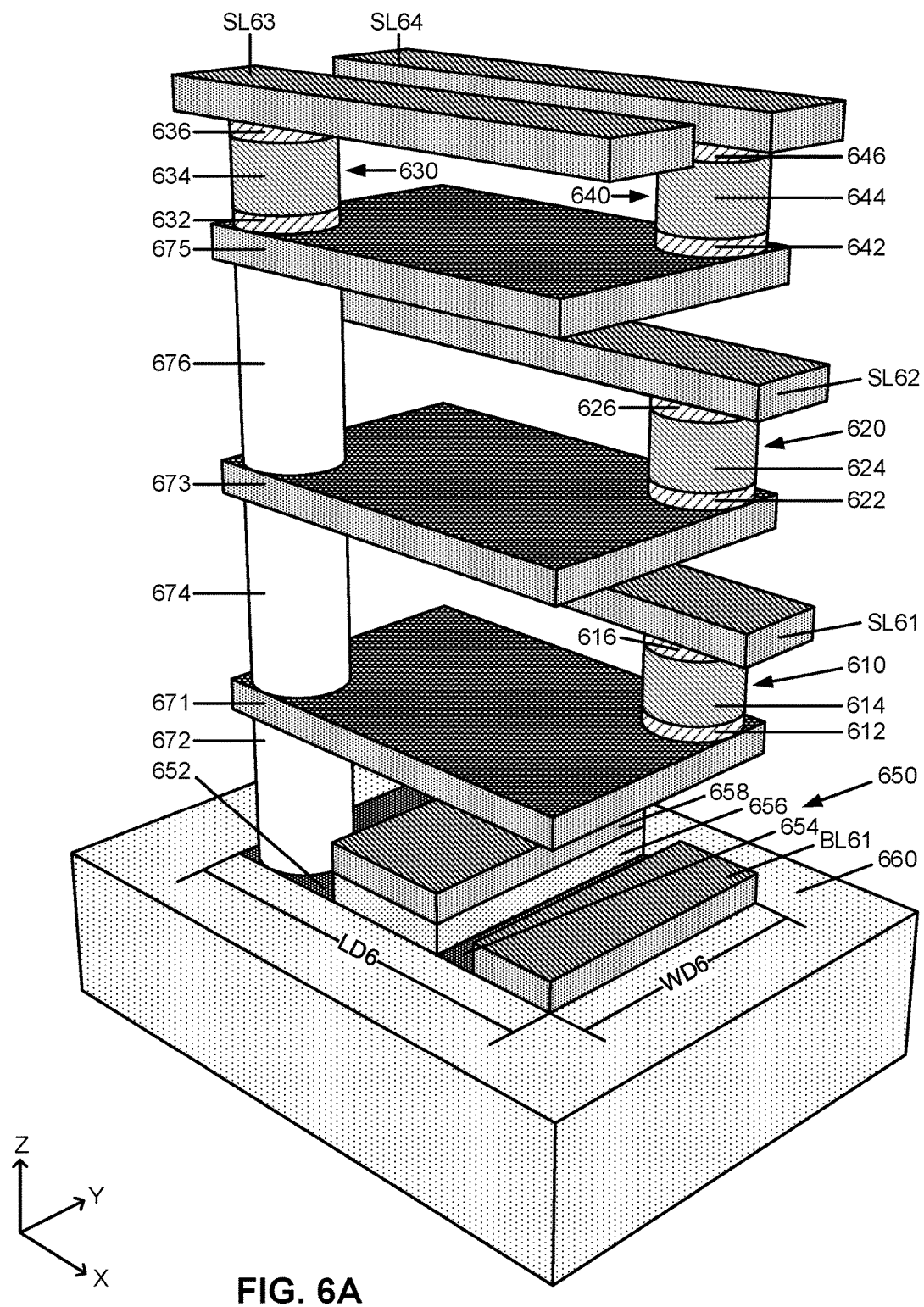
FIG. 6A illustrates a three-dimensional view of four resistive change element cells sharing a selection device, where the four resistive change element cells are arranged in a three level layout above the selection device.
Figure 6B:
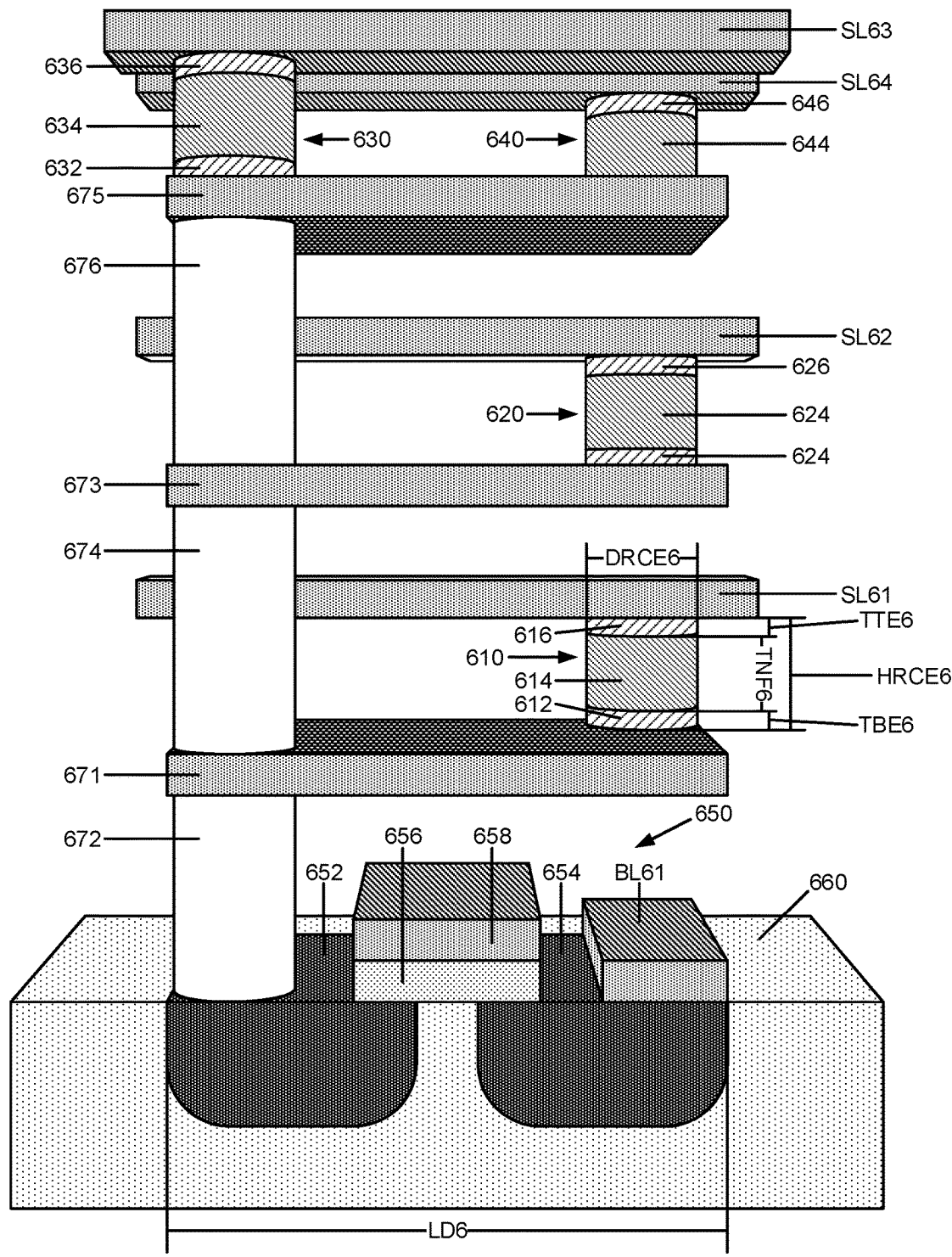
FIG. 6B illustrates a vertical cross-sectional view of the four resistive change element cells sharing a selection device of FIG. 6A.

FIG. 6A illustrates a three-dimensional view of four resistive change element cells 610, 620, 630, 640 sharing a selection device 650, where the four resistive change element cells 610, 620, 630, 640 are arranged in a three level layout above a selection device 650. FIG. 6B illustrates a vertical cross-sectional view of the four resistive change element cells 610, 620, 630, 640 sharing the selection device 650.

Each resistive change element cell 610, 620, 630, 640 can be a two-terminal nanotube switching element, a phase change memory element, a metal oxide memory element, or a conductive bridge memory element as well as other materials and designs, as discussed above with respect to the resistive change elements S000-Sx3y. The selection device 650 is an NMOS transistor, as discussed above with respect to the selection devices D00-Dxy. Alternatively, the selection device 650 can be a PMOS transistor, as discussed above with respect to the selection devices D00-Dxy. Alternatively, the selection device 650 can be other types of field effect transistors, such as a carbon nanotube field effect transistor (CNTFET), a SiGE FET, a fully-depleted silicon-on-insulator FET, or a multiple gate field effect transistor such as a FinFET, as discussed above with respect to the selection devices D00-Dxy.

Each resistive change element cell 610, 620, 630, 640 includes a bottom electrode 612, 622, 632, 642, a nanotube fabric layer 614, 624, 634, 644, and a top electrode 616, 626, 636, 646. The bottom electrodes 612, 622, 632, 642 are in contact with the nanotube fabric layers 614, 624, 634, 644 and the top electrodes 616, 626, 636, 646 are in contact with the nanotube fabric layers 614, 624, 634, 644. Alternatively, the resistive change element cells 610, 620, 630, 640 can include at least one intervening layer located between the bottom electrodes 612, 622, 632, 642 and the nanotube fabric layers 614, 624, 634, 644, at least one intervening layer located between the nanotube fabric layers 614, 624, 634, 644 and the top electrodes 616, 626, 636, 646, or at least one intervening layer located between the bottom electrodes 612, 622, 632, 642 and the nanotube fabric layers 614, 624, 634, 644 and at least one intervening layer located between the nanotube fabric layers 614, 624, 634, 644 and the top electrodes 616, 626, 636, 646. Alternatively, the bottom electrodes 612, 622, 632, 642 can be omitted from the resistive change element cells 610, 620, 630, 640, the top electrodes 616, 626, 636, 646 can be omitted from the resistive change element cells 610, 620, 630, 640, or the bottom electrodes 612, 622, 632, 642 and the top electrodes 616, 626, 636, 646 can be omitted from the resistive change element cells 610, 620, 630, 640.

Each resistive change element cell 610, 620, 630, 640 has a substantially circular horizontal cross-sectional shape with a diameter $D_{RCE6}$ and a height $H_{RCE6}$. The diameter $D_{RCE6}$ is approximately equal to 1F and the height $H_{RCE6}$ is approximately equal to the sum of the thicknesses of the bottom electrode, the nanotube fabric layer, and the top electrode of that resistive change element cell. F represents a minimum feature size. The height $H_{RCE6}$ of each resistive change element cell 610, 620, 630, 640 is typically greater than 1F, however, the height $H_{RCE6}$ of each resistive change element cell 610, 620, 630, 640 can be scaled, such that the height $H_{RCE6}$ approaches 1F. Alternatively, each resistive change element cell 610, 620, 630, 640 can have a diameter $D_{RCE6}$ greater than 1F. Alternatively, each resistive change element cell 610, 620, 630, 640 can have a non-circular horizontal cross-sectional shape, such as a substantially rectangular horizontal cross-sectional shape, a substantially oval horizontal cross-sectional shape, a substantially triangular horizontal cross-sectional shape, a substantially trapezoidal horizontal cross-sectional shape, an irregular horizontal cross-sectional shape, and a non-uniform horizontal cross-sectional shape where different sections of each resistive change element cell 610, 620, 630, 640 can have different dimensions. The bottom electrodes 612, 622, 632, 642, the nanotube fabric layers 614, 624, 634, 644, and the top electrodes 616, 626, 636, 646 have substantially circular horizontal cross-sectional shapes because the resistive change element cells 610, 620, 630, 640 have substantially circular horizontal cross-sectional shapes. The bottom electrodes 612, 622, 632, 642 have a diameter approximately equal to 1F and a thickness TBE6. The nanotube fabric layers 614, 624, 634, 644 have a diameter approximately equal to 1F and a thickness TNF6. The top electrodes 616, 626, 636, 646 have a diameter approximately equal to 1F and a thickness TTE6. It is noted that the resistive change element cells 610, 620, 630, 640 can be considered to have substantially circular horizontal cross-sectional shapes when the resistive change element cells 610, 620, 630, 640 have horizontal cross-sectional shapes that are exactly circles and when the resistive change element cells 610, 620, 630, 640 have horizontal cross-sectional shapes that are not exactly circles due to variations caused by the fabrication process.

The resistive change element cells 610, 620, 630, 640 are arranged in a three level layout with the resistive change element cell 610 and a second column conductive structure 674 on a first level, the resistive change element cell 620 and a third column conductive structure 676 on a second level, and the resistive change element cells 630, 640 on a third level. The resistive change element cell 610 and the second column conductive structure 674 are arranged on the first level such that the resistive change element cell 610 and the second column conductive structure 674 would form substantially right triangles with resistive change element cells placed in the unoccupied corners of a first plate conductive structure 671. The right triangles would have a hypotenuse of 4F, a side of 2F, and a side of $F\sqrt{12}$. The right triangles can be drawn by drawing lines from the center of the second column conductive structure 674 to the center of a resistive change element cell located in an unoccupied corner of the first plate conductive structure 671, from the center of the resistive change element cell located in an unoccupied corner of the first plate conductive structure 671 to the center of the resistive change element cell 610, and from the center of resistive change element cell 610 to the center of the second column conductive structure 674. The resistive change element cell 620 and the third column conductive structure 676 are arranged on the second level such that the resistive change element cell 620 and the third column conductive structure 676 would form substantially right triangles with resistive change element cells placed in the unoccupied corners of a second plate conductive structure 673. The right triangles would have a hypotenuse of 4F, a side of 2F, and a side of $F\sqrt{12}$. The right triangles can be drawn by drawing lines from the center of the third column conductive structure 676 to the center of a resistive change element cell located in an unoccupied corner of the second plate conductive structure 673, from the center of the resistive change element cell located in an unoccupied corner of the second plate conductive structure 673 to the center of the resistive change element cell 620, and from the center of resistive change element cell 620 to the center of the third column conductive structure 676. The resistive change element cells 630, 640 are arranged on the third level such that the resistive change element cells 630, 640 would form substantially right triangles with resistive change element cells placed in the unoccupied corners of a third plate conductive structure 675. The right triangles would have a hypotenuse of 4F, a side of 2F, and a side of $F\sqrt{12}$. The right triangles can be drawn by drawing lines from the center of the resistive change element 630 to the center of a resistive change element cell located in an unoccupied corner of the third plate conductive structure 675, from the center of the resistive change element cell located in an unoccupied corner of the third plate conductive structure 675 to the center of the resistive change element cell 640, and from the center of resistive change element cell 640 to the center of the resistive change element 630. Alternatively, the resistive change element cells 610, 620, 630, 640, the second column conductive structure 674, and the third column conductive structure 676 can be arranged to form other shapes, such as polygons other than right triangles, circles, ovals, and irregular shapes. Alternatively, the resistive change element cells 610, 620, 630, 640, the second column conductive structure 674, and the third column conductive structure 676 can be arranged in patterns. It is noted that the resistive change element cells 610, 620, 630, 640, the second column conductive structure 674, and the third column conductive structure 676 can be considered to form substantially right triangles, substantially other shapes, or substantially patterns when the resistive change element cells 610, 620, 630, 640, the second column conductive structure 674, and the third column conductive structure 676 form exact right triangles, exact other shapes, or exact patterns, and when the resistive change element cells 610, 620, 630, 640, the second column conductive structure 674, and the third column conductive structure 676 form right triangles, other shapes, or patterns that are not exact right triangles, exact other shapes, or exact patterns due to variations caused by the fabrication process. It is also noted that resistive change element cells and the column conductive structures on different level can be arranged in different shapes and/or patterns. It is further noted that the resistive change element cells and the column conductive structures are required to be separated by a distance of at least 1F.

The selection device 650 includes a drain terminal 652, a source terminal 654, a gate dielectric 656, and a gate terminal 658. The gate dielectric 656 is formed on the substrate 660 and the gate terminal 658 is formed on the gate dielectric 656. Alternatively, the gate terminal 658 can be part of an array line, such as a word line. Alternatively, the drain terminal 652, the source terminal 654, and the gate dielectric 656 can be formed on a layer of material, such as a nanotube fabric layer, deposited on the substrate 660 and the gate terminal 658 can be formed on the gate dielectric 656. The substrate 660 can be formed from a conductive material, a semiconductor material, or an insulating material as required by the needs of a specific application.

The resistive change element cell 610 is electrically connected to the drain terminal 652 of the selection device 650 through a first plate conductive structure 671 and a first column conductive structure 672. The first plate conductive structure 671 has a substantially rectangular horizontal cross-sectional shape that encompasses the resistive change element cell 610 and the second column conductive structure 674 on the first level. The first plate conductive structure 671 has a width dimension of 3F and a length dimension of approximately 4.5F, these dimensions are the dimensions for the smallest rectangle that encompasses the resistive change element cell 610 and the second column conductive structure 674 on the first level. The width dimension of the first plate conductive structure 671 can be calculated by width dimension=the diameter of the second column conductive structure 674+minimum feature size F+the diameter of a resistive change element cell, width dimension=1F+1F+1F. The length dimension of the first plate conductive structure 671 can be calculated by length dimension=side of the right triangle along the x-axis+the radius of a resistive change element+the radius of a resistive change element, length=F$\sqrt{12}$+0.5F+0.5F. It is noted that the dimensions of the first plate conductive structure 671 are not limited to the dimensions for the smallest rectangle that encompasses the resistive change element cell 610 and the second column conductive structure 674 on the first level. Alternatively, the first plate conductive structure 671 can have a horizontal cross-sectional shape that extends beyond the edges of the resistive change element 610 and the second column conductive structure 674 on the first level. Alternatively, the first plate conductive structure 671 can have a horizontal cross-sectional shape that does not encompass the resistive change element cell 610 and the second column conductive structure 674 on the first level. For example, when the first plate conductive structure 671 has a horizontal cross-sectional shape that does not encompass the resistive change element cell 610 and the second column conductive structure 674 on the first level, at least one of the resistive change element cell 610 and the second column conductive structure 674 can extend beyond the first plate conductive structure 671. Alternatively, the first plate conductive structure 671 can have a non-rectangular horizontal cross-sectional shape, such as a substantially circular horizontal cross-sectional shape, a substantially oval horizontal cross-sectional shape, a substantially triangular horizontal cross-sectional shape, a substantially trapezoidal horizontal cross-sectional shape, and an irregular horizontal cross-sectional shape. It is noted that the first plate conductive structure 671 can be considered to have a substantially rectangular horizontal cross-sectional shape when the first plate conductive structure 671 has a horizontal cross-sectional shape that is exactly a rectangle and when the first plate conductive structure 671 has a horizontal cross-sectional shape that is not exactly a rectangle due to variations caused by the fabrication process.

The resistive change element cell 620 is electrically connected to the drain terminal 652 of the selection device 650 through a second plate conductive structure 673, the second column conductive structure 674, the first plate conductive structure 671, and the first column conductive structure 672. The second plate conductive structure 673 has a substantially rectangular horizontal cross-sectional shape that encompasses the resistive change element cell 620 and the third column conductive structure 676 on the second level. The second plate conductive structure 673 has a width dimension of 3F and a length dimension of approximately 4.5F, these dimensions are the dimensions for the smallest rectangle that encompasses the resistive change element cell 620 and the third column conductive structure 676 on the second level. The width dimension of the second plate conductive structure 673 can be calculated by width dimension=the diameter of third column conductive structure 676+minimum feature size F+the diameter of a resistive change element cell. The length dimension of the second plate conductive structure 673 can be calculated by length dimension=side of the right triangle along the x-axis+the radius of a resistive change element+the radius of a resistive change element, length=$F\sqrt{12}+0.5F+0.5F$. It is noted that the dimensions of the second plate conductive structure 673 are not limited to the dimensions for the smallest rectangle that encompasses the resistive change element cell 620 and the third column conductive structure 676 on the second level. Alternatively, the second plate conductive structure 673 can have a horizontal cross-sectional shape that extends beyond the edges of the resistive change element cell 620 and the third column conductive structure 676 on the second level. Alternatively, the second plate conductive structure 673 can have a horizontal cross-sectional shape that does not encompass the resistive change element cell 620 and the third column conductive structure 676 on the second level. For example, when the second plate conductive structure 673 has a horizontal cross-sectional shape that does not encompass the resistive change element cell 620 and the third column conductive structure 676 on the second level, at least one of the resistive change element cell 620 and the third column conductive structure 676 can extend beyond the second plate conductive structure 673. Alternatively, the second plate conductive structure 673 can have a non-rectangular horizontal cross-sectional shape, such as a substantially circular horizontal cross-sectional shape, a substantially oval horizontal cross-sectional shape, a substantially triangular horizontal cross-sectional shape, a substantially trapezoidal horizontal cross-sectional shape, and an irregular horizontal cross-sectional shape. It is noted that the second plate conductive structure 673 can be considered to have a substantially rectangular horizontal cross-sectional shape when the second plate conductive structure 673 has a horizontal cross-sectional shape that is exactly a rectangle and when the second plate conductive structure 673 has a horizontal cross-sectional shape that is not exactly a rectangle due to variations caused by the fabrication process.

The resistive change element cells 630, 640 are electrically connected to the drain terminal 652 of the selection device 650 through a third plate conductive structure 675, the third column conductive structure 676, the second plate conductive structure 673, the second column conductive structure 674, the first plate conductive structure 671, and the first column conductive structure 672. The third plate conductive structure 675 has a substantially rectangular horizontal cross-sectional shape that encompasses the resistive change element cells 630, 640. The third plate conductive structure 675 has a width dimension of 3F and a length dimension of approximately 4.5F, these dimensions are the dimensions for the smallest rectangle that encompasses the resistive change element cells 630, 640 on the third level. The width dimension of the third plate conductive structure 675 can be calculated by width dimension=the diameter of a resistive change element cell+minimum feature size F+the diameter of a resistive change element cell, width dimension=1F+1F+1F. The length dimension of the third plate conductive structure 675 can be calculated by length dimension=side of the right triangle along the x-axis+the radius of a resistive change element+the radius of a resistive change element, length=$F\sqrt{12}+0.5F+0.5F$. It is noted that the dimensions of the third plate conductive structure 675 are not limited to the dimensions for the smallest rectangle that encompasses the resistive change element cells 630, 640 on the third level. Alternatively, the third plate conductive structure 675 can have a horizontal cross-sectional shape that extends beyond the edges of the resistive change elements 630, 640 on the third level. Alternatively, the third plate conductive structure 675 can have a horizontal cross-sectional shape that does not encompass the resistive change element cells 630, 640 on the third level. For example, when the third plate conductive structure 675 has a horizontal cross-sectional shape that does not encompass the resistive change element cells 630, 640 on the third level, at least one of the resistive change element cells 630, 640 can extend beyond the third plate conductive structure 675. Alternatively, the third plate conductive structure 675 can have a non-rectangular horizontal cross-sectional shape, such as a substantially circular horizontal cross-sectional shape, a substantially oval horizontal cross-sectional shape, a substantially triangular horizontal cross-sectional shape, a substantially trapezoidal horizontal cross-sectional shape, and an irregular horizontal cross-sectional shape. It is noted that the third plate conductive structure 675 can be considered to have a substantially rectangular horizontal cross-sectional shape when the third plate conductive structure 675 has a horizontal cross-sectional shape that is exactly a rectangle and when the third plate conductive structure 675 has a horizontal cross-sectional shape that is not exactly a rectangle due to variations caused by the fabrication process.

Each of the first column conductive structure 672, the second column conductive structure 674, and the third column conductive structure 676 has a substantially circular horizontal cross-sectional shape. The first column conductive structure 672 has a diameter approximately equal to 1F and a height greater than the sum of the thicknesses of the gate dielectric 656 and the gate terminal 658. Alternatively, the first column conductive structure 672 can have diameter greater than 1F. The second column conductive structure 674 has a diameter approximately equal to 1F and a height greater than the sum of the height of the resistive change element cell 610 and an array line, such as a source line. Alternatively, the second column conductive structure 674 can have a diameter greater than 1F. The third column conductive structure 676 has a diameter approximately equal to 1F and a height greater than the sum of the height of the resistive change element cell 620 and an array line, such as a source line. Alternatively, the third column conductive structure 676 can have a diameter greater than 1F. Alternatively, each of the first column conductive structure 672, the second column conductive structure 674, and the third column conductive structure 676 can have a non-circular horizontal cross-sectional shape, such as a substantially rectangular horizontal cross-sectional shape, a substantially oval horizontal cross-sectional shape, a substantially triangular horizontal cross-sectional shape, a substantially trapezoidal horizontal cross-sectional shape, an irregular horizontal cross-sectional shape, and a non-uniform horizontal cross-sectional shape where different sections of the column conductive structures 672, 674, 676 can have different dimensions. Alternatively, the resistive change element cell 610 can be electrically connected to the drain terminal 652 of the selection device 650 by other conductive structures, such as a plate conductive structure and at least two column conductive structures, the resistive change element cell 620 can be electrically connected to the drain terminal 652 of the selection device 650 by other conductive structures, such as at least two plate conductive structures and at least three column conductive structures, and the resistive change element cell 630, 640 can be electrically connected to the drain terminal 652 of the selection device 650 by other conductive structures, such as at least three plate conductive structures and at least four column conductive structures. It is noted that the first column conductive structure 672, the second column conductive structure 674, and the third column conductive structure 676 can have different horizontal cross-sectional shapes. It is also noted that the first column conductive structure 672 can be considered to have a substantially circular horizontal cross-sectional shape when the first column conductive structure 672 has a horizontal cross-sectional shape that is exactly a circle and when the first column conductive structure 672 has a horizontal cross-sectional shape that is not exactly a circle due to variations caused by the fabrication process. It is also noted that the second column conductive structure 674 can be considered to have a substantially circular horizontal cross-sectional shape when the second column conductive structure 674 has a horizontal cross-sectional shape that is exactly a circle and when the second column conductive structure 674 has a horizontal cross-sectional shape that is not exactly a circle due to variations caused by the fabrication process. It is also noted that the third column conductive structure 676 can be considered to have a substantially circular horizontal cross-sectional shape when the third column conductive structure 676 has a horizontal cross-sectional shape that is exactly a circle and when the third column conductive structure 676 has a horizontal cross-sectional shape that is not exactly a circle due to variations caused by the fabrication process.

The selection device 650 occupies a substantially rectangular surface area shape of the substrate 660. The selection device 650 has a width WD6 of 3F and a length LD6 of 4.5F. Thus, the substantially rectangular surface area shape occupied by the selection device 650 generally corresponds with the substantially rectangular horizontal cross-sectional shape of the first plate conductive structure 671 located above the selection device 650. For example, when the selection device 650 occupies a rectangular surface area shape with a width of 3F and a length of 4.5F, the rectangular horizontal cross-sectional shape of the first plate conductive structure 671 has a width dimension of 3F and a length dimension of 4.5F, and F is 10 nm, the selection device 650 occupies an area of 1,350 nm$^2$ of the substrate 660 and the rectangular horizontal cross-section shape of the first plate conductive structure 671 has an area of 1,350 nm$^2$. Alternatively, the substantially rectangular surface area shape occupied by the selection device 650 can extend beyond the substantially rectangular horizontal cross-sectional shape of the first plate conductive structure 671, the substantially rectangular horizontal cross-sectional shape of the first plate conductive structure 671 can extend beyond the substantially rectangular surface area shape occupied by the selection device 650, and the substantially rectangular horizontal cross-sectional shape of the first plate conductive structure 671 can cover at least part of the substantially rectangular surface area shape occupied by the selection device 650. Alternatively, the selection device 650 can occupy a substantially square surface area shape, or a non-rectangular surface area shape, such as a substantially trapezoidal surface area shape and an irregular surface area shape. It is noted that the selection device 650 can be considered to occupy a substantially rectangular surface area shape of a substrate when the selection device 650 occupies a surface area shape of a substrate that is exactly a rectangle and when the selection device 650 occupies a surface area shape of a substrate that is not exactly a rectangle due to variations caused by the fabrication process.

When the resistive change element cells 610, 620, 630, 640 sharing the selection device 650 as discussed above with respect to FIGS. 6A-6B, are part of a resistive change element array including a plurality of resistive change element cells and a plurality of selection devices arranged in a group of four resistive change element cells sharing one selection device configuration where each group of four resistive change element cells sharing one selection device has the same structure as the resistive change element cells 610, 620, 630, 640 sharing the selection device 650 as discussed above with respect to FIGS. 6A-6B, a surface area shape of a substrate required for a selection device to be adjacently located to other selection devices in the resistive change element array is greater than a rectangular surface area shape occupied by a selection device and a shape required for a group of resistive change element cells to be adjacently located to other groups of resistive change element cells in the resistive change element array is greater than a combined shape that encompasses the three level layout of a group of resistive change element cells. The surface area shape of a substrate required for a selection device to be adjacently located is greater than the rectangular surface area shape occupied by a selection device because the selection devices are required to be separated by at least 1F. For example, when the selection device 650 occupies a rectangular surface area shape with a width of 3F and a length of 4.5F and adjacent selection devices are separated by 1F, the surface area shape of a substrate required for a selection device to be adjacently located can be approximated by a rectangle with a width of 4F and a length of 5.5F.

The combined shape that encompasses a three level layout of a group of resistive change element cells is formed by the smallest rectangle that encompasses the first level, the smallest rectangle that encompasses the second level, and the smallest rectangle that encompasses the third level because the smallest rectangle that encompasses the second level covers at least part of the smallest rectangle that encompasses the first level and the smallest rectangle that encompasses the third level covers at least part of the smallest rectangle that encompasses the second level and at least part of the smallest rectangle that encompasses the first level. The combined shape that encompasses a three level layout of a group of resistive change element cells has an outline defined by the part of the smallest rectangle that encompasses the first level and the part of the smallest rectangle that encompasses the second level that are covered by another rectangle, the part of the smallest rectangle that encompasses the first level and the part of the smallest rectangle that encompasses the second level that are not covered by another rectangle, and the part of the smallest rectangle that encompasses the third level that does not cover another rectangle. As discussed above, the first plate conductive structure 671 has a horizontal cross-sectional shape that corresponds with the smallest rectangle that encompasses the first level, the second conductive plate structure 673 has a horizontal cross-sectional shape that corresponds with the smallest rectangle that encompasses the second level, and the third plate conductive structure 675 has a horizontal cross-sectional shape that corresponds with the smallest rectangle that encompasses the third level. For example, when the first plate conductive structure 671, the second plate conductive structure 673, and the third plate conductive structure 675 are arranged so that a combined shape that encompasses a three level layout of a group of resistive change element cells corresponds with the horizontal cross-sectional shape of the first plate conductive structure 671, the combined shape that encompasses a three level layout of a group of resistive change element cells can be approximated by a rectangle having a width of 3F and a length of 4.5F.

The shape required for a group of resistive change element cells to be adjacently located is greater than the combined shape that encompasses the three level layout of a group of resistive change element cells because the resistive change element cells and the column conductive structures are required to be separated by at least 1F. For example, when the combined shape that encompasses a three level layout of a group of resistive change element cells has a width of 3F and length of 4.5F and the resistive change element cells and the conductive structures are separated by 1F, the shape required for a group of resistive change element cells to be adjacently located can be approximated by a rectangle with a width of 4F and length of 5.5F.

When the resistive change element cells 610, 620, 630, 640 sharing the selection device 650 as discussed above with respect to FIGS. 6A-6B, are part of a resistive change element array including a plurality of resistive change element cells and a plurality of selection devices arranged in a group of four resistive change element cells sharing one selection device configuration where each group of four resistive change element cells sharing one selection device has the same structure as the resistive change element cells 610, 620, 630, 640 sharing the selection device 650 as discussed above with respect to FIGS. 6A-6B, a surface area of a substrate required for a group of resistive change element cells sharing a selection device is based on a combined shape formed by the shape required for a group of resistive change element cells to be adjacently located and the surface area shape of a substrate required for a selection device to be adjacently located. The surface area of a substrate required for a group of resistive change element cells sharing a selection device is based on the combined shape because the resistive change element cells 610, 620, 630, 640 are positioned above the selection device 650 such that an area of the substrate covered by the shape required for a group of resistive change element cells to be adjacently located covers at least part of the surface area shape of a substrate required for a selection device to be adjacently located. The combined shape has an outline defined by the part of the shape required for a group of resistive change element cells to be adjacently located that covers part of the surface area shape of a substrate required for a selection device to be adjacently located, the part of the shape required for a group of resistive change element cells to be adjacently located that does not cover the surface area shape of a substrate required for a selection device to be adjacently located, and the part of the surface area shape of a substrate required for a selection device to be adjacently located that is not covered by the shape required for a group of resistive change element cells to be adjacently located.

Alternatively, when a shape required for a group of resistive change element cells to be adjacently located encompasses a surface area shape of a substrate required for a selection device to be adjacently located and the resistive change element cells 610, 620, 630, 640 are positioned above the selection device 650 such that an area of the substrate covered by the shape required for a group of resistive change element cells to be adjacently located encompasses the surface area shape of a substrate required for a selection device to be adjacently located, a surface area of the substrate required for a group of resistive change element cells sharing a selection device is based on the shape required for a group of resistive change element cells to be adjacently located. Alternatively, when the surface area shape of a substrate required for a selection device to be adjacently located encompasses the shape required for a group of resistive change element cells to be adjacently located and the resistive change element cells 610, 620, 630, 640 are positioned above the selection device 650 such that an area of the substrate covered by the shape required for a group of resistive change element cells to be adjacently located is encompassed by the surface area shape of a substrate required for a selection device to be adjacently located, a surface area shape of a substrate required for a group of resistive change element cells sharing a selection device is based on the surface area shape of a substrate required for a selection device to be adjacently located.

Resistive change element cell density of a resistive change element array is based on a surface area of a substrate required for a resistive change element cell, and thus, resistive change element cell density in the resistive change element array including a plurality of resistive change element cells and a plurality of selection devices arranged in a group of four resistive change element cells sharing one selection device configuration where each group of four resistive change element cells sharing one selection device in the resistive change element array has the same structure as the resistive change element cells 610, 620, 630, 640 sharing the selection device 650 as discussed above with respect to FIGS. 6A-6B is based on the combined shape formed by the shape required for a group of resistive change element cells to be adjacently located and the surface area shape of a substrate required for a selection device to be adjacently located. For example, when a shape required for a group of resistive change element cells to be adjacently located can be approximated by a rectangle with a width of 4F and a length of 5.5F, a surface area shape of a substrate required for a selection device to be adjacently located can be approximated by a rectangle with a width of 4F and a length of 5.5F, the resistive change element cells 610, 620, 630, 640 are positioned above the selection device 650 such that the combined shape is a rectangle with a width of 4F and a length of 5.5F, and F is 10 nm, the resistive change element cell density is one resistive change element cell per an area 550 nm$^2$ of the substrate.

In the above example, the four resistive change element cells 610, 620, 630, 640 sharing the selection device 650 have a resistive change element cell density of one resistive change element cell per an area of 550 nm$^2$ of the substrate and in the examples further above the resistive change element cell 110 and the resistive change element cell 111 have a resistive change element cell density of one resistive change element cell per an area of 2,200 nm$^2$ of the substrate. Thus, in these examples the resistive change element cells 610, 620, 630, 640 sharing the selection device 650 have a resistive change element cell density approximately four times greater than a resistive change element cell density of the resistive change element cell 110 and the resistive change element cell 111.

When the resistive change element cells 610, 620, 630, 640 sharing the selection device 650 as discussed above with respect to FIGS. 6A-6B, are part of a resistive change element array including a plurality of resistive change element cells and a plurality of selection devices arranged in a group of four resistive change element cells sharing one selection device configuration where each group of four resistive change element cells sharing one selection device has the same structure as the resistive change element cells 610, 620, 630, 640 sharing the selection device 650 as discussed above with respect to FIGS. 6A-6B, source lines are in electrical communication with top electrodes of resistive change element cells, word lines are in electrical communication with gate terminals of selection devices, and bit lines are in electrical communication with source terminals of selection devices. FIGS. 6A-6B show source lines SL61, SL62, SL63, SL64 in electrical communication with the top electrodes 616, 626, 636, 646 of the resistive change element cells 610, 620, 630, 640 and a bit line BL61 in electrical communication with the source terminal 654 of the selection device 650. Alternatively, the top electrodes 616, 626, 636, 646 of the resistive change element cells 610, 620, 630, 640 are in electrical communication with the source lines SL61, SL62, SL63, SL64 through conductive structures. The gate terminal 658 of the selection device 650 can be part of a word line WL61, alternatively, the gate terminal 658 can be in electrical communication with a word line WL61. Further, intervening layers, such as barrier metal layers to provide a barrier to metal migration, can be included to provide a barrier to metal migration from the source lines SL61, SL62, SL63, SL64, the bit line BL61, and/or the word line WL61. It is noted that when the resistive change element cells 610, 620, 630, 640 and the selection device 650 are part of a resistive change element array including a plurality of resistive change element cells and a plurality of selection devices arranged in a group of four resistive change element cells sharing one selection device configuration, as discussed above, the regions around the resistive change element cells 610, 620, 630, 640, the gate dielectric 656, the gate terminal 658, the first plate conductive structure 671, the first column conductive structure 672, the second plate conductive structure 673, the second column conductive structure 674, the third plate conductive structure 675, the third column conductive structure 676, the source lines SL61, SL62, SL63, SL64, the bit line BL61, and the word line WL61 can be filled with a dielectric. It is further noted that the resistive change element cells 610, 620, 630, 640 can be sealed by thin dielectric sidewall films, as described in U.S. patent application Ser. No. 15/486,032, prior to filling the regions around the resistive change elements 610, 620, 630, 640 with the dielectric.

Further, when the resistive change element cells 610, 620, 630, 640 sharing the selection device 650 as discussed above with respect to FIGS. 6A-6B, are part of a resistive change element array including a plurality of resistive change element cells and a plurality of selection devices arranged in a group of four resistive change element cells sharing one selection device configuration where each group of four resistive change element cells sharing one selection device has the same structure as the resistive change element cells 610, 620, 630, 640 sharing the selection device 650 as discussed above with respect to FIGS. 6A-6B, neighboring resistive change element cells and column conductive structures on the same levels of different structures can form substantially equilateral triangles. For example, when a group of resistive change element cells sharing a selection device is located in front of the group of four resistive change element cells resistive change element cells 610, 620, 630, 640 sharing the selection device 650 and the smallest rectangles encompassing the first levels, the smallest rectangles encompassing the second levels, and the smallest rectangles encompassing the third levels are separated by a distance of 1F, the resistive change element cell 610, the second column conductive structure 674, and a resistive change element cell located in the position of resistive change element cell 610 in the front group form an equilateral triangle having sides 4F in length, the resistive change element cell 620, the third column conductive structure 676, and a resistive change element cell located in the position of resistive change element cell 620 in the front group form an equilateral triangle having sides 4F in length, and the resistive change element cells 630, 640, and a resistive change element cell located in the position of resistive change element cell 640 in the front group form an equilateral triangle having sides 4F in length. For example, when a group of resistive change element cells sharing a selection device is located in back of the group of four resistive change element cells resistive change element cells 610, 620, 630, 640 sharing the selection device 650 and the smallest rectangles encompassing the first levels, the smallest rectangles encompassing the second levels, and the smallest rectangles encompassing the third levels are separated by a distance of 1F, the resistive change element cell 610, the second column conductive structure 674, and a second column conductive structure located in the position of second column conductive structure 674 in the back group form an equilateral triangle having sides 4F in length, the resistive change element cell 620, the third column conductive structure 676, and a third column conductive structure located in the position of third column conductive structure 676 in the back group form an equilateral triangle having sides 4F in length, and the resistive change element cells 630, 640, and a resistive change element cell located in the position of resistive change element cell 630 in the back group form an equilateral triangle having sides 4F in length.

Alternatively, neighboring resistive change element cells and column conductive structures on the same levels of different structures can be arranged to form other shapes, such as polygons other than equilateral triangles, circles, ovals, and irregular shapes. Alternatively, neighboring resistive change element cells and column conductive structures on the same levels of different structures can be arranged in patterns. It is noted that neighboring resistive change element cells and column conductive structures on the same levels of different structures can be considered to form substantially equilateral triangles, substantially other shapes, or substantially patterns when the neighboring resistive change element cells and column conductive structures on the same levels of different structures form exact equilateral triangles, exact other shapes, or exact patterns, and when neighboring resistive change element cells and column conductive structures on the same levels of different structures form equilateral triangles, other shapes, or patterns that are not exact equilateral triangles, exact other shapes, or exact patterns due variations caused by the fabrication process. It is also noted that resistive change element cells and the column conductive structures on different levels can be arranged in different shapes and/or patterns. It is further noted that the resistive change element cells and the column conductive structures are required to be separated by a distance of at least 1F.

Figure 7A:
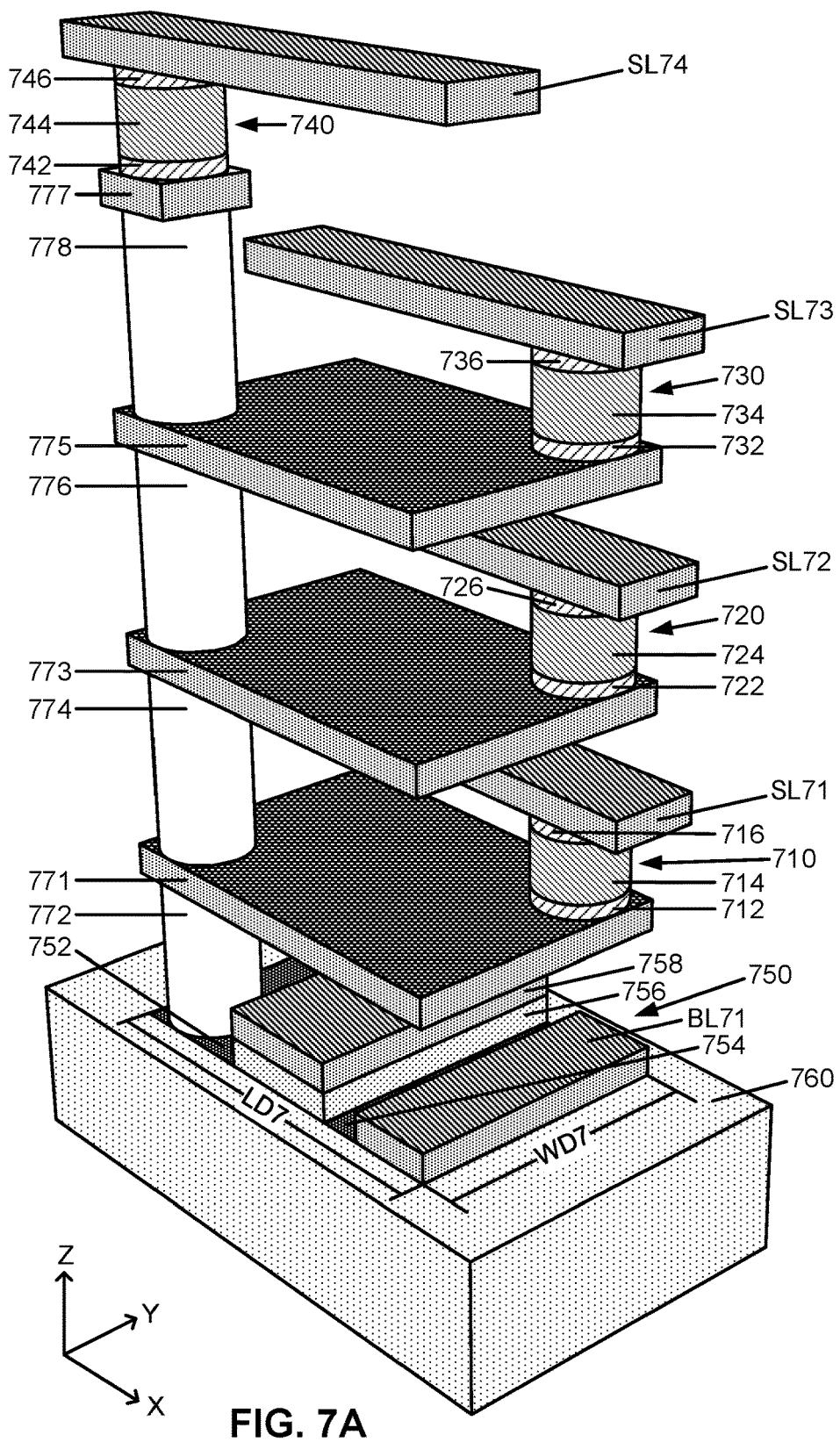
FIG. 7A illustrates a three-dimensional view of four resistive change element cells sharing a selection device, where the four resistive change element cells are arranged in a four level layout above the selection device.
Figure 7B:
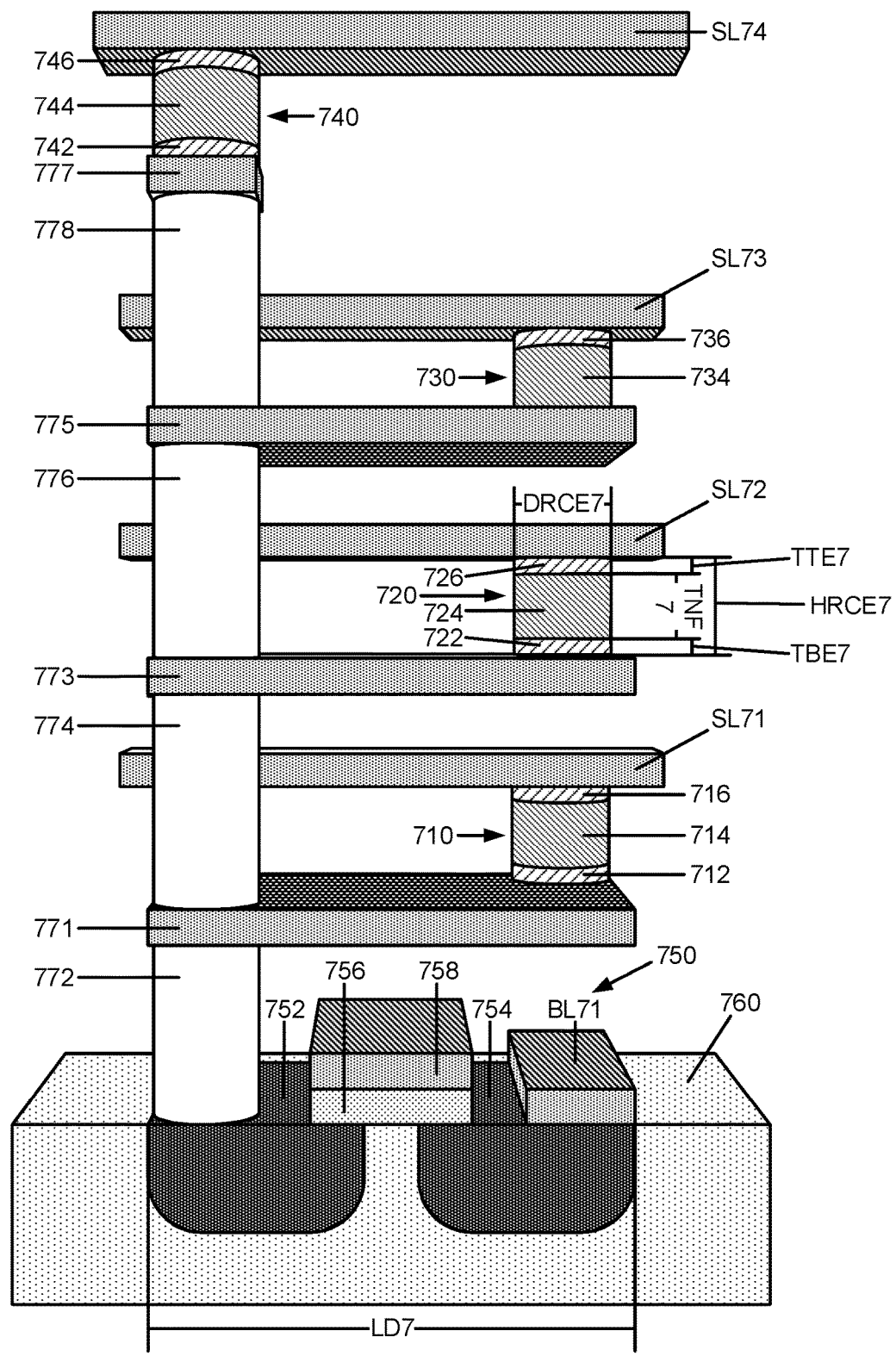
FIG. 7B illustrates a vertical cross-sectional view of the four resistive change element cells sharing a selection device of FIG. 7A.

FIG. 7A illustrates a three-dimensional view of four resistive change element cells 710, 720, 730, 740 sharing a selection device 750, where the four resistive change element cells 710, 720, 730, 740 are arranged in a four level layout above a selection device 750. FIG. 7B illustrates a vertical cross-sectional view of the four resistive change element cells 710, 720, 730, 740 sharing the selection device 750.

Each resistive change element cell 710, 720, 730, 740 can be a two-terminal nanotube switching element, a phase change memory element, a metal oxide memory element, or a conductive bridge memory element as well as other materials and designs, as discussed above with respect to the resistive change elements S000-Sx3y. The selection device 750 is an NMOS transistor, as discussed above with respect to the selection devices D00-Dxy. Alternatively, the selection device 750 can be a PMOS transistor, as discussed above with respect to the selection devices D00-Dxy. Alternatively, the selection device 750 can be other types of field effect transistors, such as a carbon nanotube field effect transistor (CNTFET), a SiGE FET, a fully-depleted silicon-on-insulator FET, or a multiple gate field effect transistor such as a FinFET, as discussed above with respect to the selection devices D00-Dxy.

Each resistive change element cell 710, 720, 730, 740 includes a bottom electrode 712, 722, 732, 742, a nanotube fabric layer 714, 724, 734, 744, and a top electrode 716, 726, 736, 746. The bottom electrodes 712, 722, 732, 742 are in contact with the nanotube fabric layers 714, 724, 734, 744 and the top electrodes 716, 726, 736, 746 are in contact with the nanotube fabric layers 714, 724, 734, 744. Alternatively, the resistive change element cells 710, 720, 730, 740 can include at least one intervening layer located between the bottom electrodes 712, 722, 732, 742 and the nanotube fabric layers 714, 724, 734, 744, at least one intervening layer located between the nanotube fabric layers 714, 724, 734, 744 and the top electrodes 716, 726, 736, 746, or at least one intervening layer located between the bottom electrodes 712, 722, 732, 742 and the nanotube fabric layers 714, 724, 734, 744 and at least one intervening layer located between the nanotube fabric layers 714, 724, 734, 744 and the top electrodes 716, 726, 736, 746. Alternatively, the bottom electrodes 712, 722, 732, 742 can be omitted from the resistive change element cells 710, 720, 730, 740, the top electrodes 716, 726, 736, 746 can be omitted from the resistive change element cells 710, 720, 730, 740, or the bottom electrodes 712, 722, 732, 742 and the top electrodes 716, 726, 736, 746 can be omitted from the resistive change element cells 710, 720, 730, 740.

Each resistive change element cell 710, 720, 730, 740 has a substantially circular horizontal cross-sectional shape with a diameter $D_{RCE7}$ and a height $H_{RCE7}$. The diameter $D_{RCE7}$ is approximately equal to 1F and the height $H_{RCE7}$ is approximately equal to the sum of the thicknesses of the bottom electrode, the nanotube fabric layer, and the top electrode of that resistive change element cell. F represents a minimum feature size. The height $H_{RCE7}$ of each resistive change element cell 710, 720, 730, 740 is typically greater than 1F, however, the height $H_{RCE7}$ of each resistive change element cell 710, 720, 730, 740 can be scaled, such that the height $H_{RCE}$ approaches 1F. Alternatively, each resistive change element cell 710, 720, 730, 740 can have a diameter $D_{RCE7}$ greater than 1F. Alternatively, each resistive change element cell 710, 720, 730, 740 can have a non-circular horizontal cross-sectional shape, such as a substantially rectangular horizontal cross-sectional shape, a substantially oval horizontal cross-sectional shape, a substantially triangular horizontal cross-sectional shape, a substantially trapezoidal horizontal cross-sectional shape, an irregular horizontal cross-sectional shape, and a non-uniform horizontal cross-sectional shape where different sections of each resistive change element cell 710, 720, 730, 740 can have different dimensions. The bottom electrodes 712, 722, 732, 742, the nanotube fabric layers 714, 724, 734, 744, and the top electrodes 716, 726, 736, 746 have substantially circular horizontal cross-sectional shapes because the resistive change element cells 710, 720, 730, 740 have substantially circular horizontal cross-sectional shapes. The bottom electrodes 712, 722, 732, 742 have a diameter approximately equal to 1F and a thickness TBE7. The nanotube fabric layers 714, 724, 734, 744 have a diameter approximately equal to 1F and a thickness TNF7. The top electrodes 716, 726, 736, 746 have a diameter approximately equal to 1F and a thickness TTE7. It is noted that the resistive change element cells 710, 720, 730, 740 can be considered to have substantially circular horizontal cross-sectional shapes when the resistive change element cells 710, 720, 730, 740 have horizontal cross-sectional shapes that are exactly circles and when the resistive change element cells 710, 720, 730, 740 have horizontal cross-sectional shapes that are not exactly circles due to variations caused by the fabrication process.

The resistive change element cells 710, 720, 730, 740 are arranged in a four level layout with the resistive change element cell 710 and a second column conductive structure 774 on a first level, the resistive change element cell 720 and a third column conductive structure 776 on a second level, and the resistive change element cell 730 and a fourth column conductive structure 778 on a third level, and resistive change element 740 on a fourth level. The resistive change element cell 710 and the second column conductive structure 774 are arranged on the first level such that the resistive change element cell 710 and the second column conductive structure 774 would form substantially right triangles with resistive change element cells placed in the unoccupied corners of a first plate conductive structure 771. The right triangles would have a hypotenuse of 4F, a side of 2F, and a side of $F\sqrt{12}$. The right triangles can be drawn by drawing lines from the center of the second column conductive structure 774 to the center of a resistive change element cell located in an unoccupied corner of the first plate conductive structure 771, from the center of the resistive change element cell located in an unoccupied corner of the first plate conductive structure 771 to the center of the resistive change element cell 710, and from the center of resistive change element cell 710 to the center of the second column conductive structure 774. The resistive change element cell 720 and the third column conductive structure 776 are arranged on the second level such that the resistive change element cell 720 and the third column conductive structure 776 would form substantially right triangles with resistive change element cells placed in the unoccupied corners of a second plate conductive structure 773. The right triangles would have a hypotenuse of 4F, a side of 2F, and a side of $F\sqrt{12}$. The right triangles can be drawn by drawing lines from the center of the third column conductive structure 776 to the center of a resistive change element cell located in an unoccupied corner of the second plate conductive structure 773, from the center of the resistive change element cell located in an unoccupied corner of the second plate conductive structure 773 to the center of the resistive change element cell 720, and from the center of resistive change element cell 720 to the center of the third column conductive structure 776. The resistive change element cell 730 and the fourth column conductive structure 778 are arranged on the third level such that the resistive change element cell 730 and the fourth column conductive structure 778 would form substantially right triangles with resistive change element cells placed in the unoccupied corners of a third plate conductive structure 775. The right triangles would have a hypotenuse of 4F, a side of 2F, and a side of $F\sqrt{12}$. The right triangles can be drawn by drawing lines from the center of the fourth column conductive structure 778 to the center of a resistive change element cell located in an unoccupied corner of the third plate conductive structure 775, from the center of the resistive change element cell located in an unoccupied corner of the third plate conductive structure 775 to the center of the resistive change element cell 730, and from the center of resistive change element cell 730 to the center of the fourth column conductive structure 778. The resistive change element cell 740 is arranged on the fourth level such that resistive change element cell 740 is generally aligned with the fourth column conductive structure 778. Alternatively, the resistive change element cells 710, 720, 730, 740, the second column conductive structure 774, the third column conductive structure 776, and the fourth column conductive structure 778 can be arranged to form other shapes, such as polygons other than right triangles, circles, ovals, and irregular shapes. Alternatively, the resistive change element cells 710, 720, 730, 740, the second column conductive structure 774, the third column conductive structure 776, and the fourth column conductive structure 778 can be arranged in patterns. It is noted that the resistive change element cells 710, 720, 730, 740, the second column conductive structure 774, the third column conductive structure 776, and the fourth column conductive structure 778 can be considered to form substantially right triangles, substantially other shapes, or substantially patterns when the resistive change element cells 710, 720, 730, 740, the second column conductive structure 774, the third column conductive structure 776, and the fourth column conductive structure 778 form exact right triangles, exact other shapes, or exact patterns, and when the resistive change element cells 710, 720, 730, 740, the second column conductive structure 774, the third column conductive structure 776, and the fourth column conductive structure 778 form right triangles, other shapes, or patterns that are not exact right triangles, exact other shapes, or exact patterns due to variations caused by the fabrication process. It is also noted that resistive change element cells and the column conductive structures on different level can be arranged in different shapes and/or patterns. It is further noted that the resistive change element cells and the column conductive structures are required to be separated by a distance of at least 1F.

The selection device 750 includes a drain terminal 752, a source terminal 754, a gate dielectric 756, and a gate terminal 758. The gate dielectric 756 is formed on the substrate 760 and the gate terminal 758 is formed on the gate dielectric 756. Alternatively, the gate terminal 758 can be part of an array line, such as a word line. Alternatively, the drain terminal 752, the source terminal 754, and the gate dielectric 756 can be formed on a layer of material, such as a nanotube fabric layer, deposited on the substrate 760 and the gate terminal 758 can be formed on the gate dielectric 756. The substrate 760 can be formed from a conductive material, a semiconductor material, or an insulating material as required by the needs of a specific application.

The resistive change element cell 710 is electrically connected to the drain terminal 752 of the selection device 750 through a first plate conductive structure 771 and a first column conductive structure 772. The first plate conductive structure 771 has a substantially rectangular horizontal cross-sectional shape that encompasses the resistive change element cell 710 and the second column conductive structure 774. The first plate conductive structure has a width dimension of 3F and a length dimension of approximately 4.5F, these dimensions are the dimensions for the smallest rectangle that encompasses the resistive change element cell 710 and the second column conductive structure 774 on the first level. The width dimension of the first plate conductive structure 771 can be calculated by width dimension=the diameter of the second column conductive structure 774+ minimum feature size F+the diameter of a resistive change element cell, width dimension=1F+1F+1F. The length dimension of the first plate conductive structure 771 can be calculated by length dimension=side of the right triangle along the x-axis+the radius of a resistive change element+ the radius of a resistive change element, length=F$\sqrt{12}$+0.5F+0.5F. It is noted that the dimensions of the first plate conductive structure 771 are not limited to the dimensions for the smallest rectangle that encompasses the resistive change element cell 710 and the second column conductive structure 774 on the first level. Alternatively, the first plate conductive structure 771 can have a horizontal cross-sectional shape that extends beyond the edges of the resistive change element 710 and the second column conductive structure 774 on the first level. Alternatively, the first plate conductive structure 771 can have a horizontal cross-sectional shape that does not encompass the resistive change element cell 710 and the second column conductive structure 774 on the first level. For example, when the first plate conductive structure 771 has a horizontal cross-sectional shape that does not encompass the resistive change element cell 710 and the second column conductive structure 774 on the first level, at least one of the resistive change element cell 710 and the second column conductive structure 774 can extend beyond the first plate conductive structure 771. Alternatively, the first plate conductive structure 771 can have a non-rectangular horizontal cross-sectional shape, such as a substantially circular horizontal cross-sectional shape, a substantially oval horizontal cross-sectional shape, a substantially triangular horizontal cross-sectional shape, a substantially trapezoidal horizontal cross-sectional shape, and an irregular horizontal cross-sectional shape. It is noted that the first plate conductive structure 771 can be considered to have a substantially rectangular horizontal cross-sectional shape when the first plate conductive structure 771 has a horizontal cross-sectional shape that is exactly a rectangle and when the first plate conductive structure 771 has a horizontal cross-sectional shape that is not exactly a rectangle due to variations caused by the fabrication process.

The resistive change element cell 720 is electrically connected to the drain terminal 752 of the selection device 750 through a second plate conductive structure 773, the second column conductive structure 774, the first plate conductive structure 771, and the first column conductive structure 772. The second plate conductive structure 773 has a substantially rectangular horizontal cross-sectional shape that encompasses the resistive change element cell 720 and the third column conductive structure 776 on the second level. The second plate conductive structure 773 has a width dimension of 3F and a length dimension of approximately 4.5F, these dimensions are the dimensions for the smallest rectangle that encompasses the resistive change element cell 720 and the third column conductive structure 776 on the second level. The width dimension of the second plate conductive structure 773 can be calculated by width dimension=the diameter of the third column conductive structure 776+minimum feature size F+the diameter of a resistive change element cell, width dimension=1F+1F+1F. The length dimension of the second plate conductive structure 773 can be calculated by length dimension =side of the right triangle along the x-axis+the radius of a resistive change element+the radius of a resistive change element, length=F$\sqrt{12}$+0.5F+0.5F. It is noted that the dimensions of the second plate conductive structure 773 are not limited to the dimensions for the smallest rectangle that encompasses the resistive change element cell 720 and the third column conductive structure 776 on the second level. Alternatively, the second plate conductive structure 773 can have a horizontal cross-sectional shape that extends beyond the edges of the resistive change element cell 720 and the third column conductive structure 776 on the second level. Alternatively, the second plate conductive structure 773 can have a horizontal cross-sectional shape that does not encompass the resistive change element cell 720 and the third column conductive structure 776 on the second level. For example, when the second plate conductive structure 773 has a horizontal cross-sectional shape that does not encompass the resistive change element cell 720 and the third column conductive structure 776 on the second level, at least one of the resistive change element cell 720 and the third column conductive structure 776 can extend beyond the second plate conductive structure 773. Alternatively, the second plate conductive structure 773 can have a non-rectangular horizontal cross-sectional shape, such as a substantially circular horizontal cross-sectional shape, a substantially oval horizontal cross-sectional shape, a substantially triangular horizontal cross-sectional shape, a substantially trapezoidal horizontal cross-sectional shape, and an irregular horizontal cross-sectional shape. It is noted that the second plate conductive structure 773 can be considered to have a substantially rectangular horizontal cross-sectional shape when the second plate conductive structure 773 has a horizontal cross-sectional shape that is exactly a rectangle and when the second plate conductive structure 773 has a horizontal cross-sectional shape that is not exactly a rectangle due to variations caused by the fabrication process.

The resistive change element cell 730 is electrically connected to the drain terminal 752 of the selection device 750 through a third plate conductive structure 775, the third column conductive structure 776, the second plate conductive structure 773, the second column conductive structure 774, the first plate conductive structure 771, and the first column conductive structure 772. The third plate conductive structure 775 has a substantially rectangular horizontal cross-sectional shape that encompasses the resistive change element cell 730 and the fourth column conductive structure 778 on the third level. The third plate conductive structure 775 has a width dimension of 3F and a length dimension of approximately 4.5F, these dimensions are the dimensions for the smallest rectangle that encompasses the resistive change element cell 730 and the fourth column conductive structure 778 on third level. The width dimension of the third plate conductive structure 775 can be calculated by width dimension=the diameter of the fourth column conductive structure 778+minimum feature size F+the diameter of a resistive change element cell, width dimension=1F+1F+1F. The length dimension of the third plate conductive structure 775 can be calculated by length dimension=side of the right triangle along the x-axis+the radius of a resistive change element+the radius of a resistive change element, length=F$\sqrt{12}$+0.5F+0.5F. It is noted that the dimensions of the third plate conductive structure 775 are not limited to the dimensions for the smallest rectangle that encompasses the resistive change element cell 730 and the fourth column conductive structure 778 on the third level. Alternatively, the third plate conductive structure 775 can have a horizontal cross-sectional shape that extends beyond the edges of the resistive change element cell 730 and the fourth column conductive structure 778 on the third level. Alternatively, the third plate conductive structure 775 can have a horizontal cross-sectional shape that does not encompass the resistive change element cell 730 and the fourth column conductive structure 778 on the third level. For example, when the third plate conductive structure 775 has a horizontal cross-sectional shape that does not encompass the resistive change element cell 730 and the fourth column conductive structure 778 on the third level, at least one of the resistive change element cell 730 and the fourth column conductive structure 778 can extend beyond the third plate conductive structure 775. Alternatively, the third plate conductive structure 775 can have a non-rectangular horizontal cross-sectional shape, such as a substantially circular horizontal cross-sectional shape, a substantially oval horizontal cross-sectional shape, a substantially triangular horizontal cross-sectional shape, a substantially trapezoidal horizontal cross-sectional shape, and an irregular horizontal cross-sectional shape. It is noted that the third plate conductive structure 775 can be considered to have a substantially rectangular horizontal cross-sectional shape when the third plate conductive structure 775 has a horizontal cross-sectional shape that is exactly a rectangle and when the third plate conductive structure 775 has a horizontal cross-sectional shape that is not exactly a rectangle due to variations caused by the fabrication process.

The resistive change element cell 740 is electrically connected to the drain terminal 752 of the selection device 750 through a fourth plate conductive structure 777, the fourth column conductive structure 778, the third plate conductive structure 775, the third column conductive structure 776, the second plate conductive structure 773, the second column conductive structure 774, the first plate conductive structure 771, and the first column conductive structure 772. The fourth plate conductive structure 777 has a substantially square horizontal cross-sectional shape that encompasses the resistive change element cell 740 on the fourth level. The fourth plate conductive structure 777 has a width dimension of 1F and a length dimension of 1F, these dimensions are the dimensions for the smallest square that encompasses the resistive change element cell 740 on the fourth level. It is noted that the dimensions of the fourth plate conductive structure 777 are not limited to the dimensions for the smallest square that encompasses the resistive change element cell 740 on the fourth level. Alternatively, the fourth plate conductive structure 777 can have a horizontal cross-sectional shape that extends beyond the edges of the resistive change element cell 740 on the fourth level. Alternatively, the fourth plate conductive structure 777 can have a horizontal cross-sectional shape that does not encompass the resistive change element cell 740 on the fourth level. For example, when the fourth plate conductive structure 777 has a horizontal cross-sectional shape that does not encompass the resistive change element cell 740 on the fourth level, the resistive change element cell 740 can extend beyond the fourth plate conductive structure 777. Alternatively, the fourth plate conductive structure 777 can have a non-square horizontal cross-sectional shape, such as a substantially rectangular horizontal cross-sectional shape other than a substantially square horizontal cross-sectional shape, a substantially circular horizontal cross-sectional shape, a substantially oval horizontal cross-sectional shape, a substantially triangular horizontal cross-sectional shape, a substantially trapezoidal horizontal cross-sectional shape, and an irregular horizontal cross-sectional shape, that encompasses the layout of the resistive change element cell 740. Alternatively, the fourth plate conductive structure 777 can be omitted and the resistive change element cell 740 can be in contact with the fourth column conductive structure 778. It is noted that the fourth plate conductive structure 777 can be considered to have a substantially square horizontal cross-sectional shape when the fourth plate conductive structure 777 has a horizontal cross-sectional shape that is exactly a square and when the fourth plate conductive structure 777 has a horizontal cross-sectional shape that is not exactly a square due to variations caused by the fabrication process.

Each of the first column conductive structure 772, the second column conductive structure 774, the third column conductive structure 776, and the fourth column conductive structure 778 has a substantially circular horizontal cross-sectional shape. The first column conductive structure 772 has a diameter approximately equal to 1F and a height greater than the sum of the thicknesses of the gate dielectric 756 and the gate terminal 758. Alternatively, the first column conductive structure 772 can have diameter greater than 1F. The second column conductive structure 774 has a diameter approximately equal to 1F and a height greater than the sum of the height of the resistive change element cell 710 and an array line, such as a source line. Alternatively, the second column conductive structure 774 can have a diameter greater than 1F. The third column conductive structure 776 has a diameter approximately equal to 1F and a height greater than the sum of the height of the resistive change element cell 720 and an array line, such as a source line. Alternatively, the third column conductive structure 776 can have a diameter greater than 1F. The fourth column conductive structure 778 has a diameter approximately equal to 1F and a height greater than the sum of the height of the resistive change element cell 730 and an array line, such as a source line. Alternatively, the fourth column conductive structure 778 can have a diameter greater than 1F. Alternatively, each of the first column conductive structure 772, the second column conductive structure 774, the third column conductive structure 776, and the fourth column conductive structure 778 can have a non-circular horizontal cross-sectional shape, such as a substantially rectangular horizontal cross-sectional shape, a substantially oval horizontal cross-sectional shape, a substantially triangular horizontal cross-sectional shape, a substantially trapezoidal horizontal cross-sectional shape, an irregular horizontal cross-sectional shape, and a non-uniform horizontal cross-sectional shape where different sections of the column conductive structures 772, 774, 776, 778 can have different dimensions. Alternatively, the resistive change element cell 710 can be electrically connected to the drain terminal 752 of the selection device 750 by other conductive structures, such as a plate conductive structure and at least two column conductive structures, the resistive change element cell 720 can be electrically connected to the drain terminal 752 of the selection device 750 by other conductive structures, such as at least two plate conductive structures and at least three column conductive structures, the resistive change element cell 730 can be electrically connected to the drain terminal 752 of the selection device 750 by other conductive structures, such as at least three plate conductive structures and at least four column conductive structures, and the resistive change element cell 740 can be electrically connected to the drain terminal 752 of the selection device 750 by other conductive structures, such as at least three plate conductive structures and at least five column conductive structures. It is also noted that the first column conductive structure 772 can be considered to have a substantially circular horizontal cross-sectional shape when the first column conductive structure 772 has a horizontal cross-sectional shape that is exactly a circle and when the first column conductive structure 772 has a horizontal cross-sectional shape that is not exactly a circle due to variations caused by the fabrication process. It is also noted that the second column conductive structure 774 can be considered to have a substantially circular horizontal cross-sectional shape when the second column conductive structure 774 has a horizontal cross-sectional shape that is exactly a circle and when the second column conductive structure 774 has a horizontal cross-sectional shape that is not exactly a circle due to variations caused by the fabrication process. It is also noted that the third column conductive structure 776 can be considered to have a substantially circular horizontal cross-sectional shape when the third column conductive structure 776 has a horizontal cross-sectional shape that is exactly a circle and when the third column conductive structure 776 has a horizontal cross-sectional shape that is not exactly a circle due to variations caused by the fabrication process. It is also noted that the fourth column conductive structure 778 can be considered to have a substantially circular horizontal cross-sectional shape when the fourth column conductive structure 778 has a horizontal cross-sectional shape that is exactly a circle and when the fourth column conductive structure 778 has a horizontal cross-sectional shape that is not exactly a circle due to variations caused by the fabrication process.

The selection device 750 occupies a substantially rectangular surface area shape of the substrate 760. The selection device 750 has a width WD7 of 3F and a length LD7 of 4.5F. Thus, the substantially rectangular surface area shape occupied by the selection device 750 generally corresponds with the substantially rectangular horizontal cross-sectional shape of the first plate conductive structure 771 located above the selection device 750. For example, when the selection device 750 occupies a rectangular surface area shape with a width of 3F and a length of 4.5F, the rectangular horizontal cross-sectional shape of the first plate conductive structure 771 has a width dimension of 3F and a length dimension of 4.5F, and F is 10 nm, the selection device 750 occupies an area of 1,350 nm$^2$ of the substrate 760 and the rectangular horizontal cross-sectional shape of the first plate conductive structure 771 has an area of 1,350 nm$^2$. Alternatively, the substantially rectangular surface area shape occupied by the selection device 750 can extend beyond the substantially rectangular horizontal cross-sectional shape of the first plate conductive structure 771, the substantially rectangular horizontal cross-sectional shape of the first plate conductive structure 771 can extend beyond the substantially rectangular surface area shape occupied by the selection device 750, and the substantially rectangular horizontal cross-sectional shape of the first plate conductive structure 771 can cover at least part of the substantially rectangular surface area shape occupied by the selection device 750. Alternatively, the selection device 750 can occupy a substantially square surface area shape, or a non-rectangular surface area shape, such as a substantially trapezoidal surface area shape and an irregular surface area shape. It is noted that the selection device 750 can be considered to occupy a substantially rectangular surface area shape of a substrate when the selection device 750 occupies a surface area shape of a substrate that is exactly a rectangle and when the selection device 750 occupies a surface area shape of a substrate that is not exactly a rectangle due to variations caused by the fabrication process.

When the resistive change element cells 710, 720, 730, 740 sharing the selection device 750 as discussed above with respect to FIGS. 7A-7B, are part of a resistive change element array including a plurality of resistive change element cells and a plurality of selection devices arranged in a group of four resistive change element cells sharing one selection device configuration where each group of four resistive change element cells sharing one selection device has the same structure as the resistive change element cells 710, 720, 730, 740 sharing the selection device 750 as discussed above with respect to FIGS. 7A-7B, a surface area shape of a substrate required for a selection device to be adjacently located to other selection devices in the resistive change element array is greater than a rectangular surface area shape occupied by a selection device and a shape required for a group of resistive change element cells to be adjacently located to other groups of resistive change element cells in the resistive change element array is greater than a combined shape that encompasses a four level layout of a group of resistive change element cells. The surface area shape of a substrate required for a selection device to be adjacently located is greater than the rectangular surface area shape occupied by a selection device because the selection devices are required to be separated by at least 1F. For example, when the selection device 750 occupies a rectangular surface area shape with a width of 3F and a length of 4.5F and adjacent selection devices are separated by 1F, the surface area shape of a substrate required for a selection device to be adjacently located can be approximated by a rectangle with a width of 4F and a length of 5.5F.

The combined shape that encompasses a four level layout of a group of resistive change element cells is formed by the smallest rectangle that encompasses the first level, the smallest rectangle that encompasses the second level, the smallest rectangle that encompasses the third level, and the smallest square that encompasses the fourth level because the smallest rectangle that encompasses the second level covers at least part of the smallest rectangle that encompasses the first level, the smallest rectangle that encompasses the third level covers at least part of the smallest rectangle that encompasses the second level and at least part of the smallest rectangle that encompasses the first level, and the smallest square that encompasses the fourth level covers at least part of the smallest rectangle that encompasses the third level and at least part of the smallest rectangle the encompasses the second level and at least part of the smallest rectangle that encompasses the first level. The combined shape that encompasses a four level layout of a group of resistive change element cells has an outline defined by the part of the smallest rectangle that encompasses the first level, the part of the smallest rectangle that encompasses the second level, and the part of the smallest rectangle that encompasses the third level that are covered by another rectangle (it is noted that a square is a rectangle), the part of the smallest rectangle that encompasses the first level, the part of the smallest rectangle that encompasses the second level, and the part of the smallest rectangle that encompasses the third level that are not covered by another rectangle, and the part of the smallest square that encompasses the fourth level that does not cover another rectangle. As discussed above, the first plate conductive structure 771 has a horizontal cross-sectional shape that corresponds with the smallest rectangle that encompasses the first level, the second conductive plate structure 773 has a horizontal cross-sectional shape that corresponds with the smallest rectangle that encompasses the second level, the third plate conductive structure 775 has a horizontal cross-sectional shape that corresponds with the smallest rectangle that encompasses the third level, and the fourth plate conductive structure 777 has a horizontal cross-sectional shape that corresponds with the smallest square that encompasses the fourth level. For example, when the first plate conductive structure 771, the second plate conductive structure 773, the third plate conductive structure 775, and the fourth plate conductive structure 777 are arranged so that a combined shape that encompasses a four level layout of a group of resistive change element cells corresponds with the horizontal cross-sectional shape of the first plate conductive structure 771, the combined shape that encompasses a four level layout of a group of resistive change element cells can be approximated by a rectangle having a width of 3F and a length of 4.5F.

The shape required for a group of resistive change element cells to be adjacently located is greater than the combined shape that encompasses a four level layout of a group of resistive change element cells because the resistive change element cells and the column conductive structures are required to be separated by at least 1F. For example, when the combined shape that encompasses a four level layout of a group of resistive change element cells has a width of 3F and length of 4.5F and the resistive change element cells and the column conductive structures are separated by 1F, the shape required for a group of resistive change element cells to be adjacently located can be approximated by a rectangle with a width of 4F and length of 5.5F.

When the resistive change element cells 710, 720, 730, 740 sharing the selection device 750 as discussed above with respect to FIGS. 7A-7B, are part of a resistive change element array including a plurality of resistive change element cells and a plurality of selection devices arranged in a group of four resistive change element cells sharing one selection device configuration where each group of four resistive change element cells sharing one selection device has the same structure as the resistive change element cells 710, 720, 730, 740 sharing the selection device 750 as discussed above with respect to FIGS. 7A-7B, a surface area of a substrate required for a group of resistive change element cells sharing a selection device is based on a combined shape formed by the shape required for a group of resistive change element cells to be adjacently located and the surface area shape of a substrate required for a selection device to be adjacently located. The surface area of a substrate required for a group of resistive change element cells sharing a selection device is based on the combined shape because the resistive change element cells 710, 720, 730, 740 are positioned above the selection device 750 such that an area of the substrate covered by the shape required for a group of resistive change element cells to be adjacently located covers at least part of the surface area shape of a substrate required for a selection device to be adjacently located. The combined shape has an outline defined by the part of the shape required for a group of resistive change element cells to be adjacently located that covers part of the surface area shape of a substrate required for a selection device to be adjacently located, the part of the shape required for a group of resistive change element cells to be adjacently located that does not cover the surface area shape of a substrate required for a selection device to be adjacently located, and the part of the surface area shape of a substrate required for a selection device to be adjacently located that is not covered by the shape required for a group of resistive change element cells to be adjacently located.

Alternatively, when a shape required for a group of resistive change element cells to be adjacently located encompasses a surface area shape of a substrate required for a selection device to be adjacently located and the resistive change element cells 710, 720, 730, 740 are positioned above the selection device 750 such that an area of the substrate covered by the shape required for a group of resistive change element cells to be adjacently located encompasses the surface area shape of a substrate required for a selection device to be adjacently located, a surface area of the substrate required for a group of resistive change element cells sharing a selection device is based on the shape required for a group of resistive change element cells to be adjacently located. Alternatively, when the surface area shape of a substrate required for a selection device to be adjacently located encompasses the shape required for a group of resistive change element cells to be adjacently located and the resistive change element cells 710, 720, 730, 740 are positioned above the selection device 750 such that an area of the substrate covered by the shape required for a group of resistive change element cells to be adjacently located is encompassed by the surface area shape of a substrate required for a selection device to be adjacently located, a surface area shape of a substrate required for a group of resistive change element cells sharing a selection device is based on the surface area shape of a substrate required for a selection device to be adjacently located.

Resistive change element cell density of a resistive change element array is based on a surface area of a substrate required for a resistive change element cell, and thus, resistive change element cell density in the resistive change element array including a plurality of resistive change element cells and a plurality of selection devices arranged in a group of four resistive change element cells sharing one selection device configuration where each group of four resistive change element cells sharing one selection device in the resistive change element array has the same structure as the resistive change element cells 710, 720, 730, 740 sharing the selection device 750 as discussed above with respect to FIGS. 7A-7B is based on the combined shape formed by the shape required for a group of resistive change element cells to be adjacently located and the surface area shape of a substrate required for a selection device to be adjacently located. For example, when a shape required for a group of resistive change element cells to be adjacently located can be approximated by a rectangle with a width of 4F and a length of 5.5F, a surface area shape of a substrate required for a selection device to be adjacently located can be approximated by a rectangle with a width of 4F and a length of 5.5F, the resistive change element cells 710, 720, 730, 740 are positioned above the selection device 750 such that the combined shape is a rectangle with a width of 4F and a length of 5.5F, and F is 10 nm, the resistive change element cell density is one resistive change element cell per an area of 550 nm$^2$ of the substrate.

In the above example, the four resistive change element cells 710, 720, 730, 740 sharing the selection device 750 have a resistive change element cell density of one resistive change element cell per an area of 550 nm$^2$ of area of the substrate and in the examples further above the resistive change element cell 110 and the resistive change element cell 111 have a resistive change element cell density of one resistive change element cell per an area of 2,200 nm$^2$ of area of the substrate. Thus, in these examples the resistive change element cells 710, 720, 730, 740 sharing the selection device 750 have a resistive change element cell density approximately four times greater than a resistive change element cell density of the resistive change element cell 110 and the resistive change element cell 111.

When the resistive change element cells 710, 720, 730, 740 sharing the selection device 750 as discussed above with respect to FIGS. 7A-7B, are part of a resistive change element array including a plurality of resistive change element cells and a plurality of selection devices arranged in a group of four resistive change element cells sharing one selection device configuration where each group of four resistive change element cells sharing one selection device has the same structure as the resistive change element cells 710, 720, 730, 740 sharing the selection device 750 as discussed above with respect to FIGS. 7A-7B, source lines are in electrical communication with top electrodes of resistive change element cells, word lines are in electrical communication with gate terminals of selection devices, and bit lines are in electrical communication with source terminals of selection devices. FIGS. 7A-7B show source lines SL71, SL72, SL73, SL74 in electrical communication with the top electrodes 716, 726, 736, 746 of the resistive change element cells 710, 720, 730, 740 and a bit line BL71 in electrical communication with the source terminal 754 of the selection device 750. Alternatively, the top electrodes 716, 726, 736, 746 of the resistive change element cells 710, 720, 730, 740 are in electrical communication with the source lines SL71, SL72, SL73, SL74 through conductive structures. The gate terminal 758 of the selection device 750 can be part of a word line WL71, alternatively, the gate terminal 758 can be in electrical communication with a word line WL71. Further, intervening layers, such as barrier metal layers to provide a barrier to metal migration, can be included to provide a barrier to metal migration from the source lines SL71, SL72, SL73, SL74, the bit line BL71, and/or the word line WL71. It is noted that when the resistive change element cells 710, 720, 730, 740 and the selection device 750 are part of a resistive change element array including a plurality of resistive change element cells and a plurality of selection devices arranged in a group of four resistive change element cells sharing one selection device configuration, as discussed above, the regions around the resistive change element cells 710, 720, 730, 740, the gate dielectric 756, the gate terminal 758, the first plate conductive structure 771, the first column conductive structure 772, the second plate conductive structure 773, the second column conductive structure 774, the third plate conductive structure 775, the third column conductive structure 776, the fourth plate conductive structure 777, the fourth column conductive structure 778, the source lines SL71, SL72, SL73, SL74, the bit line BL71, and the word line WL71 can be filled with a dielectric. It is further noted that the resistive change element cells 710, 720, 730, 740 can be sealed by thin dielectric sidewall films, as described in U.S. patent application Ser. No. 15/486,032, prior to filling the regions around the resistive change elements 710, 720, 730, 740 with the dielectric.

Further, when the resistive change element cells 710, 720, 730, 740 sharing the selection device 750 as discussed above with respect to FIGS. 7A-7B are part of a resistive change element array including a plurality of resistive change element cells and a plurality of selection devices arranged in a group of four resistive change element cells sharing one selection device configuration where each group of four resistive change element cells sharing one selection device has the same structure as the resistive change element cells 710, 720, 730, 740 sharing the selection device 750 as discussed above with respect to FIGS. 7A-7B, neighboring resistive change element cells and column conductive structures on the same levels of different structures can form substantially equilateral triangles. For example, when a group of resistive change element cells sharing a selection device is located in front of the group of four resistive change element cells resistive change element cells 710, 720, 730, 740 sharing the selection device 750 and the smallest rectangles encompassing the first levels, smallest rectangles encompassing the second levels, and the smallest rectangles encompassing the third levels are separated by a distance of 1F, the resistive change element cell 710, the second column conductive structure 774, and a resistive change element cell located in the position of resistive change element cell 710 in the front group form an equilateral triangle having sides 4F in length, the resistive change element cell 720, the third column conductive structure 776, and a resistive change element cell located in the position of resistive change element cell 720 in the front group form an equilateral triangle having sides 4F in length, and the resistive change element cell 730, the fourth column conductive structure 778, and a resistive change element cell located in the position of resistive change element cell 730 in the front group form an equilateral triangle having sides 4F in length. In the above example, it is noted that the resistive change element cell 740 does not form an equilateral triangle with a resistive change element cell located in the position of resistive change element cell 740 in the front group.

For example, when a group of resistive change element cells sharing a selection device is located in back of the group of four resistive change element cells resistive change element cells 710, 720, 730, 740 sharing the selection device 750 and the smallest rectangles encompassing the first levels, the smallest rectangles encompassing the second levels, and the smallest rectangles encompassing third levels are separated by a distance of 1F, the resistive change element cell 710, the second column conductive structure 774, and a second column conductive structure located in the position of second column conductive structure 774 in the back group form an equilateral triangle having sides 4F in length, the resistive change element cell 720, the third column conductive structure 776, and a third column conductive structure located in the position of third column conductive structure 776 in the back group form an equilateral triangle having sides 4F in length, and the resistive change element cell 730, the fourth column conductive structure 778, and a fourth column conductive structure located in the position of fourth column conductive structure 778 in the back group form an equilateral triangle having sides 4F in length. In the above example, it is noted that the resistive change element cell 740 does not form an equilateral triangle with a resistive change element cell located in the position of resistive change element cell 740 in the back group.

Alternatively, neighboring resistive change element cells and column conductive structures on the same levels of different structures can be arranged to form other shapes, such as polygons other than equilateral triangles, circles, ovals, and irregular shapes. Alternatively, neighboring resistive change element cells and column conductive structures on the same levels of different structures can be arranged in patterns. It is noted that neighboring resistive change element cells and column conductive structure on the same levels of different structures can be considered to form substantially equilateral triangles, substantially other shapes, or substantially patterns when the neighboring resistive change element cells and column conductive structures on the same level of different structures form exact equilateral triangles, exact other shapes, or exact patterns, and when neighboring resistive change element cells and column conductive structures on the same level of different structure form equilateral triangles, other shapes, or patterns that are not exact equilateral triangles, exact other shapes, or exact patterns due to variations caused by the fabrication process. It is also noted that resistive change element cells and the column conductive structures on different level can be arranged in different shapes and/or patterns. It is further noted that the resistive change element cells and the column conductive structures are required to be separated by a distance of at least 1F.

Figure 8A:
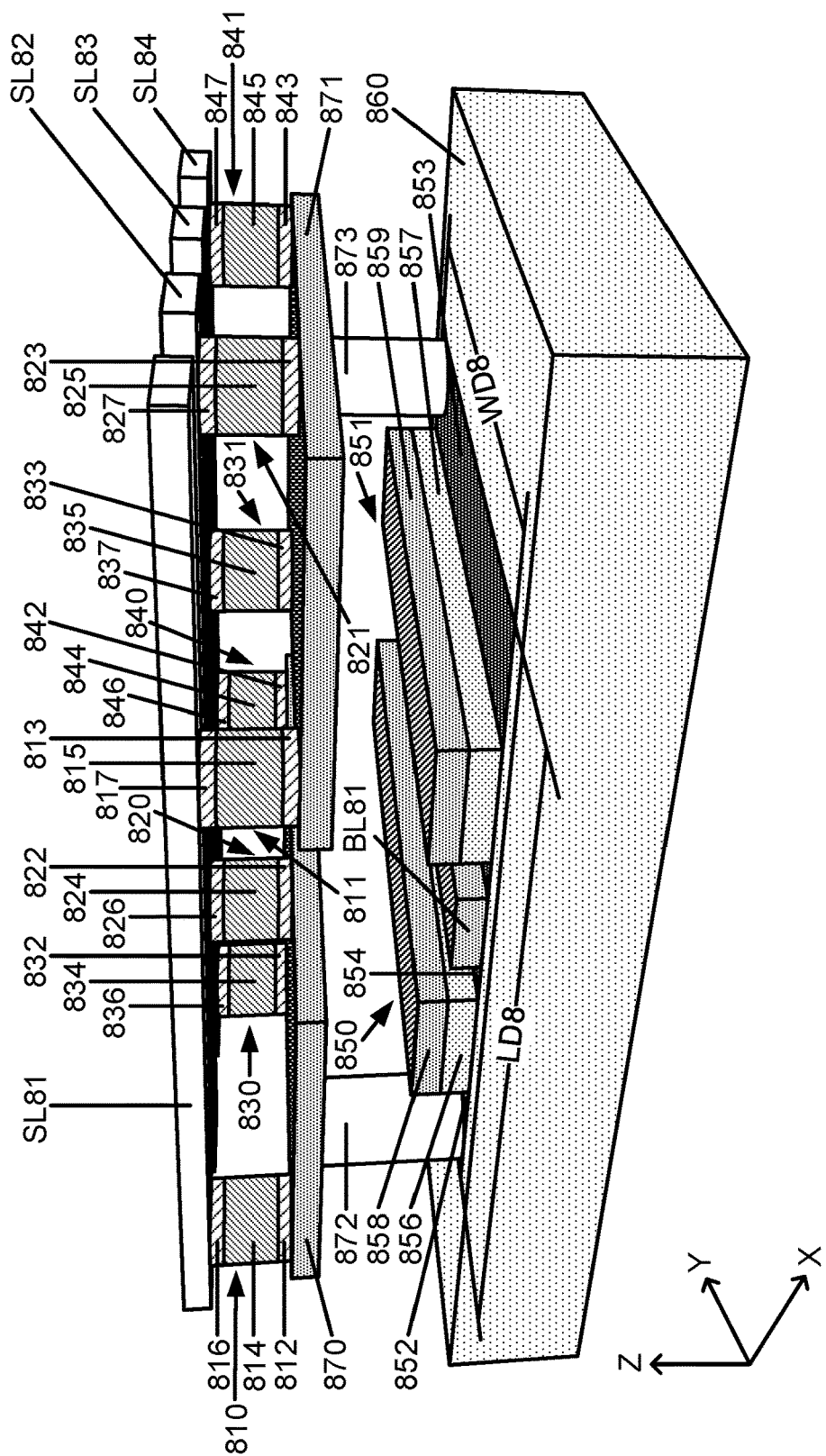
FIG. 8A illustrates a three-dimensional view of a first group of four resistive change element cells sharing a first selection device and a second group of four resistive change element cells sharing a second selection device, where the first selection device and the second selection device have a common source terminal.
Figure 8B:
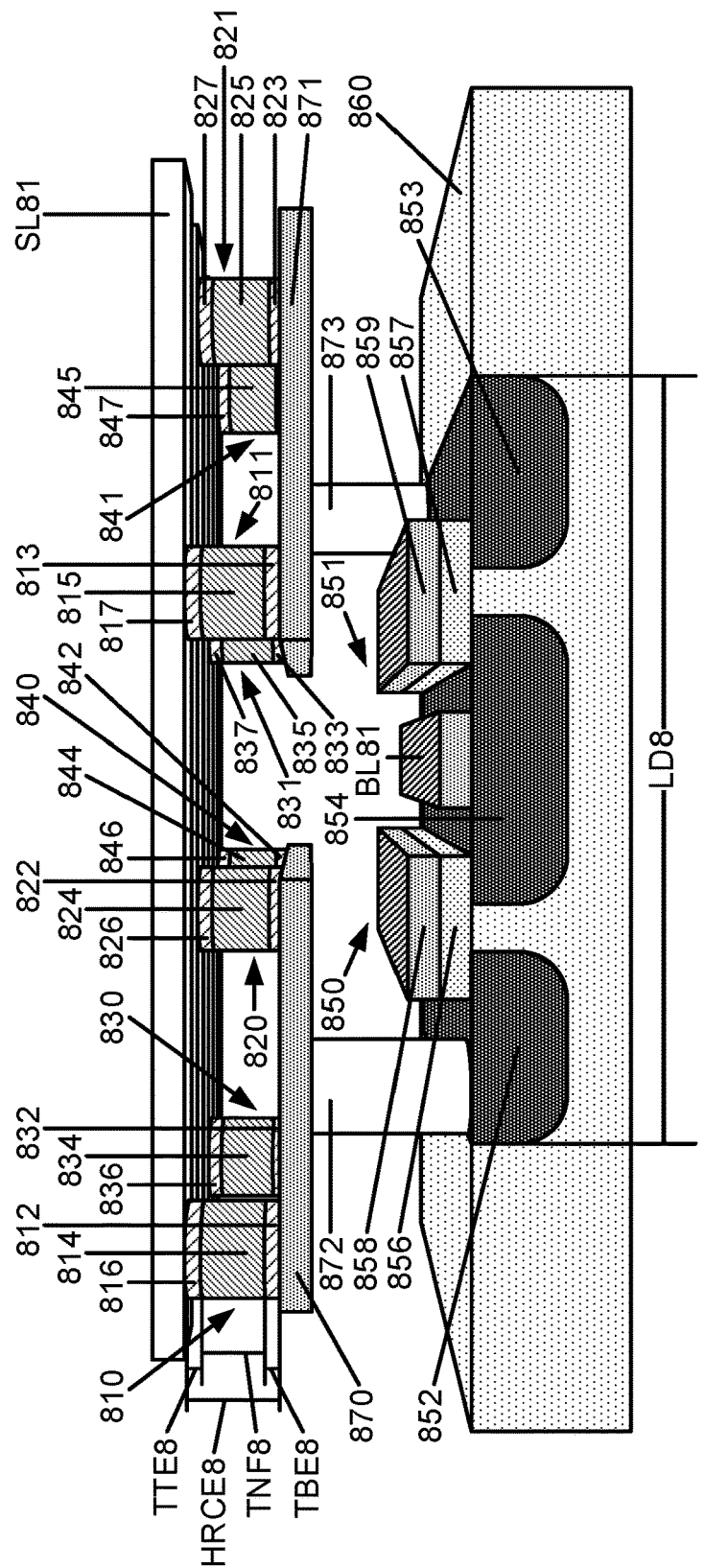
FIG. 8B illustrates a vertical cross-sectional view of the first group of four resistive change element cells sharing a first selection device and the second group of four resistive change element cells sharing a second selection device of FIG. 8A.
Figure 8C:
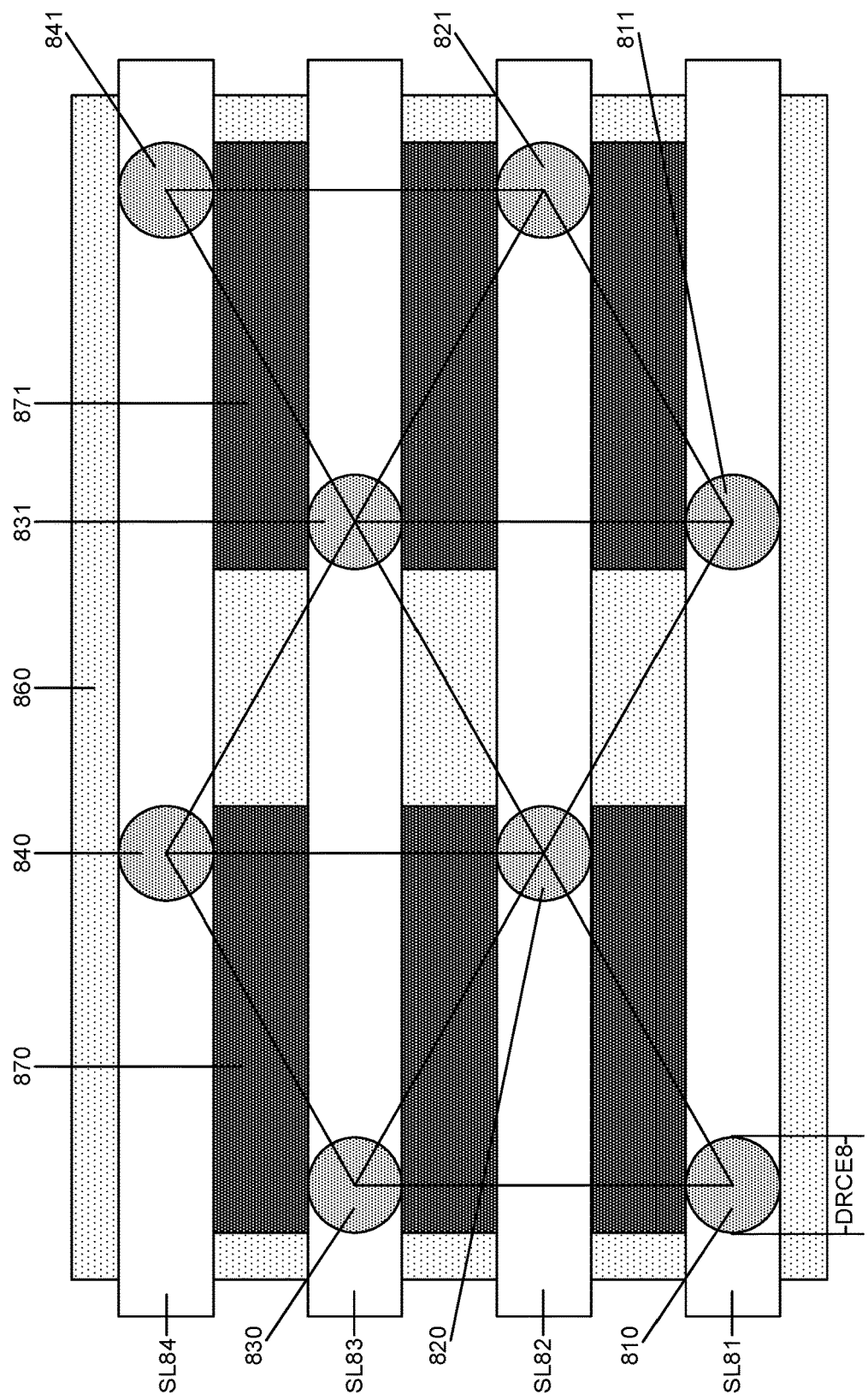
FIG. 8C illustrates a top view of the first group of four resistive change element cells sharing a first selection device and the second group of four resistive change element cells sharing a second selection device of FIG. 8A, where the first selection device and the second selection device are not shown so that the layout for the resistive change element cells can be shown more clearly.

FIG. 8A illustrates a three-dimensional view of a first group of four resistive change element cells 810, 820, 830, 840 sharing a first selection device 850 and a second group of four resistive change element cells 811, 821, 831, 841 sharing a second selection device 851, where the first selection device 850 and the second selection device 851 have a common source terminal. FIG. 8B illustrates a vertical cross-sectional view of the first group of four resistive change element cells 810, 820, 830, 840 sharing the first selection device 850 and the second group of four resistive change element cells 811, 821, 831, 841 sharing the second selection device 851. FIG. 8C illustrates a top view of the one level layout of the first group of four resistive change element cells 810, 820, 830, 840 and the one level layout of the second group of four resistive change element cells 811, 821, 831, 841. FIG. 8C does not show the first selection device 850 and the second selection device 851 so that the one level layouts of the resistive change element cells can be shown more clearly.

Each resistive change element cell 810, 811, 820, 821, 830, 831, 840, 841 can be a two-terminal nanotube switching element, a phase change memory element, a metal oxide memory element, or a conductive bridge memory element as well as other materials and designs, as discussed above with respect to the resistive change elements S000-Sx3y. The first selection device 850 and the second selection device 851 are NMOS transistors arranged such that the two NMOS transistors have a common source terminal. Alternatively, the first selection device 850 and the second selection device 851 can be PMOS transistors arranged such that the two PMOS transistors have a common source terminal. Alternatively, the first selection device 850 and the second selection device 851, can be other types of field effect transistors, such as carbon nanotube field effect transistors (CNTFETs), SiGE FETs, fully-depleted silicon-on-insulator FETs, or multiple gate field effect transistors such as FinFETs, where the two field effect transistors are arranged such that the two field effect transistors to have a common source terminal.

Each resistive change element cell 810, 811, 820, 821, 830, 831, 840, 841 includes a bottom electrode 812, 813, 822, 823, 832, 833, 842, 843, a nanotube fabric layer 814, 815, 824, 825, 834, 835, 844, 845, and a top electrode 816, 817, 826, 827, 836, 837, 846, 847. The bottom electrodes 812, 813, 822, 823, 832, 833, 842, 843 are in contact with the nanotube fabric layers 814, 815, 824, 825, 834, 835, 844, 845 and the top electrodes 816, 817, 826, 827, 836, 837, 846, 847 are in contact with the nanotube fabric layers 814, 815, 824, 825, 834, 835, 844, 845. Alternatively, the resistive change element cells 810, 811, 820, 821, 830, 831, 840, 841 can include at least one intervening layer located between the bottom electrodes 812, 813, 822, 823, 832, 833, 842, 843 and the nanotube fabric layers 814, 815, 824, 825, 834, 835, 844, 845, at least one intervening layer located between the nanotube fabric layers 814, 815, 824, 825, 834, 835, 844, 845 and the top electrodes 816, 817, 826, 827, 836, 837, 846, 847, or at least one intervening layer located between the bottom electrodes 812, 813, 822, 823, 832, 833, 842, 843 and the nanotube fabric layers 814, 815, 824, 825, 834, 835, 844, 845 and at least one intervening layer located between the nanotube fabric layers 814, 815, 824, 825, 834, 835, 844, 845 and the top electrodes 816, 817, 826, 827, 836, 837, 846, 847. Alternatively, the bottom electrodes 812, 813, 822, 823, 832, 833, 842, 843 can be omitted from the resistive change element cells 810, 811, 820, 821, 830, 831, 840, 841, the top electrodes 816, 817, 826, 827, 836, 837, 846, 847 can be omitted from the resistive change element cells 810, 811, 820, 821, 830, 831, 840, 841, or the bottom electrodes 812, 813, 822, 823, 832, 833, 842, 843 and the top electrodes 816, 817, 826, 827, 836, 837, 846, 847 can be omitted from the resistive change element cells 810, 811, 820, 821, 830, 831, 840, 841.

Each resistive change element cell 810, 811, 820, 821, 830, 831, 840, 841 has a substantially circular horizontal cross-sectional shape with a diameter $D_{RCE8}$ and a height $H_{RCE8}$. The diameter $D_{RCE8}$ is approximately equal to 1F and the height $H_{RCE8}$ is approximately equal to the sum of the thicknesses of the bottom electrode, the nanotube fabric layer, and the top electrode of that resistive change element cell. F represents a minimum feature size. The height $H_{RCE8}$ of each resistive change element cell 810, 811, 820, 821, 830, 831, 840, 841 is typically greater than 1F, however, the height $H_{RCE8}$ of each resistive change element cell 810, 811, 820, 821, 830, 831, 840, 841 can be scaled, such that height $H_{RCE8}$ approaches 1F. Alternatively, each resistive change element cell 810, 811, 820, 821, 830, 831, 840, 841 can have a diameter $D_{RCE8}$ greater than 1F. Alternatively, each resistive change element cell 810, 811, 820, 821, 830, 831, 840, 841 can have a non-circular horizontal cross-sectional shape, such as a substantially rectangular horizontal cross-sectional shape, a substantially oval horizontal cross-sectional shape, a substantially triangular horizontal cross-sectional shape, a substantially trapezoidal horizontal cross-sectional shape, an irregular horizontal cross-sectional shape, and a non-uniform horizontal cross-sectional shape where different sections of each resistive change element cell 810, 811, 820, 821, 830, 831, 840, 841 can have different dimensions. The bottom electrodes 812, 813, 822, 823, 832, 833, 842, 843, the nanotube fabric layers 814, 815, 824, 825, 834, 835, 844, 845, and the top electrodes 816, 817, 826, 827, 836, 837, 846, 847 have substantially circular horizontal cross-sectional shapes because the resistive change element cells 810, 811, 820, 821, 830, 831, 840, 841 have substantially circular horizontal cross-sectional shapes. The bottom electrodes 812, 813, 822, 823, 832, 833, 842, 843 have a diameter approximately equal to 1F and a thickness TBE8. The nanotube fabric layers 814, 815, 824, 825, 834, 835, 844, 845 have a diameter approximately equal to 1F and a thickness TNF8. The top electrodes 816, 817, 826, 827, 836, 837, 846, 847 have a diameter approximately equal to 1F and a thickness TTE8. It is noted that the resistive change element cells 810, 811, 820, 821, 830, 831, 840, 841 can be considered to have substantially circular horizontal cross-sectional shapes when the resistive change element cells 810, 811, 820, 821, 830, 831, 840, 841 have horizontal cross-sectional shapes that are exactly circles and when the resistive change element cells 810, 811, 820, 821, 830, 831, 840, 841 have horizontal cross-sectional shapes that are not exactly circles due to variations caused by the fabrication process.

The first group of four resistive change element cells 810, 820, 830, 840 are arranged in a one level layout where three neighboring resistive change element cells form a substantially equilateral triangle. The second group of four resistive change element cells 811, 821, 831, 841 are arranged in a one level layout where three neighboring resistive change element cells form a substantially equilateral triangle. FIG. 8C shows a top view of the one level layout of the first group of four resistive change element cells 810, 820, 830, 840 and the one level layout of the second group of four resistive change element cells 811, 821, 831, 841 with the outlines of the resistive change element cells 810, 811, 820, 821, 830, 831, 840, 841 being shown through source lines SL81-SL84 located above the resistive change element cells 810, 811, 820, 821, 830, 831, 840, 841 so that both one level layouts can be shown more clearly. As shown in FIG. 8C, an equilateral triangle having sides 4F in length can be drawn by drawing lines from the center of the resistive change element cell 810 to the center of resistive change element cell 820, from the center of resistive change element cell 820 to the center of the resistive change element cell 830, and from the center of resistive change element cell 830 to the center of the resistive change element cell 810 and an equilateral triangle having sides 4F in length can be drawn by drawing lines from the center of the resistive change element cell 820 to the center of the resistive change element cell 840, from the center of the resistive change element cell 840 to the center of the resistive change element cell 830, and from the center of the resistive change element cell 830 to the center of the resistive change element cell 820. Also, as shown in FIG. 8C, an equilateral triangle having sides 4F in length can be drawn by drawing lines from the center of the resistive change element cell 811 to the center of resistive change element cell 821, from the center of resistive change element cell 821 to the center of the resistive change element cell 831, and from the center of resistive change element cell 831 to the center of the resistive change element cell 811 and an equilateral triangle having sides 4F in length can be drawn by drawing lines from the center of the resistive change element cell 821 to the center of the resistive change element cell 841, from the center of the resistive change element cell 841 to the center of the resistive change element cell 831, and from the center of the resistive change element cell 831 to the center of the resistive change element cell 821. Alternatively, the resistive change element cells 810, 811, 820, 821, 830, 831, 840, 841 can be arranged to form other shapes, such as polygons other than equilateral triangles, circles, ovals, and irregular shapes. Alternatively, the resistive change element cells 810, 811, 820, 821, 830, 831, 840, 841 can be arranged in patterns. It is noted that the resistive change element cells 810, 811, 820, 821, 830, 831, 840, 841 can be considered to form substantially equilateral triangles, substantially other shapes, or substantially patterns when the resistive change element cells 810, 811, 820, 821, 830, 831, 840, 841 form exact equilateral triangles, exact other shapes, or exact patterns and when the resistive change element cells 810, 811, 820, 821, 830, 831, 840, 841 form equilateral triangles, other shapes, or patterns that are not exact equilateral triangles, exact other shapes or exact patterns due to variations caused by the fabrication process. It is further noted that the resistive change element cells are required to be separated by a distance of at least 1F.

Additionally, the one level layout of the first group of four resistive change element cells 810, 820, 830, 840 and the one level layout of the second group of four resistive change element cells 811, 821, 831, 841 are arranged such that three neighboring resistive change element cells from the two one level layouts form a substantially equilateral triangle. As shown in FIG. 8C, an equilateral triangle having sides 4F in length can be drawn by drawing lines from the center of the resistive change element cell 811 to the center of resistive change element cell 831, from the center of resistive change element cell 831 to the center of the resistive change element cell 820, and from the center of resistive change element cell 820 to the center of the resistive change element cell 811 and an equilateral triangle having sides 4F in length can be drawn by drawing lines from the center of the resistive change element cell 820 to the center of the resistive change element cell 840, from the center of the resistive change element cell 840 to the center of the resistive change element cell 831, and from the center of the resistive change element cell 831 to the center of the resistive change element cell 820. Alternatively, the resistive change element cells 810, 811, 820, 821, 830, 831, 840, 841 can be arranged such that neighboring resistive change element cells from the two one level layouts form other shapes, such as polygons other than equilateral triangles, circles, ovals, and irregular shapes. Alternatively, the resistive change element cells 810, 811, 820, 821, 830, 831, 840, 841 can be arranged such that neighboring resistive change element cells from the two one level layouts form patterns. It is noted that neighboring resistive change element cells from the two one level layouts can be considered to form substantially equilateral triangles, substantially other shapes, or substantially patterns when the neighboring resistive change element cells from the two one level layouts form exact equilateral triangles, exact other shapes, or exact patterns and when the neighboring resistive change element cells from the two one level layouts do not form exact equilateral triangles, exact other shapes, or exact patterns due to variations caused by the fabrication process.

The first selection device 850 includes a drain terminal 852, a common source terminal 854, a gate dielectric 856, and a gate terminal 858. The gate dielectric 856 is formed on the substrate 860 and the gate terminal 858 is formed on the gate dielectric 856. Alternatively, the gate terminal 858 can be part of an array line, such as a word line. The second selection device 851 includes a drain terminal 853, the common source terminal 854, a gate dielectric 857, and a gate terminal 859. The gate dielectric 857 is formed on the substrate 860 and the gate terminal 859 is formed on the gate dielectric 857. Alternatively, the gate terminal 859 can be part of an array line, such as a word line. Alternatively, the drain terminal 852, the drain terminal 853, the common source terminal 854, the gate dielectric 856, and the gate dielectric 857, can be formed on a layer of material, such as a nanotube fabric layer, deposited on the substrate 860, the gate terminal 858 can be formed on the gate dielectric 856, and the gate terminal 859 can be formed on the gate dielectric 857. The substrate 860 can be formed from a conductive material, a semiconductor material, or an insulating material as required by the needs of a specific application.

The first group of four resistive change element cells 810, 820, 830, 840 are electrically connected to the drain terminal 852 of the first selection device 850 through a first plate conductive structure 870 and a first column conductive structure 872. The first plate conductive structure 870 has a substantially rectangular horizontal cross-sectional shape that encompasses the one level layout of the first group of four resistive change element cells 810, 820, 830, 840. The first plate conductive structure 870 has a width dimension of 7F and a length dimension of approximately 4.5F, these dimensions are the dimensions for the smallest rectangle that encompasses the one level layout of the first group of four resistive change element cells 810, 820, 830, 840. The width dimension of the first plate conductive structure 870 can be calculated by width dimension=the diameter of a resistive change element cell+minimum feature size F+the diameter of a resistive change element cell+minimum feature size F+the diameter of a resistive change element cell+minimum feature size F+the diameter of a resistive change element cell, width dimension=1F+1F+1F+1F+1F+1F+1F. The length dimension of the first plate conductive structure 870 can be calculated by length dimension=height of an equilateral triangle+the radius of a resistive change element cell+the radius of a resistive change element cell, length=F$\sqrt{12}$+0.5F+0.5F. It is noted that the dimensions of the first plate conductive structure 870 are not limited to the dimensions for the smallest rectangle that encompasses the one level layout of the first group of four the resistive change element cells 810, 820, 830, 840. Alternatively, the first plate conductive structure 870 can have a horizontal cross-sectional shape that extends beyond the edges of the resistive change element cells 810, 820, 830, 840. Alternatively, the first plate conductive structure 870 can have a horizontal cross-sectional shape that does not encompass the one level layout of the first group of four resistive change element cells 810, 820, 830, 840. For example, when the first plate conductive structure 870 has a horizontal cross-sectional shape that does not encompass the one level layout of the first group of four resistive change element cells 810, 820, 830, 840, at least one of the resistive change element cells 810, 820, 830, 840 can extend beyond the first plate conductive structure 870. Alternatively, the first plate conductive structure 870 can have a non-rectangular horizontal cross-sectional shape, such as a substantially circular horizontal cross-sectional shape, a substantially oval horizontal cross-sectional shape, a substantially triangular horizontal cross-sectional shape, a substantially trapezoidal horizontal cross-sectional shape, and an irregular horizontal cross-sectional shape. It is noted that the first plate conductive structure 870 can be considered to have a substantially rectangular horizontal cross-sectional shape when the first plate conductive structure 870 has a horizontal cross-sectional shape that is exactly a rectangle and when the first plate conductive structure 870 has a horizontal cross-sectional shape that is not exactly a rectangle due to variations caused by the fabrication process.

The second group of resistive change element cells 811, 821, 831, 841 are electrically connected to the drain terminal 853 of the second selection device 851 through a second plate conductive structure 871 and a second column conductive structure 873. The second plate conductive structure 871 has a substantially rectangular horizontal cross-sectional shape that encompasses the one level layout of the second group of four resistive change element cells 811, 821, 831, 841. The second plate conductive structure 871 has a width dimension of 7F and a length dimension of approximately 4.5F, these dimensions are the dimensions for the smallest rectangle that encompasses the one level layout of the second group of four resistive change element cells 811, 821, 831, 841. The width dimension of the second plate conductive structure 871 can be calculated by width dimension =the diameter of a resistive change element+minimum feature size F+the diameter of a resistive change element+minimum feature size F+the diameter of a resistive change element+minimum feature size F+the diameter of a resistive change element, width dimension=1F+1F+1F+1F+1F+1F+1F. The length dimension of the second plate conductive structure 871 can be calculated by length dimension=height of an equilateral triangle+the radius of a resistive change element cell+the radius of a resistive change element cell, length=F$\sqrt{12}$+0.5F+0.5F. It is noted that the dimensions of the second plate conductive structure 871 are not limited to the dimensions for the smallest rectangle that encompasses the one level layout of the second group of four resistive change element cells 811, 821, 831, 841. Alternatively, the second plate conductive structure 871 can have a horizontal cross-sectional shape that extends beyond the edges of the resistive change element cells 811, 821, 831, 841. Alternatively, the second plate conductive structure 871 can have a horizontal cross-sectional shape that does not encompass the one level layout of the second group of four resistive change element cells 811, 821, 831, 841. For example, when the second plate conductive structure 871 has a horizontal cross-sectional shape that does not encompass the one level layout of the second group of four resistive change element cells 811, 821, 831, 841, at least one of the resistive change element cells 811, 821, 831, 841 can extend beyond the second plate conductive structure 871. Alternatively, the second plate conductive structure 871 can have a non-rectangular horizontal cross-sectional shape, such as a substantially circular horizontal cross-sectional shape, a substantially oval horizontal cross-sectional shape, a substantially triangular horizontal cross-sectional shape, a substantially trapezoidal horizontal cross-sectional shape, and an irregular horizontal cross-sectional shape. It is noted that the second plate conductive structure 871 can be considered to have a substantially rectangular horizontal cross-sectional shape when the second plate conductive structure 871 has a horizontal cross-sectional shape that is exactly a rectangle and when the second plate conductive structure 871 has a horizontal cross-sectional shape that is not exactly a rectangle due to variations caused by the fabrication process.

The smallest rectangle that encompasses both of the one level layout of the first group of four resistive change element cells 810, 820, 830, 840 and the one level layout of the second group of four resistive change element cells 811, 821, 831, 841 has a width of 7F and a length of approximately 11.5F. The width of the smallest rectangle that encompasses both one level layouts is 7F because the smallest rectangle that encompasses the one level layout of the first group of four resistive change element cells 810, 820, 830, 840 has a width of 7F and the smallest rectangle that encompasses the one level layout of the second group of four resistive change element cells 811, 821, 831, 841 has a width of 7F. The length of the smallest rectangle that encompasses both one level layouts can be calculated by length=length of the smallest rectangle that encompasses the one level layout of the first group of four resistive change element cells 810, 820, 830, 840+length of the smallest rectangle that encompasses the one level layout of the second group of four resistive change element cells 811, 821, 831, 841+the distance separating the two smallest rectangles, length=approximately 4.5F+approximately 4.5F+approximately 2.5F. It is noted that the smallest rectangle that encompasses the one level layout of the first group of four resistive change element cells 810, 820, 830, 840 and the smallest rectangle that encompasses the one level layout of the second group of four resistive change element cells 811, 821, 831, 841 are separated by approximately 2.5F so that three neighboring resistive change element cells from the two one level layouts form a substantially equilateral triangle having sides 4F in length.

Each of the first column conductive structure 872 and the second column conductive structure 873 has a substantially circular horizontal cross-sectional shape. The first column conductive structure 872 has a diameter approximately equal to 1F and a height greater than the sum of the thicknesses of the gate dielectric 856 and the gate terminal 858. Alternatively, the first column conductive structure 872 can have a diameter greater than 1F. The second column conductive structure 873 has a diameter approximately equal to 1F and a height greater than the sum of the thicknesses of the gate dielectric 857 and the gate terminal 859. Alternatively, the second column conductive structure 873 can have a diameter greater than 1F. Alternatively, each of the first column conductive structure 872 and the second column conductive structure 873 can have a non-circular horizontal cross-sectional shape, such as a substantially rectangular horizontal cross-sectional shape, a substantially oval horizontal cross-sectional shape, a substantially triangular horizontal cross-sectional shape, a substantially trapezoidal horizontal cross-sectional shape, an irregular horizontal cross-sectional shape, and a non-uniform horizontal cross-sectional shape where different sections of the column conductive structures 872, 873 can have different dimensions. Alternatively, the first group of four resistive change element cells 810, 820, 830, 840 can be electrically connected to the drain terminal 852 of the first selection device 850 by other conductive structures, such as a plate conductive structure and at least two column conductive structures. Alternatively, the second group of four resistive change element cells 811, 821, 831, 841 can be electrically connected to the drain terminal 853 of the second selection device 851 by other conductive structures, such as a plate conductive structure and at least two column conductive structures. It is noted that the first column conductive structure 872 can be considered to have a substantially circular horizontal cross-sectional shape when the first column conductive structure 872 has a horizontal cross-sectional shape that is exactly a circle and when the first column conductive structure 872 has a horizontal cross-sectional shape that is not exactly a circle due to variations caused by the fabrication process. It is noted that the second column conductive structure 873 can be considered to have a substantially circular horizontal cross-sectional shape when the second column conductive structure 873 has a horizontal cross-sectional shape that is exactly a circle and when the second column conductive structure 873 has a horizontal cross-sectional shape that is not exactly a circle due to variations caused by the fabrication process.

The first selection device 850 and the second selection device 851 together occupy a substantially rectangular surface area shape of the substrate 860. The first selection device 850 and the second selection device 851 together have a width WD8 of 7F and a length LD8 of 8F. Thus, the substantially rectangular surface area shape occupied by the first selection device 850 and the second selection device 851 is smaller than the smallest rectangle that encompasses both of the one level layout of the first group of four resistive change element cells 810, 820, 830, 840 and the one level layout of the second group of four resistive change element cells 811, 821, 831, 841. For example, when the first selection device 850 and the second selection device 851 together occupy a rectangular surface area shape with a width of 7F and a length of 8F, the smallest rectangle that encompasses both of the one level layout of the first group of four resistive change element cells 810, 820, 830, 840 and the one level layout of the second group of four resistive change element cells 811, 821, 831, 841 has a width of 7F and a length of 11.5F, and F is 10 nm, the first selection device 850 and the second selection device 851 together occupy an area of 5,600 $nm^2$ of the substrate 860 and the smallest rectangle that encompasses both one level layouts has an area of 8,050 $nm^2$. Alternatively, the first selection device 850 and the second selection device 851 together can occupy a substantially square surface area shape, or a non-rectangular surface area shape, such as a substantially trapezoidal surface area shape and an irregular surface area shape. It is noted that the first selection device 850 and the second selection device 851 together can be considered to occupy a substantially rectangular surface area shape of a substrate when the first selection device 850 and the second selection device 851 together occupy a surface area shape of a substrate that is exactly a rectangle and when the first selection device 850 and the second selection device 851 together occupy a surface area shape of a substrate that is not exactly a rectangle due to variations caused by the fabrication process.

When the first group of four resistive change element cells 810, 820, 830, 840, the second group of four resistive change element cells 811, 821, 831, 841, the first selection device 850, and the second selection device 851 as discussed above with respect to FIGS. 8A-8C, are part of a resistive change element array including a plurality of resistive change element cells and a plurality of selection devices arranged in a group of four resistive change element cells sharing one selection device configuration where every two groups of four resistive change element cells sharing two selection devices has the same structure as discussed above with respect to FIGS. 8A-8C, a surface area shape of a substrate required for two selection devices having a common source terminal to be adjacently located to other two selection devices having common source terminals in the resistive change element array is greater than a rectangular surface area shape occupied by two selection devices having a common source terminal and a shape required for two groups of four resistive change element cells to be adjacently located to other two groups of four resistive change element cells in the resistive change element array is greater than a smallest rectangle that encompasses both one level layouts of two groups of four resistive change element cells. The surface area shape of a substrate required for two selection devices having a common source terminal to be adjacently located is greater than the rectangular surface area shape occupied by the two selection devices having a common source terminal because the two selection devices having common source terminals are required to be separated by at least 1F. For example, when the first selection device 850 and the second selection device 851 together occupy a rectangular surface area shape with a width of 7F and a length of 8F and adjacent two selection devices having common source terminals are separated by 1F, the surface area shape of a substrate required for two selection devices having a common source terminal to be adjacently located can be approximated by a rectangle with a width of 8F and a length of 9F.

As discussed above, the smallest rectangle that encompasses both of the one level layout of the first group of four resistive change element cells 810, 820, 830, 840 and the one level layout of the second group of four resistive change element cells 811, 821, 831, 841 can be approximated by a rectangle with a width of 7F and a length of approximately 11.5F. The shape required for two groups of four resistive change element cells to be adjacently located is greater than the smallest rectangle that encompasses both one level layouts of two groups of four resistive change element cells because the two groups of four resistive change element cells are required to be separated by 1F along the y-axis and approximately 2.5F along the x-axis. For example, when the smallest rectangle that encompasses both of the one level layout of the first group of four resistive change element cells 810, 820, 830, 840 and the one level layout of the second group of four resistive change element cells 811, 821, 831, 841 has a width of 7F and a length of 11.5F and the resistive change element cells are separated by 1F along the y-axis and approximately 2.5F along the x-axis, the shape required for two groups of four resistive change element cells to be adjacently located can be approximated by a rectangle with a width of 8F and a length of 14F.

When the first group of four resistive change element cells 810, 820, 830, 840, the second group of four resistive change element cells 811, 821, 831, 841, the first selection device 850, and the second selection device 851 as discussed above with respect to FIGS. 8A-8C, are part of a resistive change element array including a plurality of resistive change element cells and a plurality of selection devices arranged in a group of four resistive change element cells sharing one selection device configuration where every two groups of four resistive change element cells sharing two selection devices has the same structure as discussed above with respect to FIGS. 8A-8C, a surface area of a substrate required for two groups of four resistive change element cells sharing two selection devices having a common source terminal is based on a shape required for two groups of four resistive change element cells to be adjacently located because the first group of four resistive change element cells 810, 820, 830, 840 and the second group of four resistive change element cells 811, 821, 831, 841 are positioned above the first selection device 850 and the second selection device 851 such that an area of the substrate covered by the shape required for the two group of four resistive change element cells to be adjacently located encompasses the surface area shape of a substrate required for two selection devices having a common source terminal to be adjacently located.

Alternatively, when the first group of four resistive change element cells 810, 820, 830, 840 and the second group of four resistive change element cells 811, 821, 831, 841 are positioned above the first selection device 850 and the second selection device 851 such that an area of a substrate covered by the shape required for two groups of four resistive change element cells to be adjacently located covers at least part the surface area shape of a substrate required for two selection devices having a common source terminal to be adjacently located, a surface area of the substrate required for two groups of resistive change element cells sharing two selection devices having a common source terminal is based on a combined shape formed by the shape required for two groups of four resistive change element cells to be adjacently located and the surface area shape of a substrate required for two selection devices having a common source terminal to be adjacently located. The combined shape has an outline defined by the part of shape required for two groups of four resistive change element cells to be adjacently located that covers part of the surface area shape of a substrate required for two selection devices having a common source terminal to be adjacently located, the part of shape required for two groups of four resistive change element cells to be adjacently located that does not cover the surface area shape of a substrate required for two selection devices having a common source terminal to be adjacently located, and the part of the surface area shape of a substrate required for two selection devices having a common source terminal to be adjacently located that is not covered by the shape required for two groups of four resistive change element cells to be adjacently located. Alternatively, when the surface area shape of a substrate required for two selection devices having a common source terminal to be adjacently located encompasses the shape required for two groups of four resistive change element cells to be adjacently located and the first group of four resistive change element cells 810, 820, 830, 840 and the second group of four resistive change element cells 811, 821, 831, 841 are positioned above the first selection device 850 and the second selection device 851 such that an area of the substrate covered by the shape required for the two group of four resistive change element cells to adjacently located is encompassed by the surface area shape of a substrate required for two selection devices having a common source terminal to be adjacently located, a surface area shape of a substrate required for two groups of resistive change element cells sharing two selection devices having a common source terminal is based on the surface area shape of a substrate required for two selection devices having a common source terminal to be adjacently located.

Resistive change element cell density of the resistive change element array is based on a surface area of a substrate required for a resistive change element cell, and thus, resistive change element cell density in the resistive change element array including a plurality of resistive change element cells and a plurality of selection devices arranged in a group of four resistive change element cells sharing one selection device configuration where every two groups of four resistive change element cells sharing two selection devices has the same structure as discussed above with respect to FIGS. 8A-8C is based on the shape required for two groups of four resistive change element cells to be adjacently located. For example, when a shape required for two groups of four resistive change element cells to be adjacently located can be approximated by a rectangle with a width of 8F and a length of 14F, a surface area shape of a substrate required for two selection devices having a common source terminal to be adjacently located can be approximated by a rectangle with a width of 8F and a length of 9F, an area of a substrate covered by the shape required for the two groups of four resistive change element cells encompasses the surface area shape of a substrate required for two selection devices having a common source terminal to be adjacently located, and F is 10 nm, the resistive change element cell density is one resistive change element cell per an area of 1,400 nm$^2$ of the substrate.

In the above example, the first group of four resistive change element cells 810, 820, 830, 840 and the second group of four resistive change element cells 811, 821, 831, 841 sharing the first selection device 850 and the second selection device 851 have a resistive change element cell density of one resistive change element cell per an area of 1,400 nm$^2$ of the substrate and in the examples further the resistive change element cell 110 and the resistive change element cell 111 have a resistive change element cell density of one resistive change element cell per an area of 2,200 nm$^2$ of the substrate. Thus, in these examples the first group of four resistive change element cells 810, 820, 830, 840 and the second group of four resistive change element cells 811, 821, 831, 841 sharing the first selection device 850 and the second selection device 851 have a resistive change element cell density 1.57 times greater than a resistive change element cell density of the resistive change element cell 110 and the resistive change element cell 111.

It is noted that when a shape required for two groups of four resistive change element cells to be adjacently located encompasses a surface area shape of a substrate required for two selection devices having a common source terminal to be adjacently located, a circuit designer can select features of the two selection devices having a common source terminal that increase the size of the two selection devices having a common source terminal until the surface area shape of a substrate required for the two selection devices having a common source terminal to be adjacently located is approximately equal to the shape required for two groups of four resistive change element cells to be adjacently located without reducing resistive change element cell density. For example, the circuit designer can select dimensions of the selection devices, layouts of the selection devices, and materials for fabricating the two selection devices having a common source terminal that increase the size of the two selection devices having a common source terminal. For example, a circuit designer can increase the channel lengths of the two selection devices having a common source terminal so that electrical stimuli with greater voltages can be used for operations, such as programming operations, read operations, set verify operations, reset verify operations, test operations, and other types of operations without causing leakage current to flow through a channel region.

When the first group of four resistive change element cells 810, 820, 830, 840, the second group of four resistive change element cells 811, 821, 831, 841, the first selection device 850, and the second selection device 851 as discussed above with respect to FIGS. 8A-8C, are part of a resistive change element array including a plurality of resistive change element cells and a plurality of selection devices arranged in a group of four resistive change element cells sharing one selection device configuration where every two groups of four resistive change element cells sharing two selection devices has the same structure as discussed above with respect to FIGS. 8A-8C, source lines are in electrical communication with top electrodes of resistive change element cells, word lines are in electrical communication with gate terminals of selection devices, and bit lines are in electrical communication with common source terminals of selection devices. FIGS. 8A-8C show source lines SL81, SL82, SL83, SL84 in electrical communication with the top electrodes 816, 817, 826, 827, 836, 837, 846, 847 of the resistive change element cells 810, 811, 820, 821, 830, 831, 840, 841 and a bit line BL81 in electrical communication with the common source terminal 854. Alternatively, the top electrodes 816, 817, 826, 827, 836, 837, 846, 847 of the resistive change element cells 810, 811, 820, 821, 830, 831, 840, 841 are in electrical communication with the source line SL81, SL82, SL83, SL84 through conductive structures. The gate terminal 858 of the selection device 850 can be part of a word line WL81, alternatively, the gate terminal 858 can be in electrical communication with a word line WL81. The gate terminal 859 of the selection device 851 can be part of a word line WL82, alternatively, the gate terminal 859 can be in electrical communication with a word line WL82. Further, intervening layers, such as barrier metal layers to provide a barrier to metal migration, can be included to provide a barrier to metal migration from the source lines SL81, SL82, SL83, SL84, the bit line BL81, and/or the word lines WL81, WL82. It is noted that when the resistive change element cells 810, 811, 820, 821, 830, 831, 840, 841, the first selection device 850, and the second selection device 851 are part of a resistive change element array including a plurality of resistive change element cells and a plurality of selection devices arranged in a group of four resistive change element cells sharing one selection device configuration, as discussed above, the regions around the resistive change element cells 810, 811, 820, 821, 830, 831, 840, 841, the gate dielectrics 856, 857, the gates terminals 858, 859, the first plate conductive structure 870, the second plate conductive structure 871, the first column conductive structure 872, the second column conductive structure 873, the source lines SL81, SL82, SL83, SL84, the bit line BL81, and the word lines WL81, WL82 can be filled with a dielectric. It is further noted that the resistive change element cells 810, 811, 820, 821, 830, 831, 840, 841, can be sealed by thin dielectric sidewall films, as described in U.S. patent application Ser. No. 15/486,032, prior to filling the regions around the resistive change elements 810, 811, 820, 821, 830, 831, 840, 841, with the dielectric.

Figure 9A:
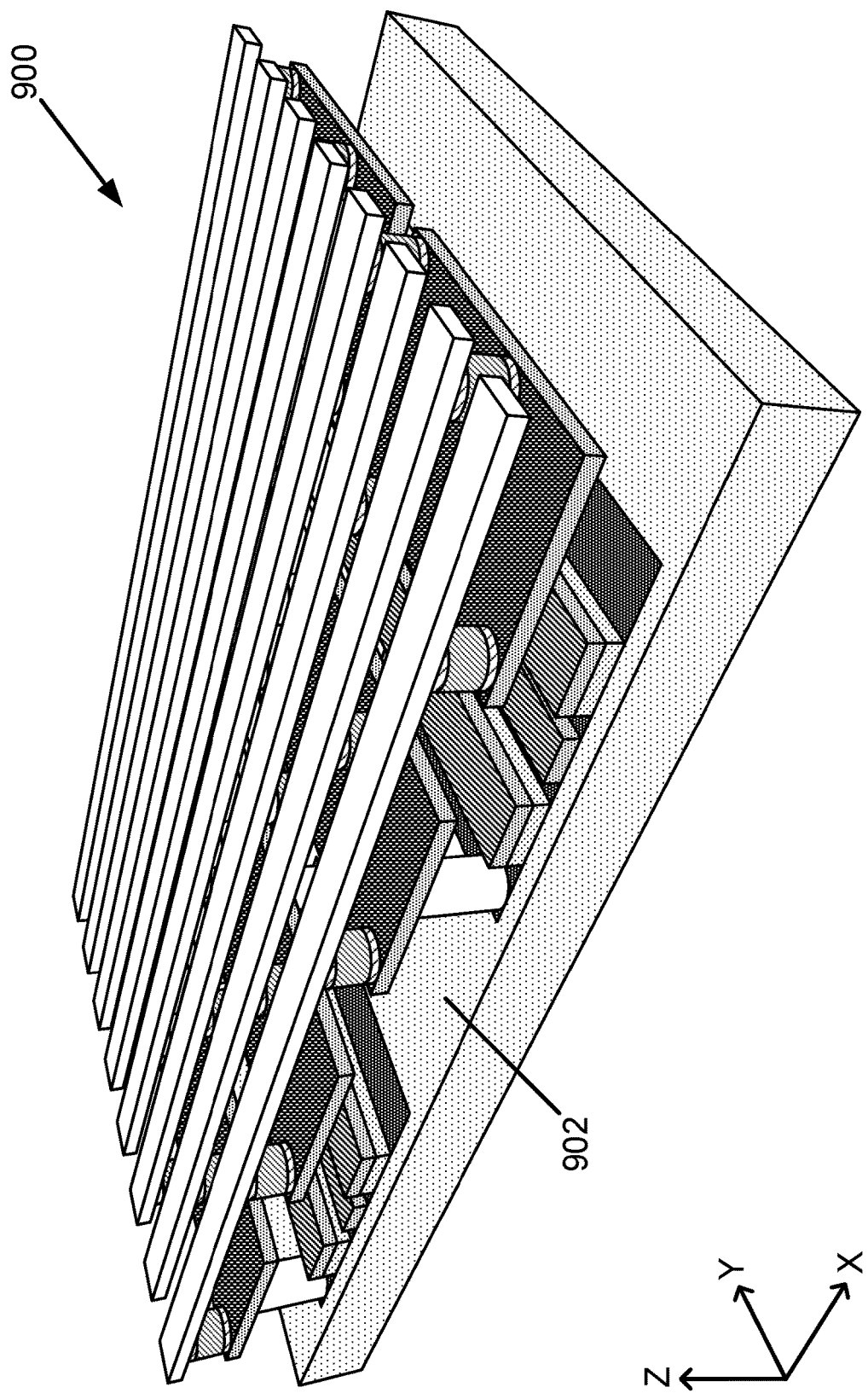
FIG. 9A illustrates a resistive change element array including a plurality of resistive change element cells and a plurality of selection devices arranged in a group of four resistive change element cells sharing one selection device configuration, where every two groups of four resistive change element cells share two selection devices having a common source terminal.

FIG. 9A illustrates a resistive change element array 900 having a plurality of resistive change element cells and a plurality of selection devices arranged in a group of four resistive change element cells sharing one selection device configuration, also referred to as a 1T4R configuration, where every two groups of four resistive change element cells sharing two selection devices has the same structure as discussed above with respect to FIGS. 8A-8C. A substrate 902 can be formed from a conductive material, a semiconductor material, or an insulating material as required by the needs of a specific application. The resistive change element array 900 also includes a plurality of source lines in electrical communication with top electrodes of resistive change element cells, a plurality of bit lines electrically connected to common source terminals of selection devices, and a plurality of word lines with each word line including gate terminals of selection devices as part of a word line.

Figure 9B:
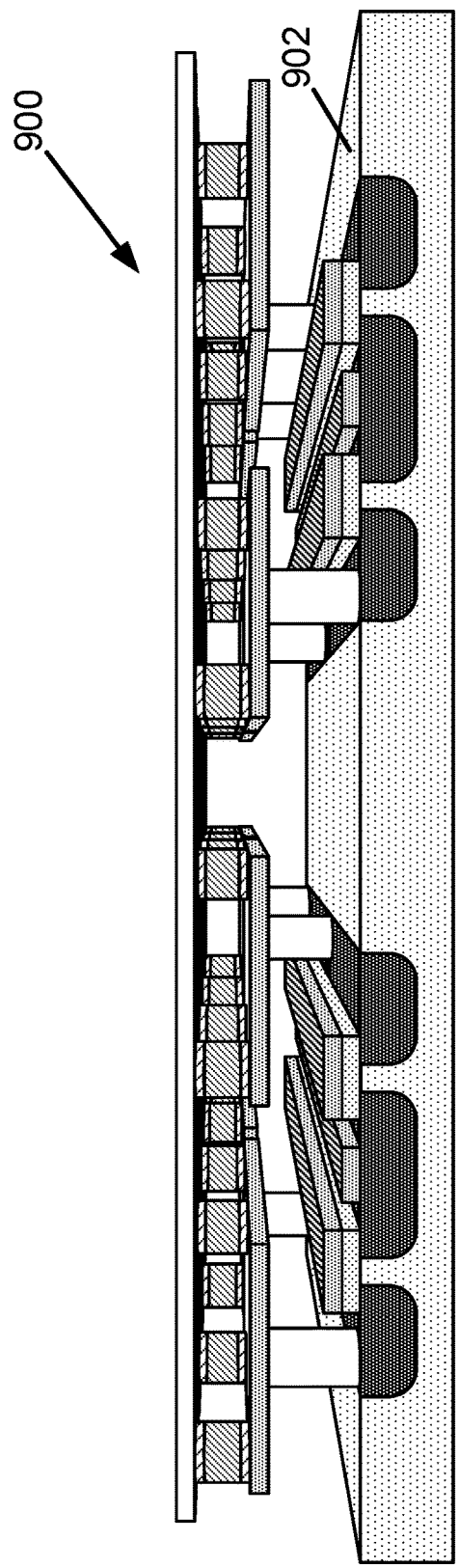
FIG. 9B illustrates a vertical cross-sectional view of the resistive change element array of FIG. 9A.
Figure 9C:
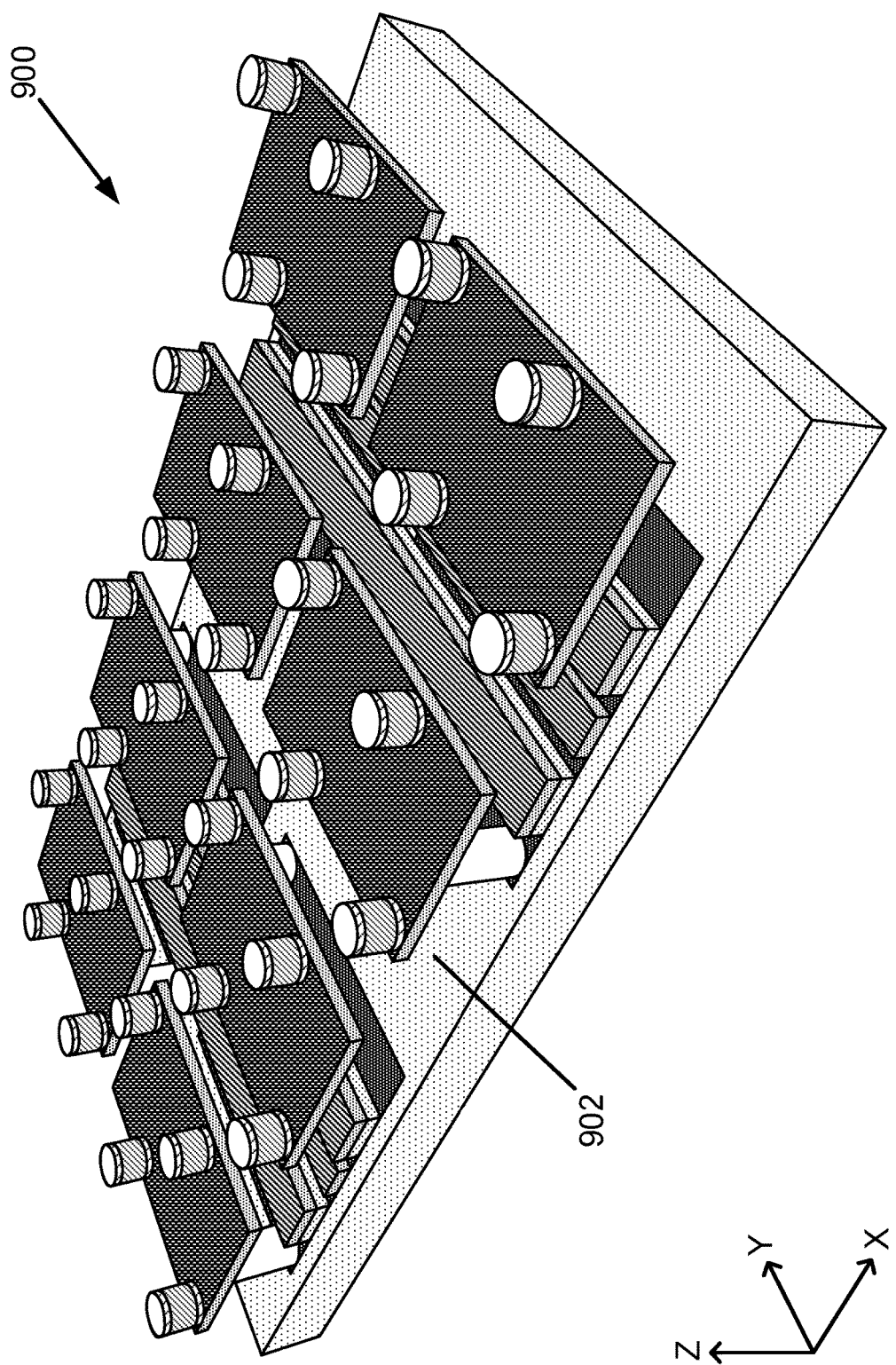
FIG. 9C illustrates a top view of the resistive change element array of FIG. 9A, where the source lines electrically connected to the top electrodes of the resistive change element cells are not shown so that the resistive change element cells can be shown in greater detail.

FIG. 9B illustrates a vertical cross-sectional view of the resistive change element array 900. FIG. 9C illustrates a top view of the resistive change element array 900 with the plurality of source lines in electrical communication with the top electrodes of the resistive change element cells not shown, so that the resistive change element cells can be shown in greater detail. It is noted that although the resistive change element array 900 is shown in FIGS. 9A-9C including thirty two resistive change element cells and eight selection devices arranged in a group of four resistive change element cells sharing one selection device configuration, the resistive change element array 900 is not limited to thirty two resistive change element cells and eight selection devices but rather the resistive change element array 900 can include a plurality of resistive change element cells and a plurality of selection devices arranged in a group of four resistive change element cells sharing one selection device configuration.

As shown in FIG. 9C, the plurality of resistive change elements cells is arranged in one level layouts where three neighboring resistive change element cells form a substantially equilateral triangle. Alternatively, the plurality of resistive change element cells can be arranged to form other shapes, such as polygons other than equilateral triangles, circles, ovals, and irregular shapes. Alternatively, the plurality of resistive change element cells can be arranged in patterns. It is noted that the plurality of resistive change element cells can be considered to form substantially equilateral triangles, substantially other shapes, or substantially patterns when the plurality of resistive change element cells form exact equilateral triangles, exact other shapes, or exact patterns and when the plurality of resistive change element cells form equilateral triangles, other shapes, or patterns that are not exact equilateral triangles, exact other shapes, or exact patterns due to variations caused by the fabrication process. It is further noted that the resistive change element cells are required to be separated by a distance of at least 1F.

Each group of four resistive change element cells is located on a plate conductive structure having a substantially rectangular horizontal cross-sectional shape that encompasses a one level layout of a group of four resistive change element cells. Each plate conductive structure has a width dimension of 7F and a length dimension of approximately 4.5F, these dimensions are the dimensions for the smallest rectangle that encompasses a one level layout of a group of four resistive change element cells, as discussed above with respect to the first group of resistive change element cells 810, 820, 830, 840 and the first plate conductive structure 870 and the second group of resistive change element cells 811, 821, 831, 841 and the second plate conductive structure 871. Every two selection devices having a common source terminal occupies a substantially rectangular surface area shape of the substrate 902 with the substantially rectangular surface area shape having a width of 7F and a length of 8F, as discussed above with respect to the first selection device 850 and the second selection device 851.

A shape required for two groups of four resistive change element cells to be adjacently located to other two groups of four resistive change element cells in the resistive change element array 900 is greater than a smallest rectangle that encompasses both one level layouts of two groups of four resistive change element cells because the two groups of four resistive change element cells are separated by 2.5F along the x-axis and 1F along the y-axis in order to arrange the plurality of resistive change element cells such that three neighboring resistive change element cells from at least two one level layouts form a substantially equilateral triangle having sides 4F in length. Thus, the shape required for two groups of four resistive change element cells to be adjacently located can be approximated by a rectangle having a width of 8F and a length of 14F. A surface area shape of a substrate required for two selection devices having a common source terminal to be adjacently located to other two selection devices having common source terminals in the resistive change element array 900 is greater than the rectangular surface area shape occupied by two selection devices having a common source terminal because the two selection devices having common source terminals are separated by at least 1F. Thus, the surface area shape of a substrate required for two selection devices having a common source terminal to be adjacently located can be approximated by a rectangle having a width of 8F and a length of 9F.

A surface area of the substrate 902 required for two groups of four resistive change element cells sharing two selection devices having a common source terminal is based on the shape required for two groups of four resistive change element cells to be adjacently located to other two groups of four resistive change element cells in the resistive change element array 900. The surface area of the substrate 902 required for two groups of four resistive change element cells sharing two selection devices having a common source terminal is based on the shape required for two groups of four resistive change element cells to be adjacently located because the shape required for two groups of four resistive change element cells to be adjacently located is greater than the surface area shape of a substrate required for two selection devices having common source terminal to be adjacently located and because every two groups of four resistive change element cells are positioned above two selection devices for those two groups such that an area of the substrate 902 covered by the shape required for the two groups of four resistive change element cells to be adjacently located encompasses the surface area shape of a substrate required for two selection devices having a common source terminal to be adjacently located.

Resistive change element cell density of the resistive change element array 900 is based on a surface area of the substrate 902 required for two groups of four resistive change element cells sharing two selection devices having a common source terminal. Thus, resistive change element cell density in the resistive change element array 900 is based on a shape required for two groups of four resistive change element cells to be adjacently located to other two groups of four resistive change element cells in the resistive change element array 900. For example, when a shape required for two groups of four resistive change element cells to be adjacently can be approximated by rectangle with a width dimension of 8F and a length dimension of 14F and F is 10 nm, the resistive change element cell density is one resistive change element cell per an area of 1,400 nm² of the substrate.

In the above example, the resistive change element array 900 has a resistive change element cell density of one resistive change element cell per an area of 1,400 nm² of the substrate and in the examples further the resistive change element cell 110 and the resistive change element cell 111 have a resistive change element cell density of one resistive change element cell per an area of 2,200 nm² of the substrate. Thus, in these examples the resistive change element array 900 has a resistive change element cell density 1.57 times greater than a resistive change element cell density of the resistive change element cell 110 and the resistive change element cell 111.

Figure 10A:
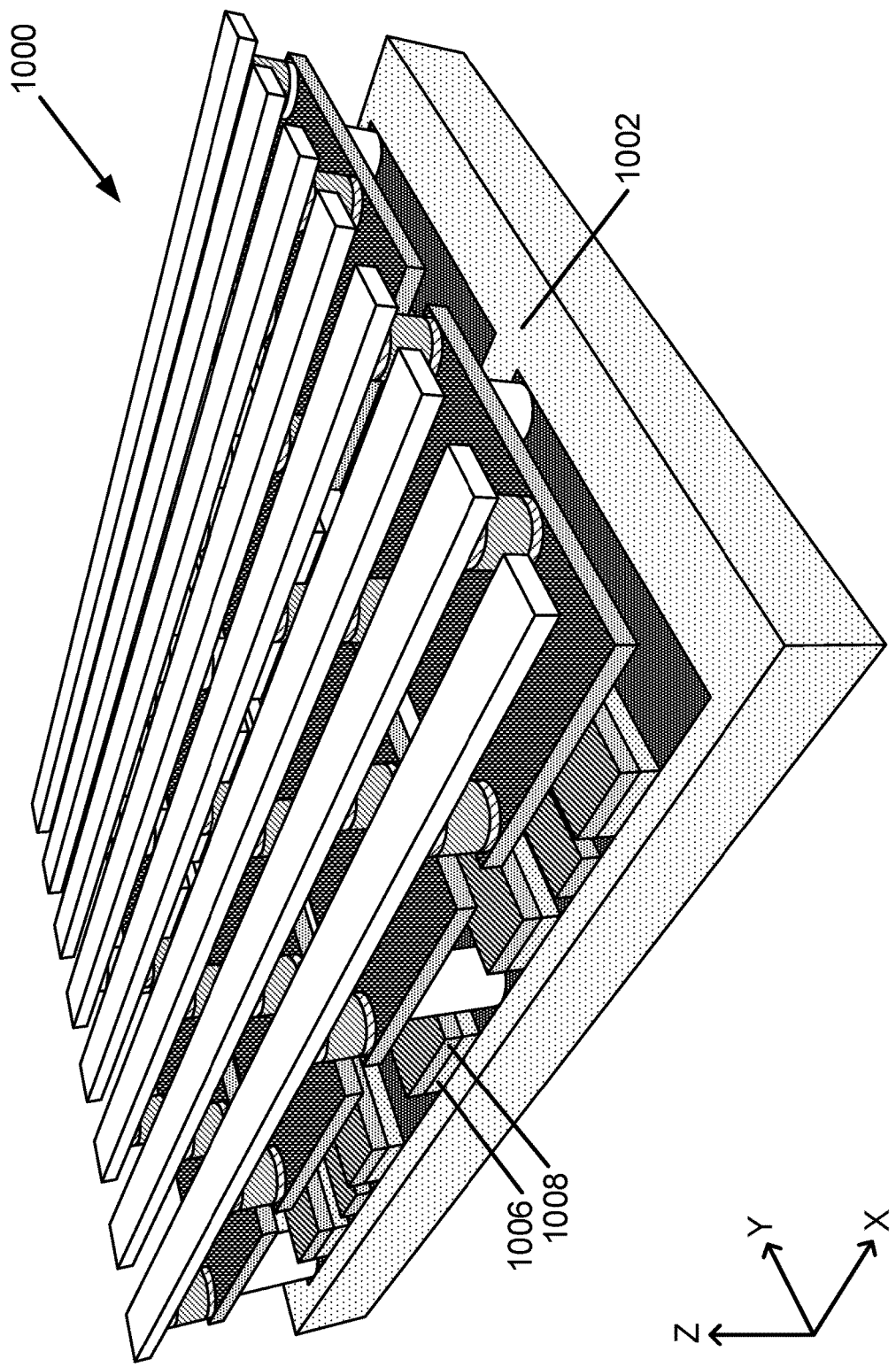
FIG. 10A illustrates a resistive change element array including a plurality of resistive change element cells and a plurality of selection devices arranged in a group of four resistive change element cells sharing one selection device configuration, where every two groups of four resistive change element cells share two selection devices having a common source terminal, and where the groups of four resistive change element cells are separated by a minimum feature size.

FIG. 10A illustrates a resistive change element array 1000 having a plurality of resistive change element cells and a plurality of selection devices arranged in a group of four resistive change element cells sharing one selection device configuration, also referred to as a 1T4R configuration. The resistive change element array 1000 has a similar structure to the resistive change element array 900, however, the resistive change element array 1000 has a resistive change element cell density greater than the resistive change element cell density of the resistive change element array 900 because the plurality of resistive change element cells of the resistive change element array 1000 are arranged in a more dense layout than the plurality of resistive change element cells of the resistive change element array 900.

The plurality of resistive change element cells of the resistive change element array 1000 are arranged such that groups of four resistive change element cells are separated by 1F. The shape required for two groups of four resistive change element cells to be adjacently located to other two groups of four resistive change element cells in the resistive change element array 1000 can be approximated by a rectangle with a width of 8F and a length of approximately 11F because the groups of four resistive change element cells are separated by 1F. A surface area of a substrate 1002 required for two groups of four resistive change element cells sharing two selection devices having a common source terminal is based on the shape required for two groups of four resistive change element cells to be adjacently located to other two groups of four resistive change element cells in the resistive change element array 1000 because the shape required for two groups of four resistive change element cells to be adjacently located is greater than the surface area shape of a substrate required for two selection devices having a common source terminal to be adjacently located and because every two groups of four resistive change element cells are positioned above two selection devices for those two groups such that an area of the substrate 1002 covered by the shape required for two groups of four resistive change element cells to be adjacently located encompasses the surface area shape of a substrate required for two selection devices having a common source terminal to be adjacently located. It is noted that the surface area shape of a substrate required for two selection devices having a common source terminal to be adjacent located can be approximated by a rectangle with a width of 8F and a length of 9F, as discussed above with respect to FIGS. 9A-9C. It is also noted that the substrate 1002 can be formed from a conductive material, a semiconductor material, or an insulating material as required by the needs of a specific application. It is further noted that the resistive change element array 1000 can additionally include an array line 1008 formed on a dielectric 1006 with the array line 1008 and the dielectric 1006 located between drain terminals of selection devices. The array line 1008 can be driven to ground or 0 volts or other voltage levels, such as a voltage level less than 0 volts and a voltage level greater than 0 volts, to prevent current flow between the drain terminals of selection devices.

Resistive change element cell density of the resistive change element array 1000 is based on a surface area of the substrate 1002 required for two groups of four resistive change element cells sharing two selection devices having a common source terminal. Thus, resistive change element cell density in the resistive change element array 1000 is based on a shape required for two groups of four resistive change element cells to be adjacently located to other two groups of four resistive change element cells in the resistive change element array 1000. For example, when a shape required for two groups of four resistive change element cells to be adjacently can be approximated by rectangle with a width dimension of 8F and a length dimension of 11F and F is 10 nm, the resistive change element cell density is one resistive change element cell per an area of 1,100 nm² of the substrate.

In the above example, the resistive change element array 1000 has a resistive change element cell density of one resistive change element cell per an area of 1,100 nm² of a substrate and in the example further above the resistive change element array 900 have a resistive change element cell density of one resistive change element cell per an area of 1,400 nm² of the substrate. Thus, in these examples the resistive change element array 1000 has a resistive change element cell density 1.27 times greater than a resistive change element cell density of resistive change element array 900.

Figure 10B:
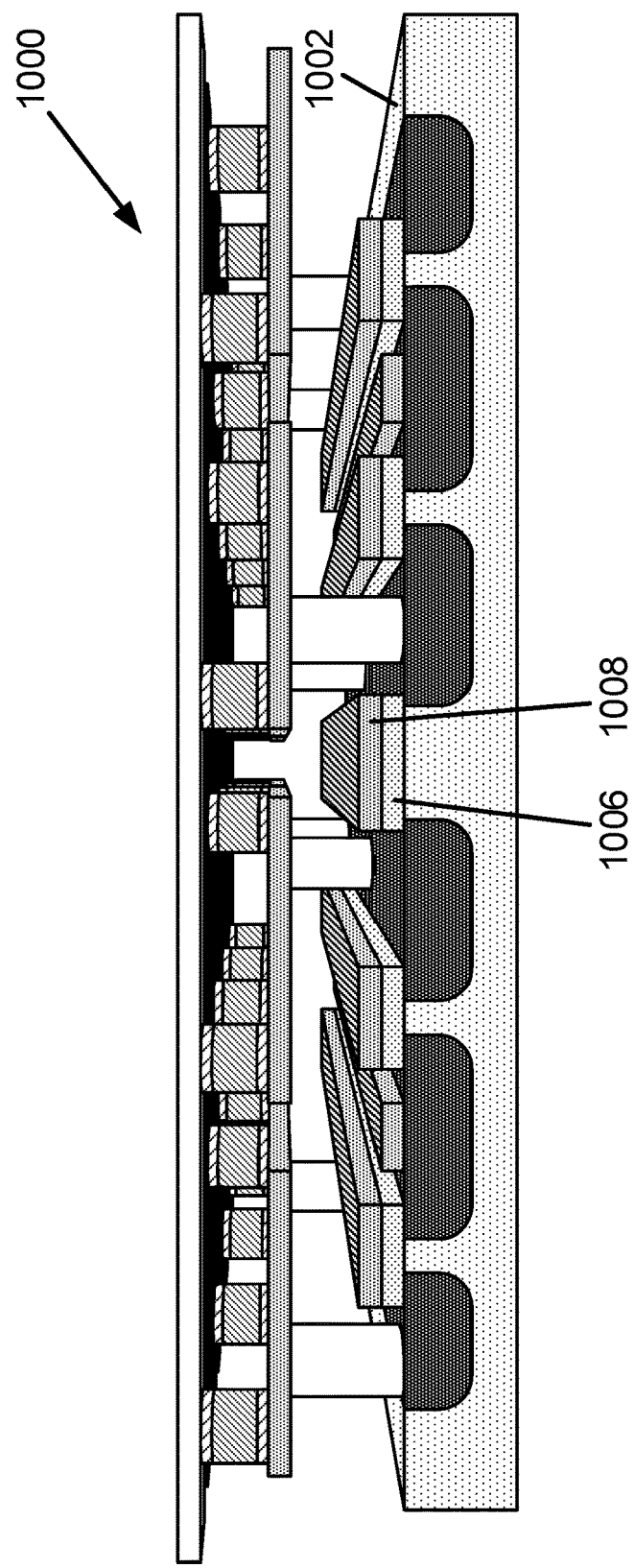
FIG. 10B illustrates a vertical cross-sectional view of the resistive change element array of FIG. 10A.

FIG. 10B illustrates a vertical cross-sectional view of the resistive change element array 1000. It is noted that although the resistive change element array 1000 is shown in FIGS. 10A-10B including thirty two resistive change element cells and eight selection devices arranged in a group of four resistive change element cells sharing one selection device configuration, the resistive change element array 1000 is not limited to thirty two resistive change element cells and eight selection devices but rather the resistive change element array 1000 can include a plurality of resistive change element cells and a plurality of selection devices arranged in a group of four resistive change element cells sharing one selection device configuration. It is also noted that the resistive change element array 1000 can additionally include a plurality of array lines located between drain terminals of selection devices.

Although the present disclosure has been described in relation to particular embodiments thereof, many other variations and modification and other uses will become apparent to those skilled in the art. It is preferred, therefore, that the present disclosure not be limited by the specific disclosure herein.

What is claimed is:
1. A resistive change element array, comprising:
   a plurality of groups of at least two resistive change element cells, wherein each resistive change element cell has a first electrode, a second electrode, and a nanotube fabric layer between said first electrode and said second electrode;

a plurality of selection devices for said plurality of groups of at least two resistive change element cells, wherein said plurality of selection devices are field effect transistors, and wherein plural selection devices of said plurality of selection devices are electrically connectable to a same array line; and wherein each group of at least two resistive change element cells is electrically connected to a selection device for that group of at least two resistive change element cells, wherein all resistive change element cells electrically connected to each selection device for each group of at least two resistive change element cells are oriented in a same direction, and wherein all resistive change element cells electrically connected to each selection device for each group of at least two resistive change element cells have first electrodes and second electrodes with said second electrodes electrically connected together.

2. The resistive change element array of claim 1, wherein each group of at least two resistive change element cells is arranged in a one level layout.

3. The resistive change element array of claim 1, wherein each group of at least two resistive change element cells is arranged in a multiple level layout.

4. The resistive change element array of claim 1, wherein each group of at least two resistive change element cells has at least four resistive change element cells.

5. The resistive change element array of claim 4, wherein said at least four resistive change element cells are arranged such that three neighboring resistive change element cells form a substantially equilateral triangle.

6. The resistive change element array of claim 5, wherein said plurality of groups of at least two resistive change element cells are arranged such that three neighboring resistive change element cells from at least two groups form a substantially equilateral triangle.

7. The resistive change element array of claim 1, wherein said plurality of groups of at least two resistive change element cells comprises a plurality of groups of eight resistive change element cells and a plurality of groups of sixteen resistive change element cells.

8. The resistive change element array of claim 1, wherein each group of at least two resistive change element cells is positioned above a selection device for that group of at least two resistive change element cells such that an area covered by a shape required for a group of at least two resistive change element cells to be adjacently located to other groups of at least two resistive change element cells encompasses a shape required for a selection device to be adjacently located to other selection devices.

9. The resistive change element array of claim 1, wherein each group of at least two resistive change element cells is positioned above a selection device for that group of at least two resistive change element cells such that an area covered by a shape required for a group of at least two resistive change element cells to be adjacently located to other groups of at least two resistive change element cells is encompassed by a shape required for a selection device to be adjacently located to other selection devices.

10. The resistive change element array of claim 1, wherein each group of at least two resistive change element cells is positioned above a selection device for that group of at least two resistive change element cells such that an area covered by a shape required for a group of at least two resistive change element cells to be adjacently located to other groups of at least two resistive change element cells covers at least part of a shape required for a selection device to be adjacently located to other selection devices.

11. A resistive change element array, comprising:
a plurality of groups of at least two resistive change element cells, wherein each resistive change element cell has a first electrode, a second electrode, and a nanotube fabric layer between said first electrode and said second electrode;
a plurality of selection devices for said plurality of groups of at least two resistive change element cells, wherein every two selection devices have two drain terminal, two gate terminals, and a common source terminal; and
wherein every two groups of at least two resistive change element cells are electrically connected to two selection devices for those two groups of at least two resistive change element cells, wherein all resistive change element cells electrically connected to each selection device are oriented in a same direction, and wherein all resistive change element cells electrically connected to each selection device have first electrodes and second electrodes with said second electrodes electrically connected together.

12. The resistive change element array of claim 11, wherein each group of at least two resistive change element cells is arranged in a one level layout.

13. The resistive change element array of claim 11, wherein each group of at least two resistive change element cells is arranged in a multiple level layout.

14. The resistive change element array of claim 11, wherein each group of at least two resistive change element cells has at least four resistive change element cells.

15. The resistive change element array of claim 14, wherein said at least four resistive change element cells are arranged such that three neighboring resistive change element cells form a substantially equilateral triangle.

16. The resistive change element array of claim 15, wherein said plurality of groups of at least two resistive change element cells are arranged such that three neighboring resistive change element cells from at least two groups form a substantially equilateral triangle.

17. The resistive change element array of claim 11, wherein every two groups of at least two resistive change element cells has a group of eight resistive change element cells and a group of sixteen resistive change element cells.

18. The resistive change element array of claim 11, wherein every two groups of at least two resistive change element cells are positioned above two selection devices for those two groups of at least two resistive change element cells such that an area covered by a shape required for two groups of at least two resistive change element cells to be adjacently located to other two groups of at least two resistive change element cells encompasses a shape required for two selection devices to be adjacently located to other two selection devices.

19. The resistive change element array of claim 11, wherein every two groups of at least two resistive change element cells are positioned above two selection devices for those two groups of at least two resistive change element cells such that an area covered by a shape required for two groups of at least two resistive change element cells to be adjacently located to other two groups of at least two resistive change element cells is encompassed by a shape required for two selection devices to be adjacently located to other two selection devices.

20. The resistive change element array of claim 11, wherein every two groups of at least two resistive change element cells are positioned above two selection devices for those two groups of at least two resistive change element cells such that an area covered by a shape required for two groups of at least two resistive change element cells to be adjacently located to other two groups of at least two resistive change element cells covers at least part of a shape required for two selection devices to be adjacently located to other two selection devices.

21. A resistive change element array, comprising:
a plurality of bit lines;
a plurality of source lines;
a plurality of word lines;
a plurality of resistive change element cells, wherein each resistive change element cell has a first electrode and a second electrode, a second electrode, and a nanotube fabric layer between said first electrode, and said second electrode, and wherein said first electrode of each resistive change element cell is electrically connected to a source line of said plurality of source lines;
a plurality of selection devices, wherein each selection device has a drain terminal, a gate terminal, and a source terminal, wherein said source terminal of each selection device is electrically connected to a bit line of said plurality of bit lines, wherein said gate terminal of each selection device is electrically connected to a word line of said plurality of word lines, and wherein a plurality of selection devices of said plurality of selection devices is electrically connected to a same bit line;
wherein said plurality of resistive change element cells and said plurality of selection devices are arranged in a group of N resistive change element cells sharing one selection device configuration with N being a number greater than one and said N resistive change element cells electrically connected to said drain terminal of said one selection device; and
wherein all resistive change element cells electrically connected to each selection device are oriented in a same direction and wherein all resistive change element cells electrically connected to each selection device have first electrodes and second electrodes with said second electrodes electrically connected together.

22. The resistive change element array of claim 21, wherein each group of N resistive change element cells is positioned above a selection device for that group of N resistive change element cells such that an area covered by a shape required for a group of N resistive change element cells to be adjacently located to other groups of N resistive change element cells encompasses a shape required for a selection device to be adjacently located to other selection devices.

23. The resistive change element array of claim 21, wherein each group of N resistive change element cells is positioned above a selection device for that group of N resistive change element cells such that an area covered by a shape required for a group of N resistive change element cells to be adjacently located to other groups of N resistive change element cells is encompassed by a shape required for a selection device to be adjacently located to other selection devices.

24. The resistive change element array of claim 21, wherein each group of N resistive change element cells is positioned above a selection device for that group of N resistive change element cells such that an area covered by a shape required for a group of N resistive change element cells to be adjacently located to other groups of N resistive change element cells covers at least part of a shape required for a selection device to be adjacently located to other selection devices.

25. A resistive change element array, comprising:
a plurality of bit lines;
a plurality of source lines;
a plurality of word lines;
a plurality of resistive change element cells, wherein each resistive change element cell has a first electrode, a second electrode, and a nanotube fabric layer between said first electrode and said second electrode, and wherein said first electrode of each resistive change element cell is electrically connected to a source line of said plurality of source lines;
a plurality of selection devices, wherein every two selection devices have two drain terminals, two gate terminals, and a common source terminal, wherein said common source terminal of every two selection devices is electrically connected to a bit line of said plurality of bit lines, and wherein said two gate terminals of every two selection devices are electrically connected to word lines of said plurality of word lines;
wherein said plurality of resistive change element cells and said plurality of selection devices are arranged in a group of N resistive change element cells sharing one selection device configuration with N being a number greater than one and said N resistive change element cells electrically connected to said drain terminal of said one selection device; and
wherein all resistive change element cells electrically connected to each selection device are oriented in a same direction and wherein all resistive change element cells electrically connected to each selection device have first electrodes and second electrodes with said second electrodes electrically connected together.

26. The resistive change element array of claim 25, wherein every two groups of N resistive change element cells are positioned above two selection devices for those two groups of N resistive change element cells such that an area covered by a shape required for two groups of N resistive change element cells to be adjacently located to other two groups of N resistive change element cells encompasses a shape required for two selection devices to be adjacently located to other two selection devices.

27. The resistive change element array of claim 25, wherein every two groups of N resistive change element cells are positioned above two selection devices for those two groups of N resistive change element cells such that an area covered by a shape required for two groups of N resistive change element cells to be adjacently located to other two groups of N resistive change element cells is encompassed by a shape required for two selection devices to be adjacently located to other two selection devices.

28. The resistive change element array of claim 25, wherein every two groups of N resistive change element cells are positioned above two selection devices for those two groups of N resistive change element cells such that an area covered by a shape required for two groups of N resistive change element cells to be adjacently located to other two groups of N resistive change element cells covers at least part of a shape required for two selection devices to be adjacently located to other two selection devices.

\* \* \* \* \*